(12) United States Patent
Kinoshita et al.

(10) Patent No.: US 12,034,104 B2
(45) Date of Patent: Jul. 9, 2024

(54) LIGHT EMITTING DEVICE

(71) Applicants: Citizen Electronics Co., Ltd., Fujiyoshida (JP); Citizen Watch Co., Ltd., Nishitokyo (JP)

(72) Inventors: Jo Kinoshita, Fujiyoshida (JP); Shiori Koike, Fujiyoshida (JP)

(73) Assignees: CITIZEN ELECTRONICS CO., LTD., Fujiyoshida (JP); CITIZEN WATCH CO., LTD., Nishitokyo (JP)

( * ) Notice: Subject to any disclaimer, the term of this patent is extended or adjusted under 35 U.S.C. 154(b) by 0 days.

(21) Appl. No.: 18/388,166

(22) Filed: Nov. 8, 2023

(65) Prior Publication Data

US 2024/0079539 A1 Mar. 7, 2024

Related U.S. Application Data

(63) Continuation of application No. 18/038,815, filed as application No. PCT/JP2021/043037 on Nov. 24, 2021.

(30) Foreign Application Priority Data

| Nov. 25, 2020 | (JP) | 2020-195452 |
| Mar. 31, 2021 | (JP) | 2021-061969 |
| Apr. 6, 2021 | (JP) | 2021-065001 |

(51) Int. Cl.
*H01L 33/60* (2010.01)
*H01L 25/075* (2006.01)
(Continued)

(52) U.S. Cl.
CPC ............ *H01L 33/60* (2013.01); *H01L 33/486* (2013.01); *H01L 33/50* (2013.01); *H01L 33/62* (2013.01);
(Continued)

(58) Field of Classification Search
CPC .............................. H01L 33/60; H01L 33/486
See application file for complete search history.

(56) References Cited

U.S. PATENT DOCUMENTS

| 2010/0044735 A1 | 2/2010 | Oyamada |
| 2011/0211348 A1 | 9/2011 | Kim |

(Continued)

FOREIGN PATENT DOCUMENTS

| CN | 102738356 A | 10/2012 |
| JP | 2002-033517 A | 1/2002 |

(Continued)

OTHER PUBLICATIONS

International Search Report with translation, and Written Opinion in corresponding International Application No. PCT/JP2021/043037, mailed Jan. 11, 2022, in 12 pages.

(Continued)

*Primary Examiner* — Antonio B Crite
(74) *Attorney, Agent, or Firm* — Procopio, Cory, Hargreaves & Savitch LLP

(57) ABSTRACT

A light emitting device has a substrate having a rectangular planar shape, one or a plurality of light emitting elements mounted on the substrate, a dam resin having a frame-like planar shape, arranged so as to surround the light emitting element, and having an inclined surface whose height increases as its distance from the light emitting element increases, and a seal resin arranged in an area surrounded by the dam resin and which seals the light emitting element, and the dam resin has a protruding portion extending and protruding from at least one side toward the opposite side.

7 Claims, 34 Drawing Sheets

(51) Int. Cl.
*H01L 33/48* (2010.01)
*H01L 33/50* (2010.01)
*H01L 33/52* (2010.01)
*H01L 33/54* (2010.01)
*H01L 33/62* (2010.01)

(52) U.S. Cl.
CPC ............... *H01L 2933/0058* (2013.01); *H01L 2933/0066* (2013.01); *H01L 2933/0091* (2013.01)

(56) References Cited

U.S. PATENT DOCUMENTS

| | | | | |
|---|---|---|---|---|
| 2012/0286301 | A1* | 11/2012 | Kobayakawa | H01L 33/56 257/E33.066 |
| 2017/0054061 | A1 | 2/2017 | Naka et al. | |
| 2018/0083169 | A1 | 3/2018 | Naka et al. | |
| 2020/0212277 | A1* | 7/2020 | Ozeki | H01L 33/502 |
| 2020/0313058 | A1* | 10/2020 | Ukawa | H01L 33/46 |
| 2021/0050473 | A1* | 2/2021 | Shi | H01L 33/005 |

FOREIGN PATENT DOCUMENTS

| | | |
|---|---|---|
| JP | 2005-136378 A | 5/2005 |
| JP | 2008-159753 A | 7/2008 |
| JP | 2011-216891 A | 10/2011 |
| JP | 2011-228369 A | 11/2011 |
| JP | 5284006 B2 | 9/2013 |
| JP | 2014-241456 A | 12/2014 |
| JP | 2015-225942 A | 12/2015 |
| JP | 2017-204623 A | 11/2017 |
| JP | 2019-020733 A | 2/2019 |
| JP | 2020-150048 A | 9/2020 |
| WO | 2007/114306 A1 | 10/2007 |
| WO | 2020/137855 A1 | 7/2020 |

OTHER PUBLICATIONS

International Preliminary Report on Patentability in corresponding International Application No. PCT/JP2021/043037, mailed Feb. 28, 2023, in 16 pages.

* cited by examiner

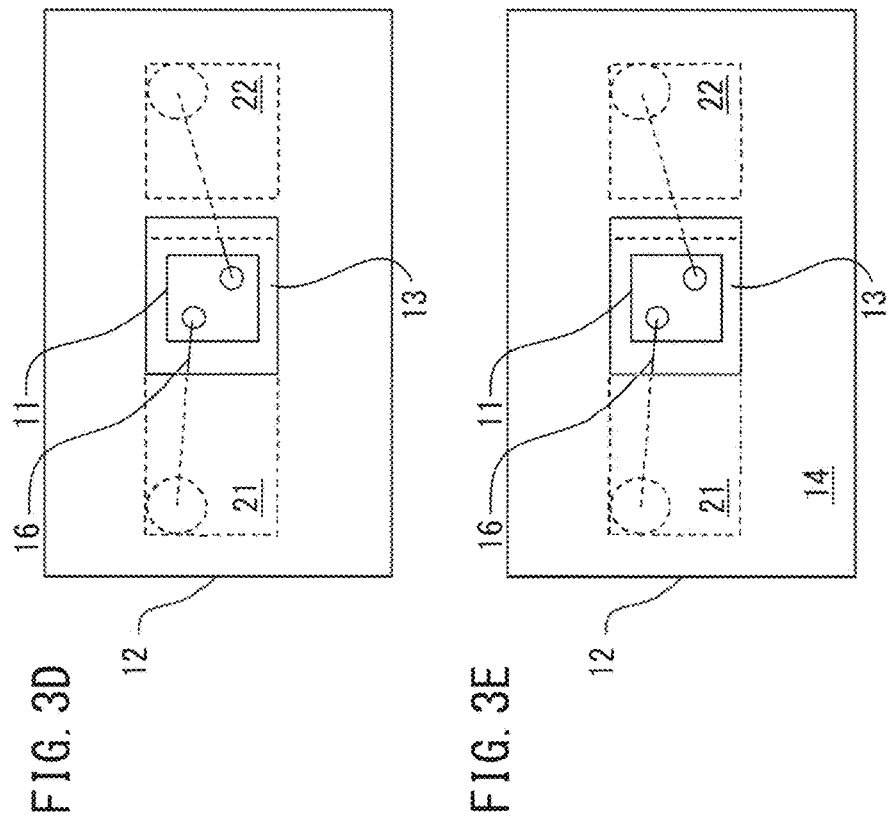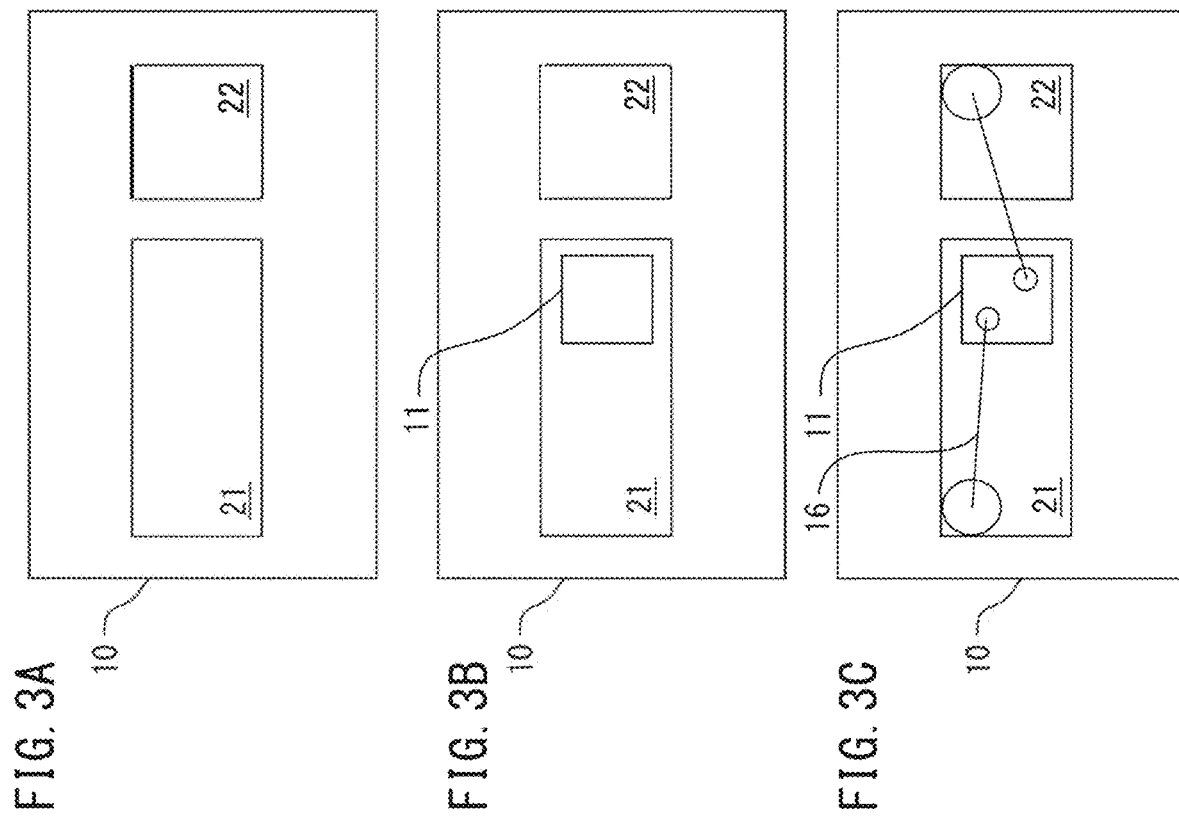

FIG. 22A
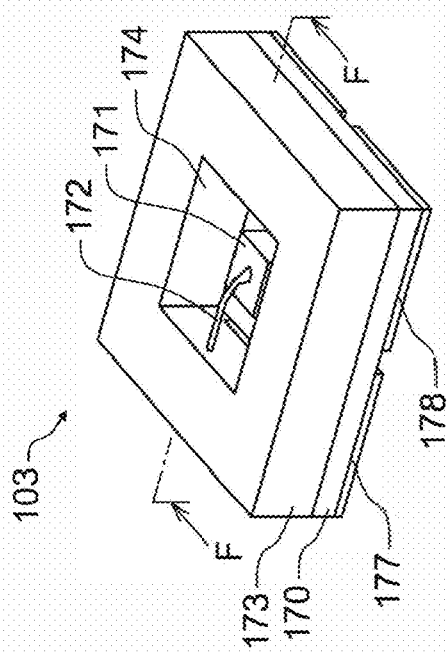
FIG. 22B
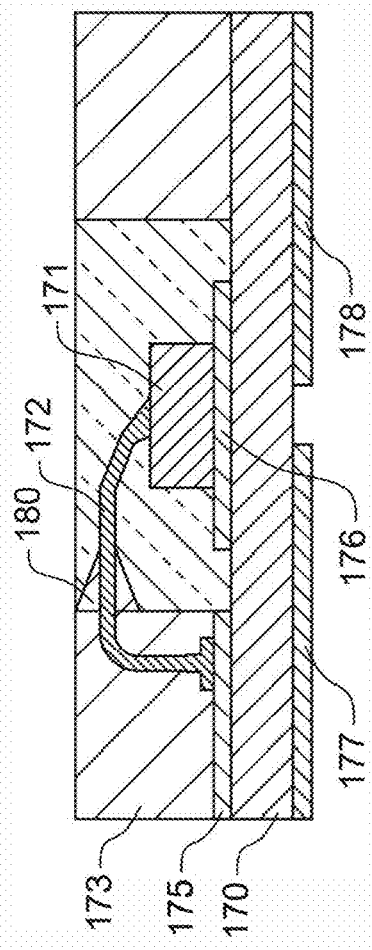
FIG. 22C
| | HEIGHT [μm] | DIAMETER OF BASE [μm] | DETERMINATION |
|---|---|---|---|
| EXAMPLE1 | 100 | 40 | ○ |
| EXAMPLE2 | 100 | 55 | ○ |
| EXAMPLE3 | 100 | 70 | ○ |
| EXAMPLE4 | 25 | 70 | ○ |
| EXAMPLE5 | 50 | 70 | ○ |
| EXAMPLE6 | 150 | 70 | ○ |
| COMPARATIVE EXAMPLE1 | 0 | 0 | × |
| COMPARATIVE EXAMPLE2 | 100 | 100 | × |
| COMPARATIVE EXAMPLE3 | 200 | 70 | × |

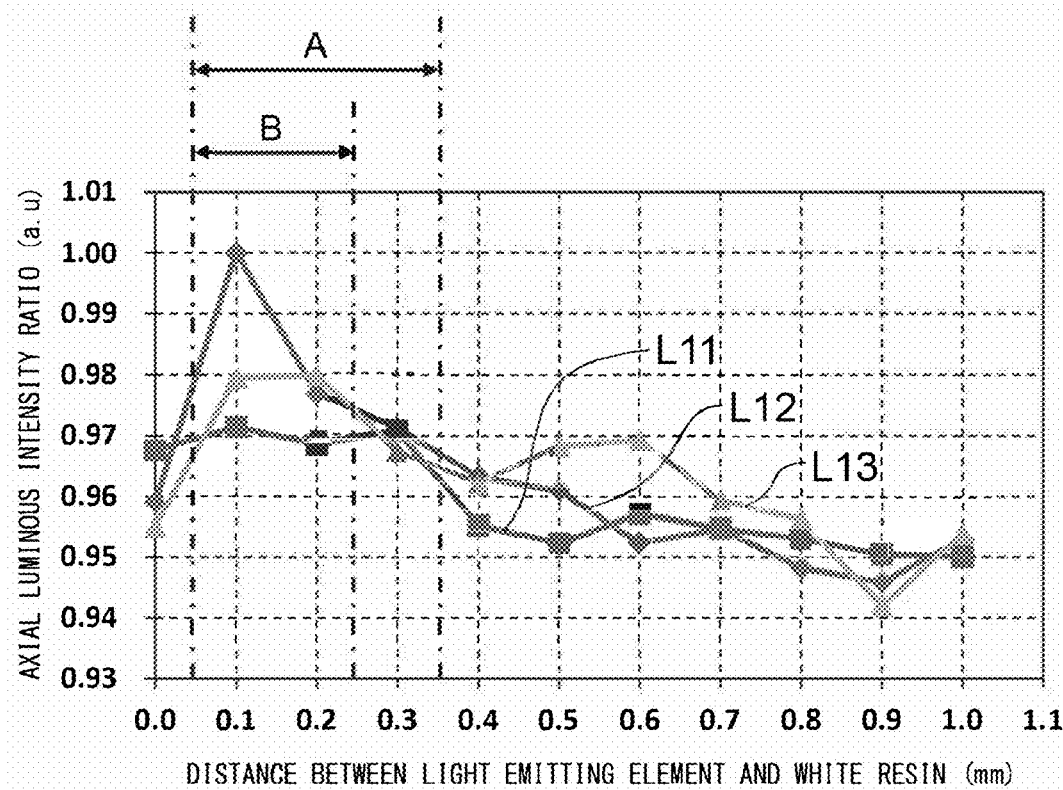

LIGHT EMITTING DEVICE

CROSS-REFERENCE TO RELATED APPLICATIONS

This application is a continuation of U.S. application Ser. No. 18/038,815, filed Aug. 15, 2023, which is a U.S. National Stage entry of International Application No.: PCT/JP2021/043037, filed Nov. 24, 2021, which claims priority to Japanese Patent Application No. 2021-065001, filed Apr. 6, 2021, Japanese Patent Application No. 2021-061969, filed Mar. 31, 2021, and Japanese Patent Application No. 2020-195452, filed Nov. 25, 2020, the entire contents of which are incorporated herein by reference.

FIELD

The present disclosure relates to a light emitting device.

BACKGROUND

A light emitting device using a light emitting diode (LED) as a light emitting element is known. For example, Japanese Patent No. 5,284,006 has described a light emitting device in which the space surrounded by a frame is filled with a seal material sealing a light emitting element as well as mounting a light emitting element on the surface of a substrate surrounded by the frame. In the light emitting device described in Japanese Patent No. 5284006, the inner surface of the frame is a mirror surface and reflection efficiency may be improved by light emitted from the light emitting element being reflected from the inner surface of the frame.

Further, a technique is also known, which seals a light emitting element that is mounted in a light emission area surrounded by a white resin, also referred to as a dam material, with a seal resin containing phosphors in a light emitting device using a light emitting diode as a light emitting element. For example, Japanese Unexamined Patent Publication No. 2014-241456 describes that the ratio of the area of a light emission area to the area of a light emitting device may be increased by arranging a wire pattern supplying electric power to a light emitting element that is mounted in the light emission area so as to be covered by a white resin.

Furthermore, a technique is known, which seals a light emitting element that is mounted in a light emission area surrounded by a white resin, also referred to as a dam material, with a seal resin in a light emitting device using a light emitting diode as the light emitting element. For example, Japanese Unexamined Patent Publication No. 2014-241456 describes a light emitting device capable of emitting light without color unevenness when a plurality of light emitting elements has the same wavelength because the plurality of light emitting elements is arranged so that the interval between each of the plurality of light emitting elements and the white resin is uniform.

As the use of a light emitting device spreads, it is expected for the light emitting device to improve various characteristics including the light emission efficiency, the lifetime, and the light distribution characteristic.

The present invention is intended to solve such problems, and an object thereof is to provide a light emitting device whose at least one characteristic of the light emission efficiency, the lifetime, and the light distribution characteristic is high.

The light emitting device according to the present invention has a substrate having a rectangular planar shape, one or a plurality of light emitting elements mounted on the substrate, a dam resin having a frame-like planar shape, arranged so as to surround the light emitting element, and having an inclined surface whose height increases as its distance from the light emitting element increases, and a seal resin arranged in an area surrounded by the dam resin and which seals the light emitting element, and the dam resin has a protruding portion extending and protruding from at least one side toward the opposite side.

Further, in the light emitting device according to the present invention, it is preferable for the dam resin to be formed by a synthetic resin material containing white particles and for the protruding portion to be a transparent resin arranged between the light emitting element and the dam resin.

Further, in the light emitting device according to the present invention, it is preferable for the light transmittance of the synthetic resin forming the seal resin to be higher than the light transmittance of the protruding portion.

Further, in the light emitting device according to the present invention, it is preferable for the refractive index of the seal resin to be lower than the refractive index of the protruding portion.

Further, in the light emitting device according to the present invention, it is preferable for the light emitting element to have a rectangular planar shape and for the protruding portion to contact with at least one side of the light emitting element.

Further, in the light emitting device according to the present invention, it is preferable for the substrate to further have an installed object having a difference in level thereon and for the dam resin to be locked by the installed object having a difference in level.

Further, it is preferable for the light emitting device according to the present invention to further have an electrode supplying electric power to the light emitting element, a wire pattern electrically connecting the light emitting element and the electrode, and a bonding wire electrically connecting the wiring pattern and the light emitting element, and for the bonding wire to have a first portion that is buried in the dam resin, a second portion that is buried in the seal resin, and a third portion arranged between the first portion and the second portion and covered by a conic solid-like conic solid resin extending from the dam resin along the extending direction of the bonding wire, and for the protruding portion to be a conic solid resin.

Further, in the light emitting device according to the present invention, it is preferable for the hardness of the conic solid resin to be lower than the hardness of the seal resin.

Further, in the light emitting device according to the present invention, it is preferable for the diameter of the base of the conic solid resin to be 1.1 times or more and 20 times or less the diameter of the cross section of the bonding wire.

Further, in the light emitting device according to the present invention, it is preferable for the length of the third portion to be 0.1 times or more and ten times or less the diameter of the base of the conic solid resin.

Further, in the light emitting device according to the present invention, it is preferable for the height of the boundary point from the backside of the light emitting element, at which the bonding wire protrudes from the dam resin toward the seal resin, to be greater than the height of the surface of the light emitting element from the backside of the light emitting element, at which the bonding wire is connected to the light emitting element.

Further, in the light emitting device according to the present invention, it is preferable for the dam resin to have a first side extending in parallel to one side of the substrate, a third side arranged facing the first side, and a second side connecting the first side and the third side and a fourth side, for the protruding portion to be the inner wall of a first corner between the fourth side and the first side, and for the extension distance of the inner wall of the first corner to be different from the extension distance of the inner wall of at least one corner other than the first corner.

Further, in the light emitting device according to the present invention, it is preferable for the extension distance of the inner wall of the first corner and the extension distance of the inner wall of the second corner between the first side and the second side to be longer than both the extension distance of the inner wall of the third corner between the third side and the second side and the extension distance of the inner wall of the fourth corner between the third side and the fourth side.

Further, in the light emitting device according to the present invention, it is preferable for a plurality of light emitting elements to include a first light emitting element whose length of the long side is a first length and whose shape is a rectangle, a second light emitting element whose length of the side is shorter than the first length and whose shape is a rectangle, and a third light emitting element having a third length shorter than the first length, and for the first light emitting element to be arranged so that the first light emitting element is in close proximity to the first side and whose long side is parallel to the first side, and for the second light emitting element and the third light emitting element to be arrayed so that the second light emitting element and the third light emitting element are in close proximity to the third side and whose one side is parallel to the third side.

Further, in the light emitting device according to the present invention, it is preferable for the minimum separation distance between the light emitting element and the dam resin to be 0.05 mm or more and 0.35 mm or less.

For the light emitting device according to the present disclosure at least one characteristic of the light emission efficiency, the lifetime, and the light distribution characteristic may be improved.

BRIEF DESCRIPTION OF THE DRAWINGS

FIGS. 3A to 3E are each a diagram showing a manufacturing method of the light emitting device shown in FIG. 1A, and FIG. 3A shows a first process, FIG. 3B shows a second process, FIG. 3C shows a third process, FIG. 3D shows a fourth process, and FIG. 3E shows a fifth process;

FIG. 15A shows a first aspect, FIG. 15B shows a second aspect, FIG. 15C shows a third aspect, FIG. 15D shows a fourth aspect, and FIG. 15E shows a fifth aspect;

FIG. 19B shows a second process, FIG. 19C shows a third process, FIG. 19D shows a fourth process, and FIG. 19E shows a fifth process;

FIG. 22A is a perspective diagram of a model that is used for simulation indicating a relationship between shape and stress of the third portion of the bonding wire of the light emitting device according to the embodiment, FIG. 22B is a cross-sectional diagram along an F-F line shown in FIG. 22A, and FIG. 22C is a diagram showing the height and the diameter of the base of the conic solid resin in the model that is used for simulation;

FIG. 36 is a diagram showing simulation results.

DESCRIPTION OF EMBODIMENTS

In the following, with reference to the drawings, the light emitting device according to the present disclosure is explained. However, the technical scope of the present invention is not limited to these embodiments and it should be noted that the technical scope includes the invention described in the claims and the equivalents thereof.

Outline of Light Emitting Device According to Embodiment

The light emitting device according to the embodiment has a substrate having a rectangular planar shape, one or a plurality of light emitting elements mounted on the substrate, and a dam resin having a frame-like planar shape, arranged so as to surround the light emitting element, and having an inclined surface whose height increases as its distance from the light emitting element increases. The light emitting device according to the embodiment further has a seal resin arranged in an area surrounded by the dam resin and sealing the light emitting element. In the light emitting apparatus according to the embodiment, the dam resin has a protruding portion extending and protruding from at least one side toward the opposite side. In the light emitting device according to the embodiment, at least one characteristic of the light emission efficiency, the lifetime, and the light distribution characteristic may be improved, by the dam resin having a protruding portion extending and protruding from at least one side toward the opposite side.

Figure 1A:
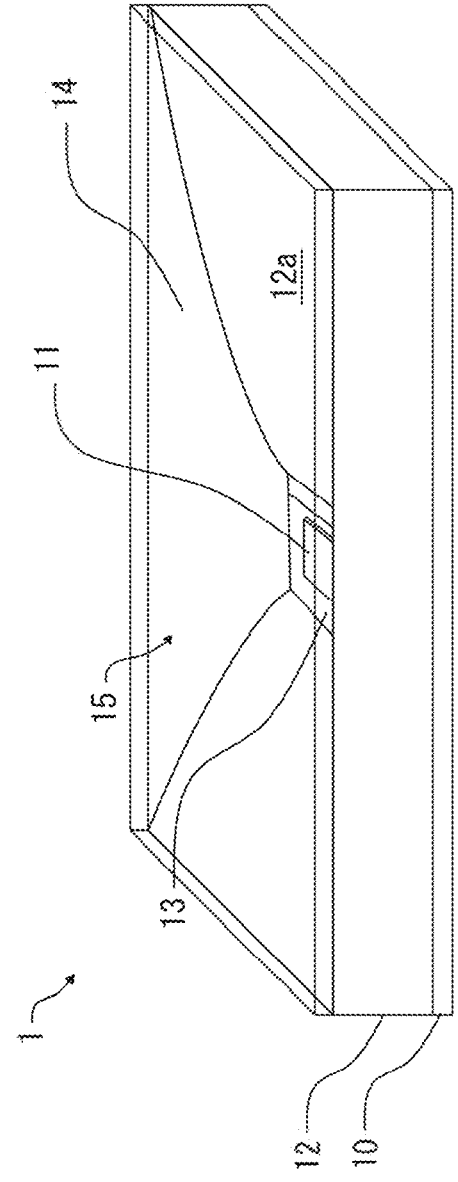
FIG. 1A is a perspective diagram of a light emitting device according to a first embodiment.
Figure 1B:
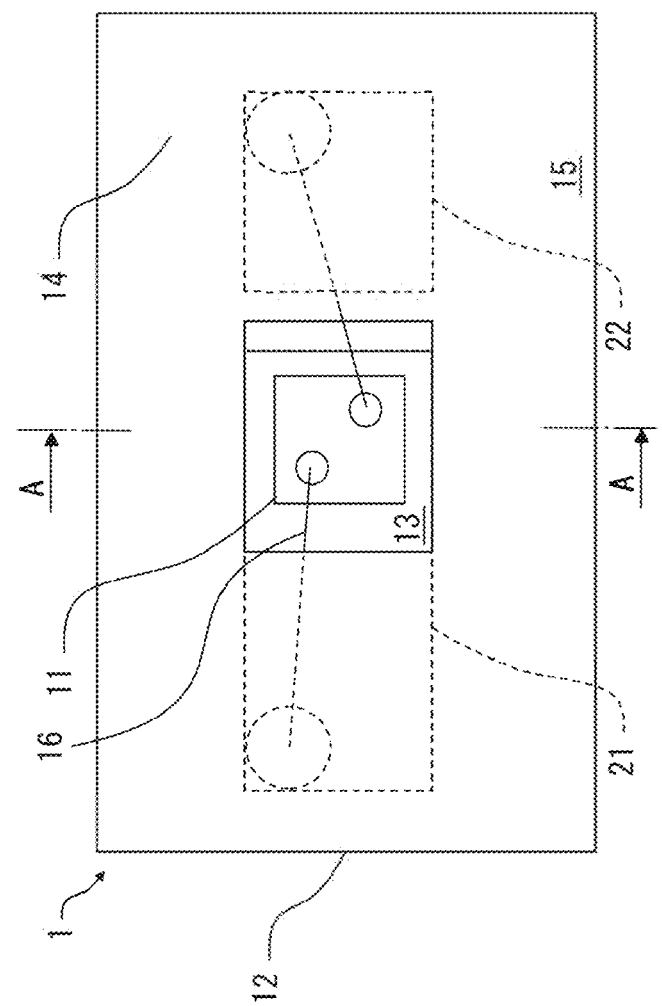
FIG. 1B is a plan diagram of the light emitting device shown in FIG. 1A.
Figure 2:
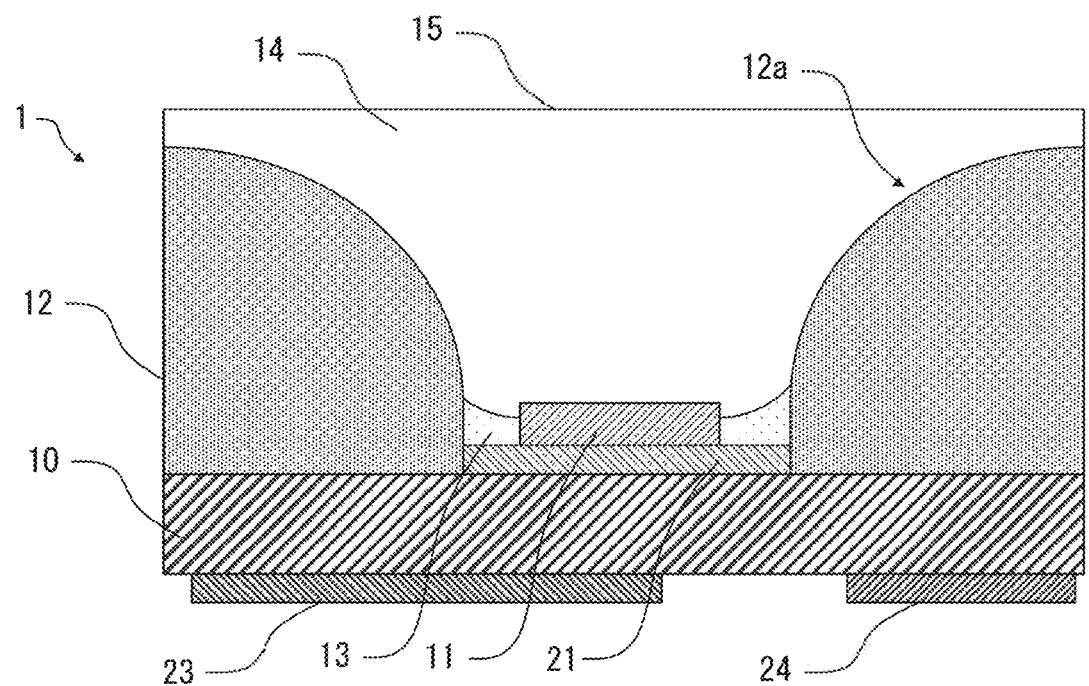
FIG. 2 is a cross-sectional diagram along an A-A line shown in FIG. 1B.

Configuration and Function of Light Emitting Device According to First Embodiment FIG. 1A is a perspective diagram of a light emitting device according to a first embodiment, FIG. 1B is a plan diagram of the light emitting device shown in FIG. 1A, and FIG. 2 is a cross-sectional diagram along an A-A line shown in FIG. 1B.

A light emitting device 1 has a substrate 10, a light emitting element 11, a white resin 12, a first transparent resin 13, and a second transparent resin 14 and emits light emitted from the light emitting element 11 from an emission surface 15.

The substrate 10 is a printed circuit board (PCB) having a rectangular planar shape formed by an insulating resin, such as a glass epoxy resin. The length of one side of the substrate is, for example, 3 mm or less. On the surface of the substrate 10, an anode wire 21 and a cathode wire 22 are arranged and on the backside of the substrate 10, an anode electrode 23 and a cathode electrode 24 are arranged. The anode wire 21 and the anode electrode 23 are connected via a through-hole electrode, not shown schematically, which is arranged in a through-hole also referred to as a via, and the cathode wire 22 and the cathode electrode 24 are connected in the same manner.

The light emitting element 11 is a blue LED die that emits blue light in accordance with a forward voltage being applied between the anode electrode 23 and the cathode electrode 24 connected via a bonding wire 16, the anode wire 21, and the cathode wire 22 and has a rectangular planar shape. The main wavelength of the blue light that is emitted from the light emitting element 11 is within a range between 445 nm and 495 nm and in one example, 450 nm. The light emitting element 11 is formed by laminating a PN joint layer formed by a gallium nitride (GaN) layer on a sapphire substrate, which is a transparent substrate.

The white resin 12 is also referred to as a dam resin and formed by a synthetic resin material, such as silicone resin, in which white particles, such as titanium oxide ($TiO_2$), are contained, and whose outer edge contacts with the outer edge of the substrate 10, which is arranged so as to surround the light emitting element 11, and which seals part of the bonding wire 16. The light transmittance of the white resin 12 is higher than 0% and less than 5%. The white resin 12 has a reflection surface 12a, which is an inclined surface, whose height increases as the reflection surface 12a become more distant from the light emitting element 11 toward the outer edge of the substrate 10. Part of light emitted from the light emitting element 11 is reflected from the reflection surface 12a and emitted from the emission surface 15.

The first transparent resin 13 is an example of a protruding portion extending and protruding from at least one side toward the opposite side, and formed by the same synthetic resin material as the synthetic resin material forming the white resin 12 containing a small amount of titanium oxide and arranged between the light emitting element 11 and the white resin 12. The light transmittance of the first transparent resin 13 is 20% or more and less than 90%. It is preferable for the light transmittance of the first transparent resin 13 to be 8% or more and further preferable to be 85% or more. The first transparent resin 13 is arranged so as to contact with all the four sides of the light emitting element 11 and cover part of or the entire side surface. Further, the first transparent resin 13 is arranged so as not to cover the top surface of the light emitting element 11.

The second transparent resin 14 is formed by a transparent synthetic resin material, such as a silicone resin, and contains fillers and is arranged in an area surrounded by the white resin 12 and seals part of the light emitting element 11 and the bonding wire 16. The second transparent resin 14 is arranged so as to cover the entire surface of the white resin 12 and be located at a position higher than the apex of the white resin 12. While the first transparent resin 13 contains a small amount of titanium oxide, the content of the titanium oxide of the second transparent resin 14 is further smaller or the second transparent resin 14 does not contain titanium oxide at all, and therefore the light transmittance of the second transparent resin 14 is higher than the light transmittance of the first transparent resin 13. It is preferable for the light transmittance of the second transparent resin 14 to be 90% or more and less than 100%.

The filler contained in the second transparent resin 14 is a diffusion material diffusing light emitted from the light emitting element 11 and is, for example, silicon dioxide ($SiO_2$). The filler is arranged so as to be distributed substantially uniformly in the second transparent resin 14.

The light transmittance of the first transparent resin 13 and the second transparent resin 14 is measured based on JIS K7375 (Plastics-Determination of total luminous transmittance and reflectance).

The synthetic resin material forming the second transparent resin 14 is higher in heat resistance and light resistance than the synthetic resin material forming the white resin 12 and the first transparent resin 13 and on the other hand, lower in adhesiveness to the substrate and refractive index than the synthetic resin material forming the white resin 12 and the first transparent resin 13.

The adhesiveness between the synthetic resin forming the white resin 12, the first transparent resin 13, and the second transparent resin 14, and the substrate 10 is measured based on JIS K6848-1 (Adhesives—Testing methods of bonding strength of adhesives—). Further, the refractive index of the synthetic resin forming the first transparent resin 13 and the second transparent resin 14 is measured based on JIS K0062 (Test methods for refractive index of chemical products).

Manufacturing Method of Light Emitting Device According to First Embodiment

FIGS. 3A to 3E are each a diagram showing a manufacturing method of the light emitting device 1 and FIG. 3A shows a first process, FIG. 3B shows a second process, FIG. 3C shows a third process, FIG. 3D shows a fourth process, and FIG. 3E shows a fifth process. In FIGS. 3A to 3E, only the single light emitting device 1 is shown, but the light emitting device 1 is manufactured by using a collective substrate coupling a plurality of the substrates 10.

First, in the first process, a collective substrate coupling a plurality of the substrates 10 on the surface of which the anode wire 21 and the cathode wire 22 are formed is prepared. Next, in the second process, the light emitting element 11 is bonded onto each anode wire 21 on the plurality of the substrates 10 by a die bond material.

Next, in the third process, each anode of the plurality of the light emitting elements 11 bonded onto the anode wire 21 in the second process and the anode wire 21 are connected by the bonding wire 16 in wire bonding processing. Further, each cathode of the plurality of the light emitting elements 11 and the cathode wire 22 are connected by the bonding wire 16 in wire bonding processing.

Next, in the fourth process, the white resin 12 and the first transparent resin 13 are arranged on the surface of each of the plurality of the substrates 10. The resin material before curing the white resin 12 and the first transparent resin 13 is arranged so that a predetermined separation distance to the light emitting element 11 is provided. When the resin material before curing the white resin 12 and the first transparent resin 13 is arranged, the resin material before curing the first transparent resin 13 whose content of titanium oxide is very low flows out between the light emitting element 11 and the resin material before curing the white resin 12. The white resin 12 and the first transparent resin 13 are formed, by heating the substrate 10 after the resin material before curing the white resin 12 and the first transparent resin 13 is arranged.

Next, in the fifth process, the second transparent resin 14 is arranged on the surface of each of the plurality of the substrates 10. The resin material before curing the second transparent resin 14 is arranged so as to cover the light emitting element 11, the white resin 12, the first transparent resin 13, and the bonding wire 16 and be located at a position higher than the apex of the white resin 12. The second transparent resin 14 is formed, by heating the substrate 10 after the resin material before curing the second transparent resin 14 is arranged.

Then, in the six process, by cutting the collective substrate coupling the plurality of the substrates 10, the plurality of the substrates 10 is separated into each individual substrate 10 and the light emitting device 1 is manufactured.

Function Effect of Light Emitting Device According to First Embodiment

In the light emitting device 1, the light emitting element 11 and the white resin 12 are arranged via the first transparent resin 13 whose light transmittance is higher than that of the white resin 12, and therefore the light emission efficiency may be not reduced by contacting the white resin 12 with the side surface of the light emitting element. The light emitting device 1 may be downsized and the light emission efficiency may be improved by arranging the first transparent resin 13 between the light emitting element 11 and the white resin 12.

Further, in the light emitting device 1, the white resin 12 and the first transparent resin 13 whose adhesiveness to the substrate 10 is higher than that of the second transparent resin 14 are joined onto the substrate 10. In the light emitting device 1, the second transparent resin 14 is joined onto the substrate 10 via the white resin 12 and the first transparent resin 13 whose adhesiveness to the substrate 10 is high, and therefore the second transparent resin 14 may not peel off the substrate 10, and therefore the reliability of the light emitting device 1 may be improved.

Further, in the light emitting device 1, the first transparent resin 13 whose refractive index is higher than that of the second transparent resin 14 is arranged so as to contact with the light emitting element 11, and therefore the light extraction efficiency of light from the light emitting element 11 becomes high and the light emission efficiency improves.

Further, in the light emitting device 1, the second transparent resin 14 whose refractive index is lower than that of the first transparent resin 13 is arranged above the first transparent resin 13, and therefore the axial efficiency improves and the light emission efficiency further improves.

Modification Example of Light Emitting Device According to First Embodiment

In the light emitting device 1, the second transparent resin 14 is arranged so as to be located higher than the apex of the white resin 12, but in the light emitting device according to the embodiment, the second transparent resin 14 may be formed so as to have a height less than or equal to the height of the apex of the white resin 12.

Figure 4A:
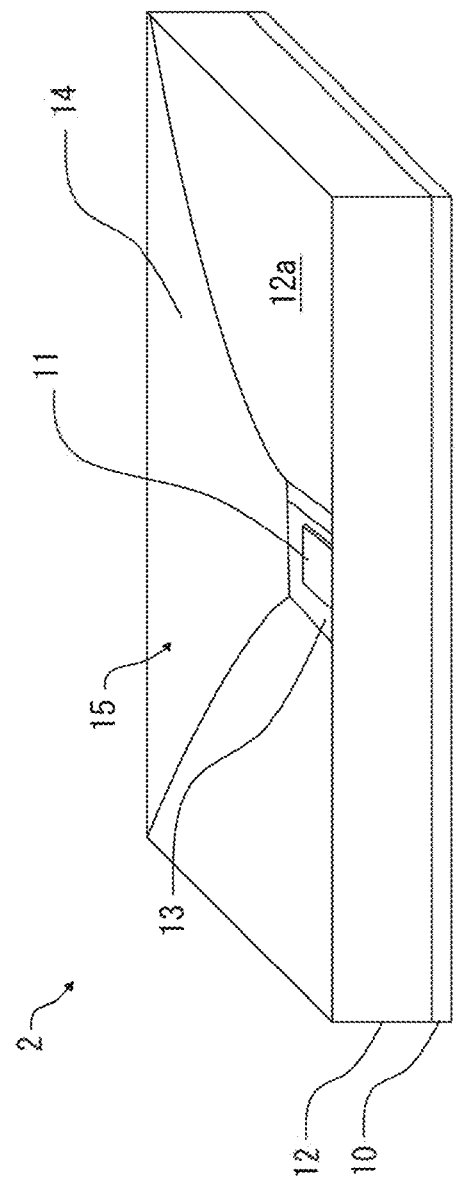
FIG. 4A is a perspective diagram of a light emitting device according to a first modification.
Figure 4B:
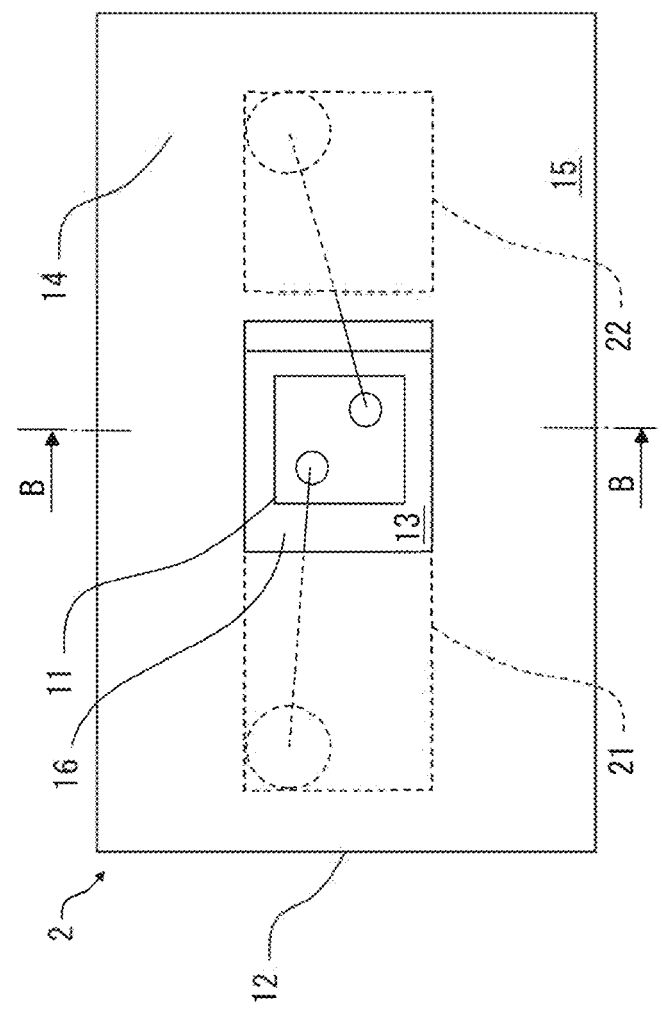
FIG. 4B is a plan diagram of the light emitting device shown in FIG. 4A.
Figure 5:
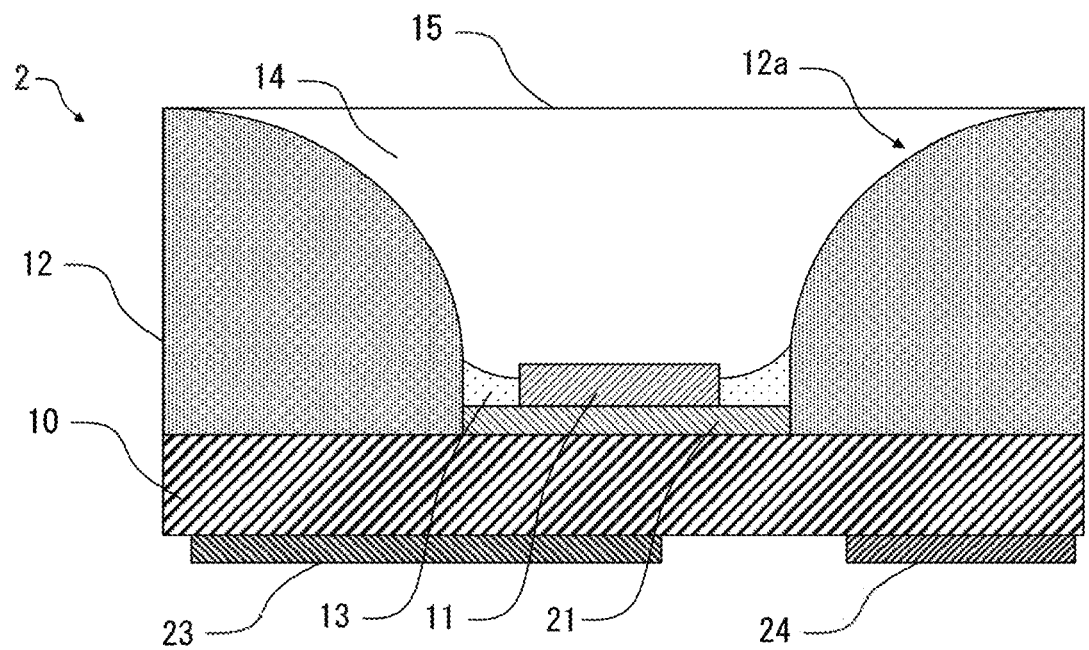
FIG. 5 is a cross-sectional diagram along a B-B line shown in FIG. 4B.

FIG. 4A is a perspective diagram of a light emitting device according to a first modification, FIG. 4B is a plan diagram of the light emitting device shown in FIG. 4A, and FIG. 5 is a cross-sectional diagram along a B-B line shown in FIG. 4B.

A light emitting device 2 differs from the light emitting device 1 in that the height of the second transparent resin 14 matches a height less than or equal to the height of the apex of the white resin 12. The configuration and function of the light emitting device 2 other than the height of the second transparent resin 14 are the same as the configuration and function of the light emitting device 1, to which the same symbols are attached, and therefore detailed explanation is omitted here.

In the light emitting device 1, the height of the second transparent resin 14 is greater than the height of the apex of the white resin 12, and therefore part of emitted light leaks in the lateral surface direction, and therefore the amount of light emitted in the direct upward direction may be decreased. In the light emitting device 2, the height of the second transparent resin 14 matches the height of the apex of the white resin 12, and therefore part of emitted light may not leak in the lateral surface direction, and the amount of light emitted in the direct upward direction may be increased compared to that of the light emitting device 1.

Further, in the light emitting device 1, the second transparent resin 14 does not contain phosphors, but in the light emitting device according to the embodiment, the second transparent resin 14 may contain phosphors.

Figure 6:
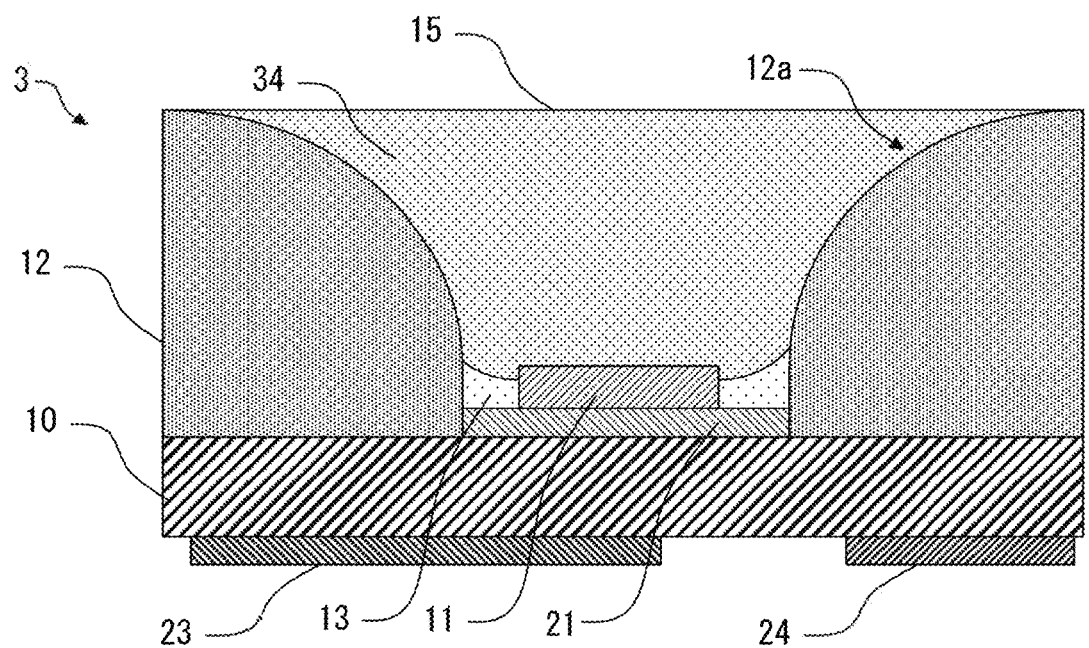
FIG. 6 is a cross-sectional diagram of a light emitting device according to a second modification along the B-B line shown in FIG. 4B.

FIG. 6 is a cross-sectional diagram of a light emitting device according to a second modification along the B-B line shown in FIG. 4B, like the cross-sectional diagram shown in FIG. 5.

A light emitting device 3 differs from the light emitting device 2 in having a second transparent resin 34 in place of the second transparent resin 14. The configuration and function of the components of the light emitting device 3 other than the second transparent resin 34 are the same as the configuration and function of the components of the light emitting device 2, to which the same symbols are attached, and therefore detailed explanation is omitted here.

The second transparent resin 34 is formed by the same synthetic resin material as that of the second transparent resin 14 and contains phosphors and fillers. The phosphors and fillers contained in the second transparent resin 34 are arranged uniformly across the entire second transparent resin 34. The light transmittance of the synthetic resin forming the second transparent resin 34 is higher than the light transmittance of the first transparent resin 13.

The phosphor contained in the second transparent resin 34 radiates yellow light whose wavelength is different from the wavelength of blue light emitted from the light emitting element 11 by converting the blue light emitted from the light emitting element 11. The phosphor contained in the second transparent resin 34 is, for example, yttrium aluminum garnet (YAG). The main wavelength of the yellow light that is radiated from the phosphor contained in the second transparent resin 34 is within a range between 525 nm and 575 nm, and in one example, 550 nm.

The filler contained in the second transparent resin 34 is a diffusion material that diffuses light emitted from the light emitting element 11 and light radiated from the phosphor contained in the second transparent resin 34 and is, for example, silicon dioxide like the filler contained in the second transparent resin 14. The light emitting device 3 emits white light by mixing the blue light emitted from the light emitting element 11 and the yellow light radiated from the phosphor contained in the second transparent resin 34 by the filler contained in the second transparent resin 34.

In the light emitting device 3, as in the light emitting device 2, the first transparent resin 13 not containing phosphors is arranged so as to cover part of or the entire side surface of the light emitting element 11, and therefore part of or the entire light emitted from the side surface of the light emitting element 11 does not contact with the phosphor. In the light emitting device 3, part of or the entire light emitted from the side surface of the light emitting element 11 does not contact with the phosphor, and therefore the path length of light emitted from each portion of part of or the entire side surface and the top surface of the light emitting element 11 transmitting the second transparent resin 34 containing phosphors is substantially the same. In the light emitting device 3, the path length of light emitted from each portion of part of or the entire side surface and the top surface of the light emitting element 11 transmitting the second transparent resin 34 containing phosphors is substantially the same, and therefore the amount of light emitted from each portion of part of or the entire side surface and the top surface of the light emitting element 11 contacting with the phosphor is substantially the same. In the light emitting device 3, the amount of light emitted from each portion of part of or the entire side surface and the top surface of the light emitting element 11 contacting with the phosphor is substantially the same, and therefore color unevenness may not occur.

Figure 7A:
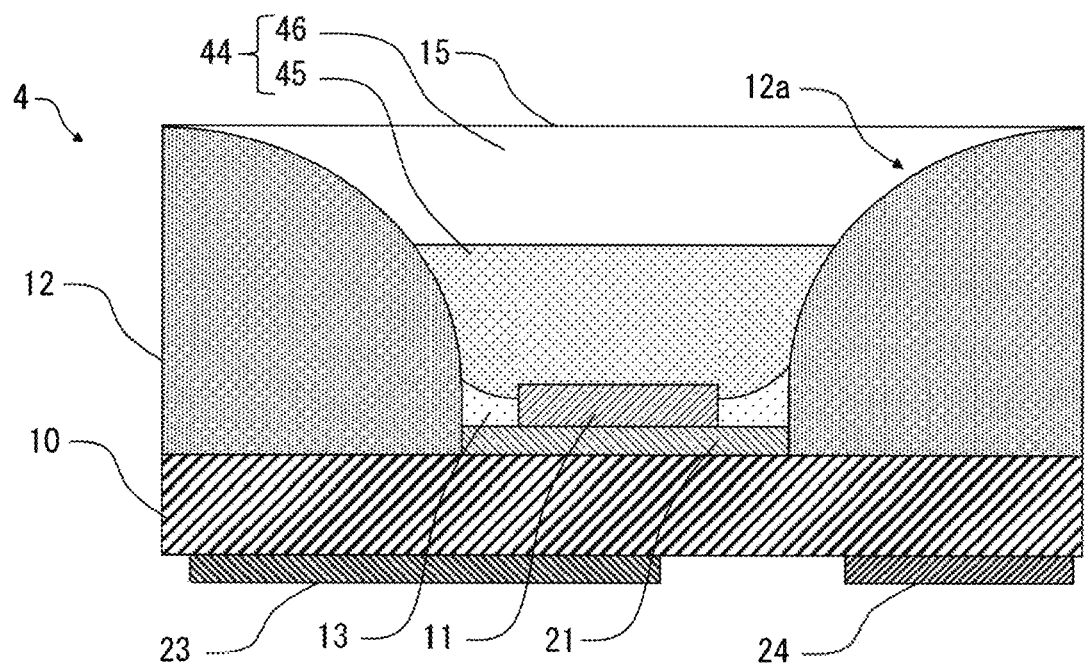
FIG. 7A is a cross-sectional diagram of a light emitting device according to a third modification and FIG. 7B is a cross-sectional diagram of a light emitting device according to a fourth modification.
Figure 7B:
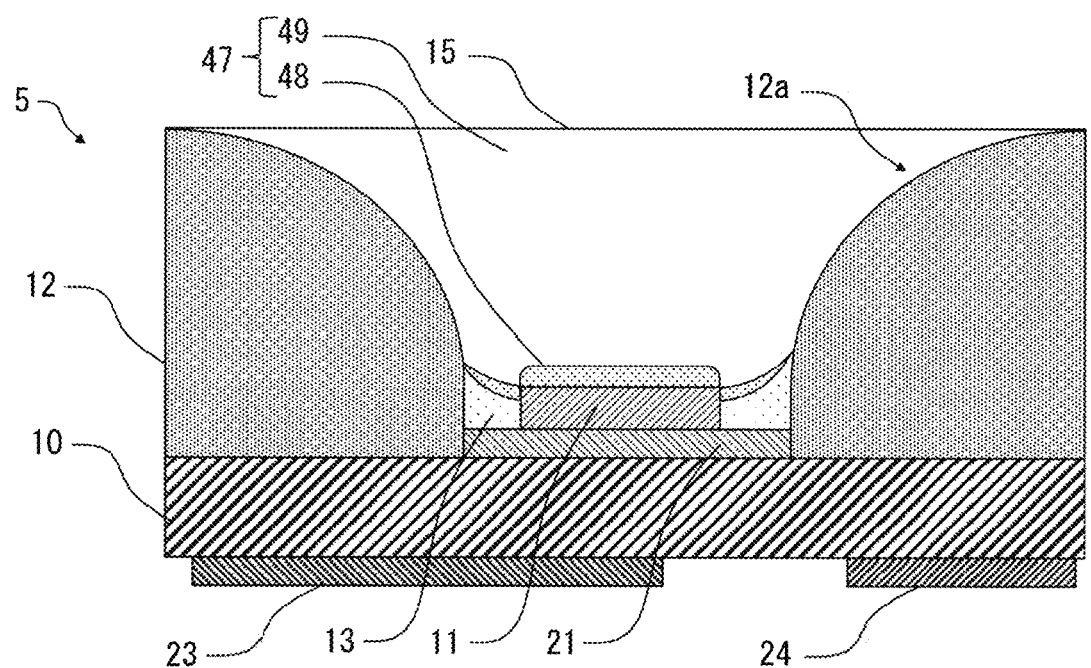

FIG. 7A is a cross-sectional diagram of a light emitting device according to a third modification and FIG. 7B is a cross-sectional diagram of a light emitting device according to a fourth modification. FIG. 7A and FIG. 7B are each a cross-sectional diagram of a light emitting device according to the third modification or the fourth modification along the B-B line shown in FIG. 4B, like the cross-sectional diagram shown in FIG. 5.

A light emitting device 4 differs from the light emitting device 2 in having a second transparent resin 44 in place of the second transparent resin 14. The configuration and function of the components of the light emitting device 4 other than the second transparent resin 44 are the same as the configuration and function of the components of the light emitting device 2, to which the same symbols are attached, and therefore detailed explanation is omitted here.

The second transparent resin 44 is formed by the same synthetic resin material as that of the second transparent resin 14 and contains phosphors and fillers. The second transparent resin 44 has a first layer 45 containing phosphors and fillers and a second layer 46 transparent and hardly containing phosphors. The light transmittance of the synthetic resin forming the second transparent resin 44 is higher than the light transmittance of the first transparent resin 13. The first layer 45 and the second layer 46 are formed by, for example, after applying the synthetic resin material before curing, which forms the second transparent resin 44 containing phosphors and fillers, so as to cover the light emitting element 11, the white resin 12, and the first transparent resin 13, solidifying the synthetic resin material after a predetermined precipitation time elapses.

The phosphor and filler contained in the second transparent resin 44 are the same as the phosphor and filler contained in the second transparent resin 34, and therefore detailed explanation is omitted here.

A light emitting device 5 differs from the light emitting device 2 in having a second transparent resin 47 in place of the second transparent resin 14. The configuration and function of the components of the light emitting device 5 other than the second transparent resin 47 are the same as the configuration and function of the components of the light emitting device 2, to which the same symbols are attached, and therefore detailed explanation is omitted here.

The second transparent resin 47 is formed by the same synthetic resin material as that of the second transparent resin 14 and contains phosphors and fillers. The second transparent resin 47 has a first layer 48 containing phosphors and fillers and a second layer 49 transparent and hardly containing phosphors. The light transmittance of the synthetic resin forming the second transparent resin 47 is higher than the light transmittance of the first transparent resin 13. The first layer 48 and the second layer 49 are formed by, for example, solidifying the synthetic resin material before curing, which forms the second transparent resin 47 containing phosphors and fillers, after a predetermined precipitation time longer than that at the time of forming the second transparent resin 44 elapses.

The phosphor and filler contained in the second transparent resin 47 are the same as the phosphor and filler contained in the second transparent resin 34, and therefore detailed explanation is omitted here.

In the light emitting devices 4 and 5, as in the light emitting device 3, the first transparent resin 13 not containing phosphors is arranged so at to cover part of or the entire side surface of the light emitting element 11, and therefore light emitted from part of or the entire side surface of the light emitting element 11 dose not contact with the phosphor similar to the light emitting device 3. In the light emitting devices 4 and 5, light emitted from part of or the entire side surface of the light emitting element 11 does not contact with the phosphor, and therefore color unevenness may not occur similar to the light emitting device 3.

Further, in the light emitting devices 1 to 5, the white resin 12 is arranged so as to contact with the outer edge of the substrate 10, but in the light emitting device according to the embodiment, the frame material may be arranged outside the white resin 12.

Figure 8:
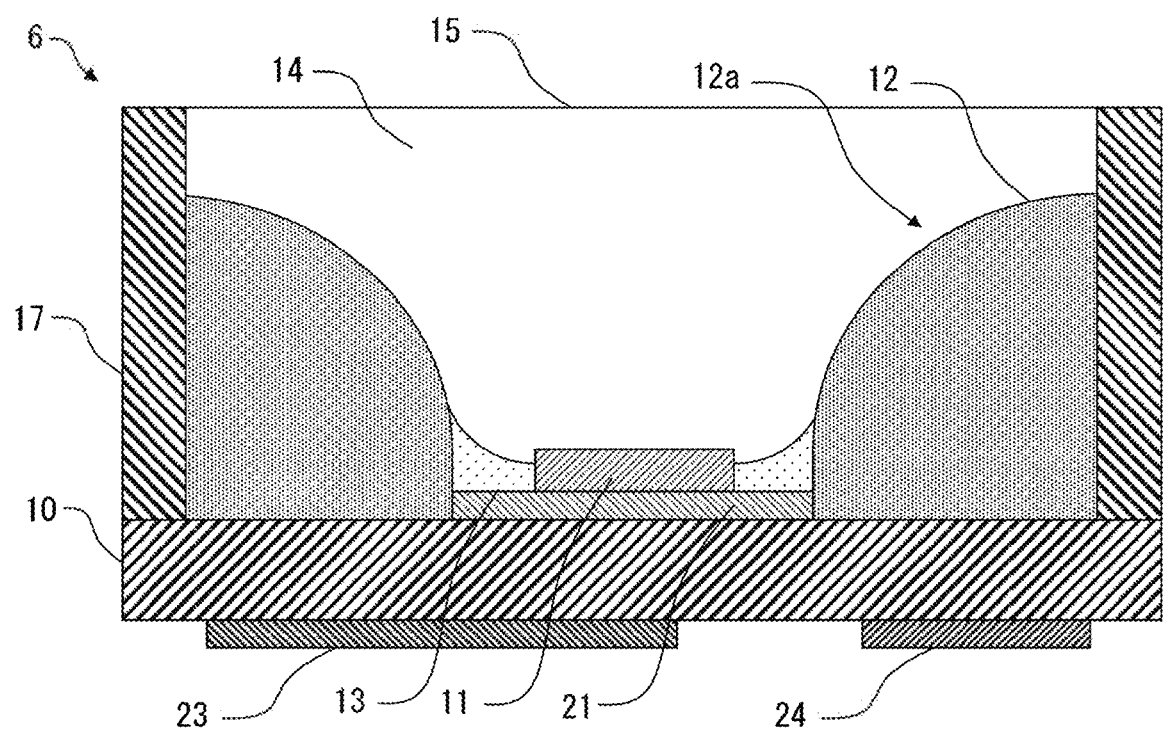
FIG. 8 is a cross-sectional diagram of a light emitting device according to a fifth modification.

FIG. 8 is a cross-sectional diagram of a light emitting device according to a fifth modification. FIG. 8 is the cross-sectional diagram of a light emitting device according to the fifth modification along the A-A line shown in FIG. 1B, like the cross-sectional diagram shown in FIG. 2.

A light emitting device 6 differs from the light emitting device 1 in having a frame material 17 that is arranged outside the white resin 12. The configuration and function of the components of the light emitting device 6 other than the frame material 17 are the same as the configuration and function of the components of the light emitting device 1, to which the same symbols are attached, and therefore detailed explanation is omitted here.

The frame material 17 is formed by the synthetic resin material, such as the silicone resin in which white particles, such as titanium oxide, are contained and is a frame-like member that is arranged along the outer edge of the substrate 10. The light transmittance of the frame material 17 is 5% or more and less than 20%. The frame material 17 is arranged so as to surround the light emitting element 11, the white resin 12, the first transparent resin 13, and the second transparent resin 14. The height of the frame material 17 is greater than the height of the apex of the white resin 12. The frame material 17 may be formed by a resin whose rigidity is high and whose reflectance is high, such as a polyimide resin and alumina.

The light emission efficiency may be improved compared to that of the light emitting device 1, by the light emitting device 6 having the frame material 17 whose height is greater than the height of the apex of the white resin 12 outside the white resin 12.

In the light emitting device 6, the second transparent resin 14 that seals the light emitting element 11 does not contain phosphors, but the light emitting device according to the embodiment may have the second transparent resin 34, the second transparent resin 44, and the second transparent resin 47 each containing phosphors in place of the second transparent resin 14.

Further, in the light emitting devices 1 to 6, only the single light emitting element 11 is mounted, but in the light emitting device according to the embodiment, a plurality of light emitting elements may be mounted.

Figure 9:
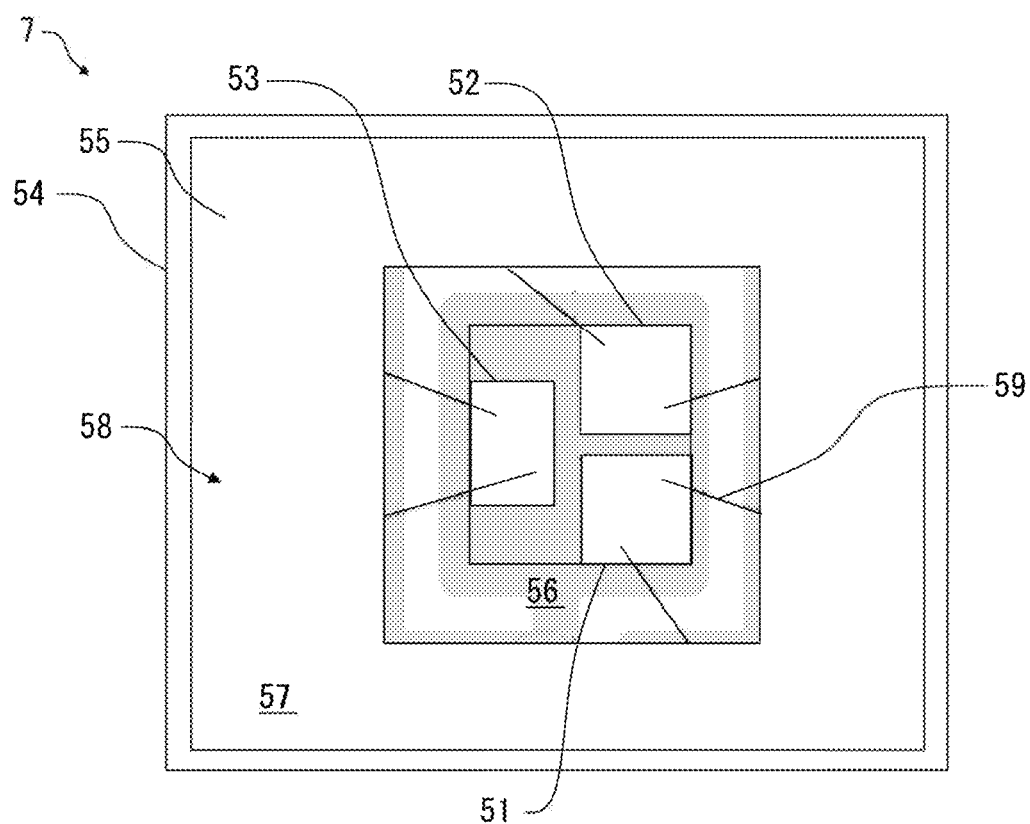
FIG. 9 is a plan diagram of a light emitting device according to a sixth modification.
Figure 10:
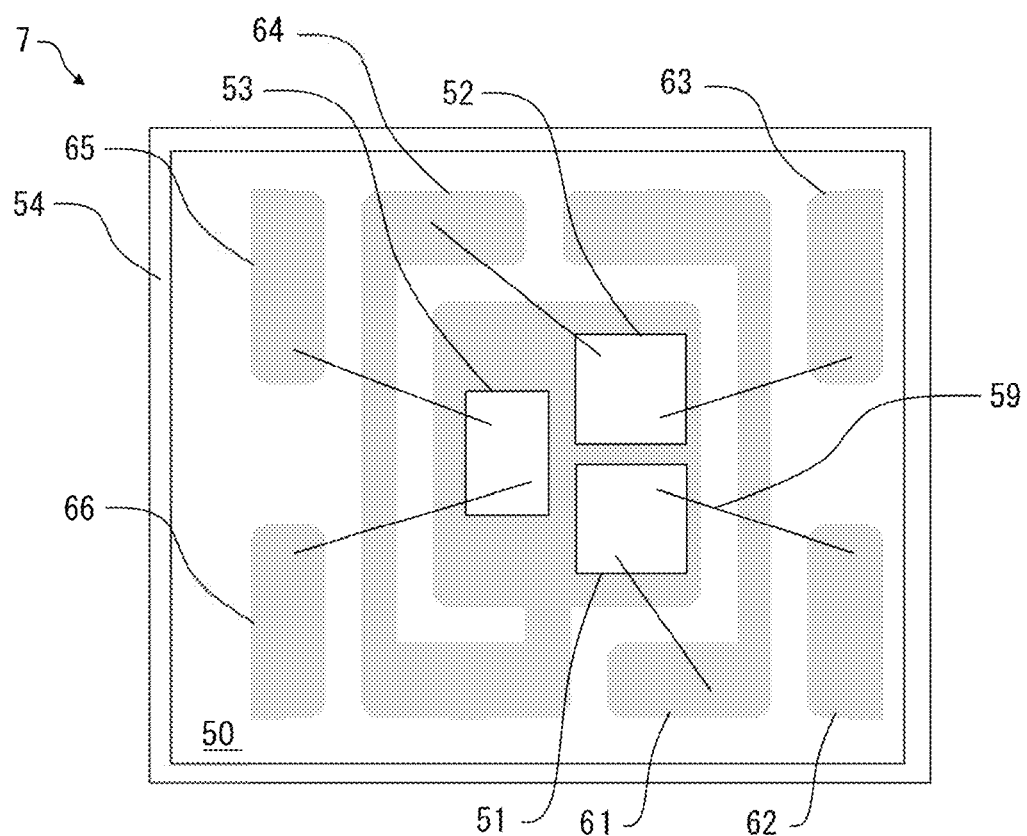
FIG. 10 is a plan diagram of the light emitting device according to the sixth modification in the state where the white resin, the first transparent resin, and the second transparent resin are removed.

FIG. 9 is a plan diagram of a light emitting device according to a sixth modification and FIG. 10 is a plan diagram of the light emitting device according to the sixth modification in the state where the white resin, the first transparent resin, and the second transparent resin are removed.

A light emitting device 7 has a substrate 50, a first light emitting element 51, a second light emitting element 52, a third light emitting element 53, a frame material 54, a white resin 55, a first transparent resin 56, and a second transparent resin 57. The light emitting device 7 emits light emitted from the first light emitting element 51, the second light emitting element 52, and the third light emitting element 53 from an emission surface 58.

The substrate 50 has a rectangular planar shape formed by an insulating resin, such as a glass epoxy resin, like the substrate 10. On the surface of the substrate 50, a first anode wire 61 and a first cathode wire 62, a second anode wire 63 and a second cathode wire 64, and a third anode wire 65 and a third cathode wire 66 are arranged. Each of the first anode wire 61 to the third cathode wire 66 is connected to a backside electrode that is formed on the backside of the substrate 50.

The first anode wire 61 and the first cathode wire 62 are arranged between the outer edge of the substrate 50 and the first light emitting element 51. The first anode wire 61 is connected to the anode of the first light emitting element 51 and the first cathode wire 62 is connected to the cathode of the first light emitting element 51.

The second anode wire 63 is arranged between the outer edge of the substrate 10 and the second light emitting element 52. The second cathode wire 64 has a flat plate portion on which the first light emitting element 51 to the third light emitting element 53 are mounted and a wire portion that is arranged between the outer edge of the substrate 50 and the second light emitting element 52. The second anode wire 63 is connected to the anode of the second light emitting element 52 and the second cathode wire 64 is connected to the cathode of the second light emitting element 52.

The third anode wire 65 and the third cathode wire 66 are arranged between the outer edge of the substrate 50 and the third light emitting element 53. The third anode wire 65 is connected to the anode of the third light emitting element 53 and the third cathode wire 66 is connected to the cathode of the third light emitting element 53.

The first light emitting element 51 is a blue LED die having a rectangular planar shape, like the light emitting element 11. The first light emitting element 51 emits blue light in accordance with a forward voltage being applied via the backside electrode between the first anode wire 61 and the first cathode wire 62 connected via a bonding wire 59.

The second light emitting element 52 is a green LED die having a rectangular planar shape. The second light emitting element 52 emits green light in accordance with a forward voltage being applied via the backside electrode between the second anode wire 63 and the second cathode wire 64 connected via the bonding wire 59. The main wavelength of the green light that is emitted from the second light emitting element 52 is within a range between 500 nm and 570 nm and in one example, 550 nm. The second light emitting element 52 is formed by laminating a PN joint layer formed by gallium nitride on a sapphire substrate, which is a transparent substrate.

The third light emitting element 53 is a red LED die having a rectangular planar shape. The third light emitting element 53 emits red light in accordance with a forward voltage being applied via the backside electrode between the third anode wire 65 and the third cathode wire 66 connected via the bonding wire 59. The main wavelength of the red light that is emitted from the third light emitting element 53 is within a range between 600 nm and 680 nm and in one example, 660 nm. The third light emitting element 53 is formed by arranging a PN joint layer formed by a gallium aluminum arsenide (GaAlAs) layer on a silicon substrate, which is a substrate that does not transmit light.

The frame material 54 is formed by, like the frame material 17, a synthetic resin material, such as a silicone resin, in which white particles, such as titanium oxide, are contained and is a frame-like member that is arranged along the outer edge of the substrate 50. The frame material 54 may be formed by a resin whose rigidity is high and whose reflectance is high, such as a polyimide resin and alumina.

The white resin 55 is formed by, like the white resin 12, a synthetic resin material, such as a silicone resin, in which white particles, such as titanium oxide, are contained and whose outer edge contacts with the outer edge of the substrate 50 and which is arranged so as to surround the first light emitting element 51, the second light emitting element 52, and the third light emitting element 53, and which seals part of the bonding wire 59.

The first transparent resin 56 is formed by the same synthetic resin material as the synthetic resin material forming the white resin 55 containing a small amount of titanium oxide and is arranged between the first light emitting element 51 to the third light emitting element 53 and the white resin 55. The first transparent resin 56 contacts with two sides in close proximity to the outer edge of the substrate 50 of the first light emitting element 51 and the second light emitting element 52 and is arranged so as to cover the side surfaces in close proximity to the outer edges of the substrate 50 of the first light emitting element 51 and the second light emitting element 52. The first transparent resin 56 contacts with one side in close proximity to the outer edge of the substrate 50 of the third light emitting element 53 and is arranged so as to cover the side surface in close proximity to the outer edge of the substrate 50 of the third light emitting element 53.

The second transparent resin 57 is formed by, like the second transparent resin 14, a transparent synthetic resin material, such as a silicone resin, and is arranged in an area surrounded by the frame material 54 and seals part of the first light emitting element 51 to the third light emitting element 53 and the bonding wire 59. While the first transparent resin 56 contains a small amount of titanium oxide, the content of titanium oxide of the second transparent resin 57 is further smaller or zero, and therefore the light transmittance of the second transparent resin 57 is higher than the light transmittance of the first transparent resin 56.

While the heat resistance and light resistance of the synthetic resin material forming the second transparent resin 57 are higher than those of the synthetic resin material forming the white resin 55 and the first transparent resin 56, the adhesiveness to the substrate 50 and refractive index thereof are lower than those of the synthetic resin material forming the white resin 55 and the first transparent resin 56.

Figure 11:
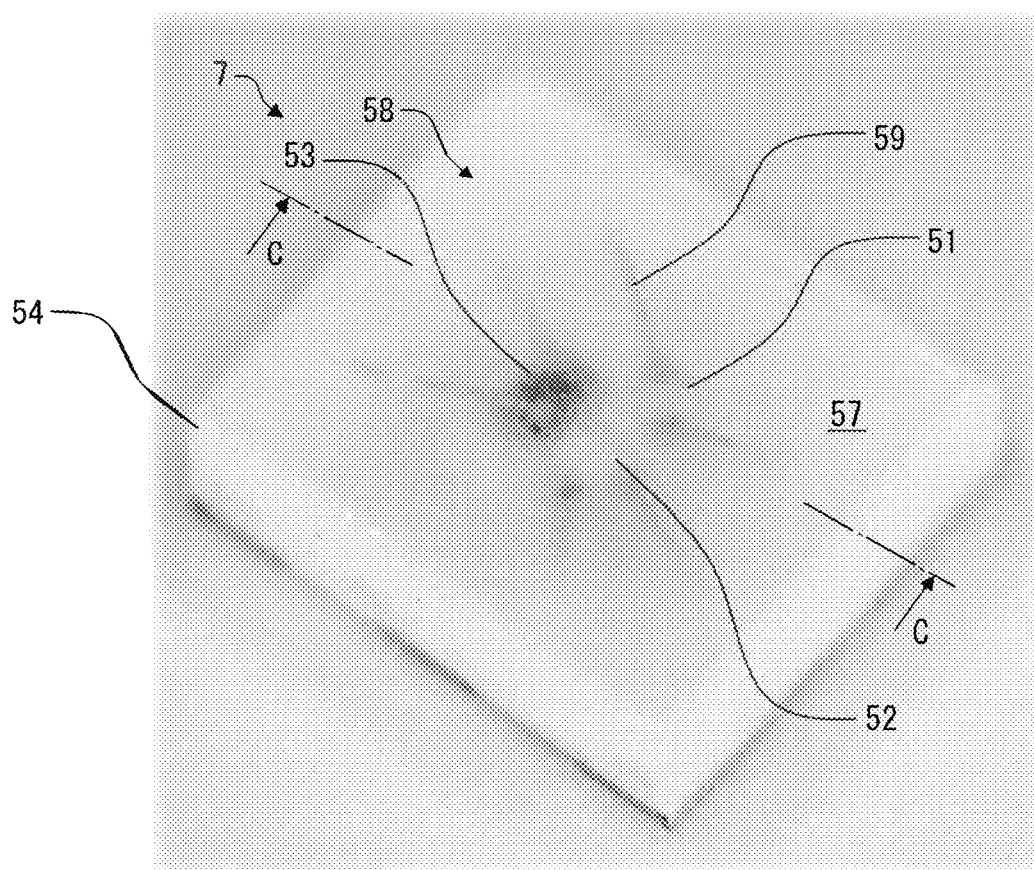
FIG. 11 is a photo showing a prototype of the light emitting device according to the sixth modification.
Figure 12A:
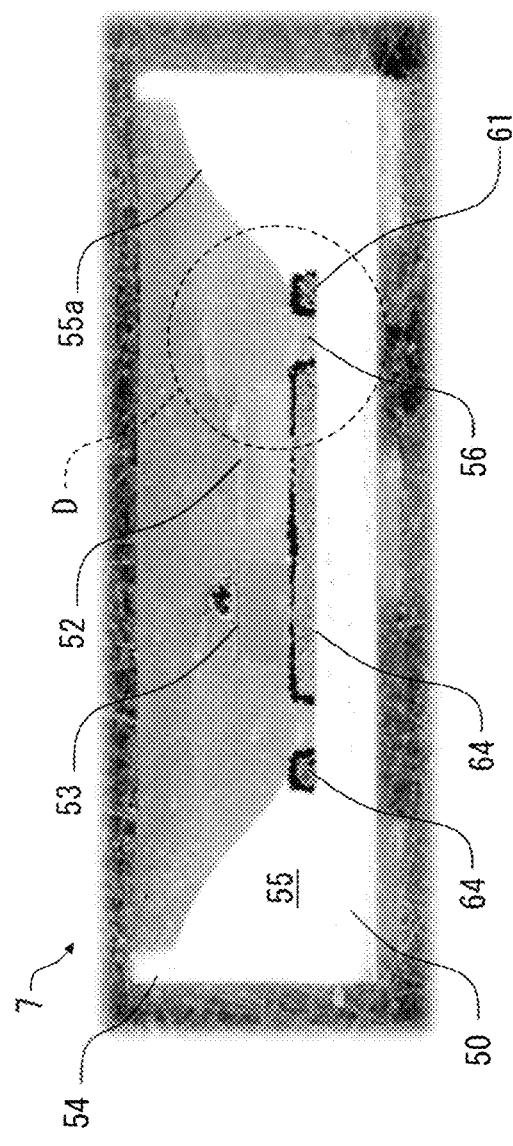
FIG. 12A is a cross-sectional photo along a C-C line shown in FIG. 11.
Figure 12B:
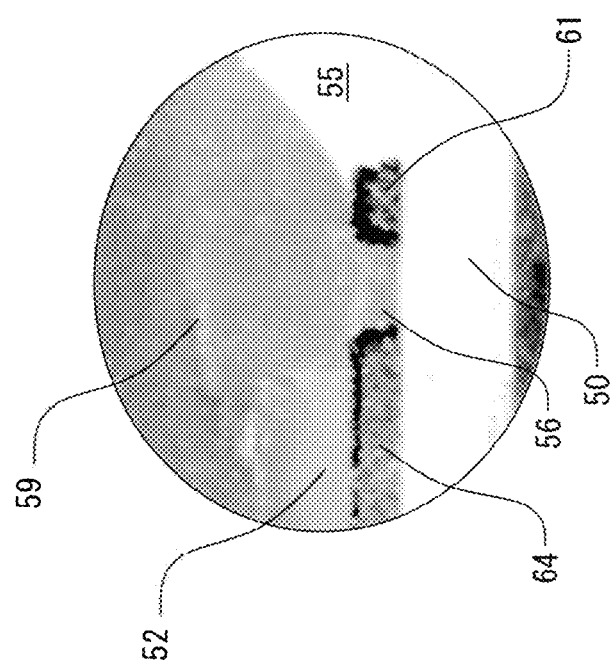
FIG. 12B is an enlarged photo of the area surrounded by a broken line D shown in FIG. 12A.

FIG. 11 is a photo showing a prototype of the light emitting device 7, FIG. 12A is a cross-sectional photo along a C-C line shown in FIG. 11, and FIG. 12B is an enlarged photo of the area surrounded by a broken line D shown in FIG. 12A.

The white resin 55 has a reflection surface 55a, which is an inclined surface, whose height increases as becoming more distant from the first light emitting element 51 to the third light emitting element 53 toward the frame material 54 arranged at the outer edge of the substrate 10. The white resin 55 is locked by the first anode wire 61 and the second cathode wire 64. The first transparent resin 56 extends from the end portion of the white resin 55 locked by the first anode wire 61 up to the side surface of the second light emitting element 52 and is arranged so as to contact with the side surface of the second light emitting element 52. Further, the first transparent resin 56 extends from the end portion of the white resin 55 locked by the second cathode wire 61 up to the side surface of the third light emitting element 53 and is arranged so as to contact with the side surface of the third light emitting element 53.

Figure 13:
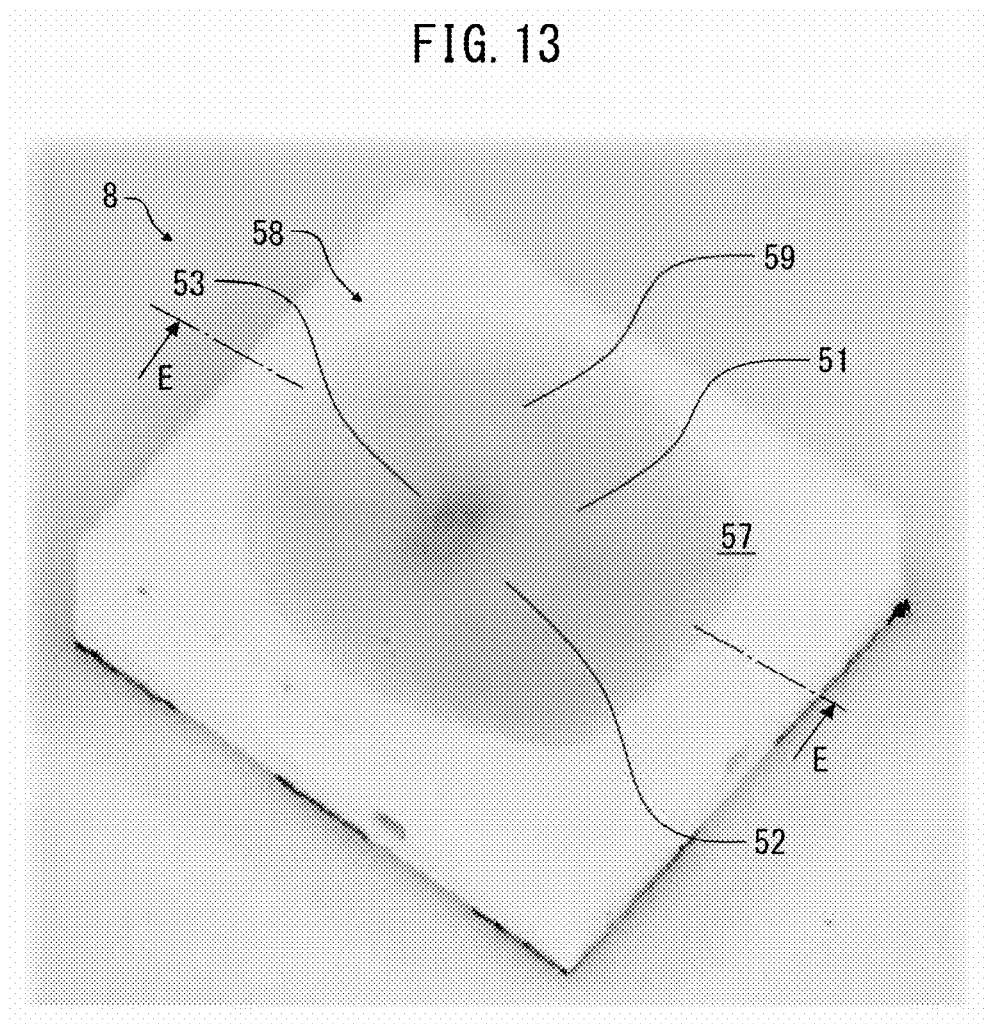
FIG. 13 is a photo showing a prototype of a light emitting device according to a seventh modification.
Figure 14A:
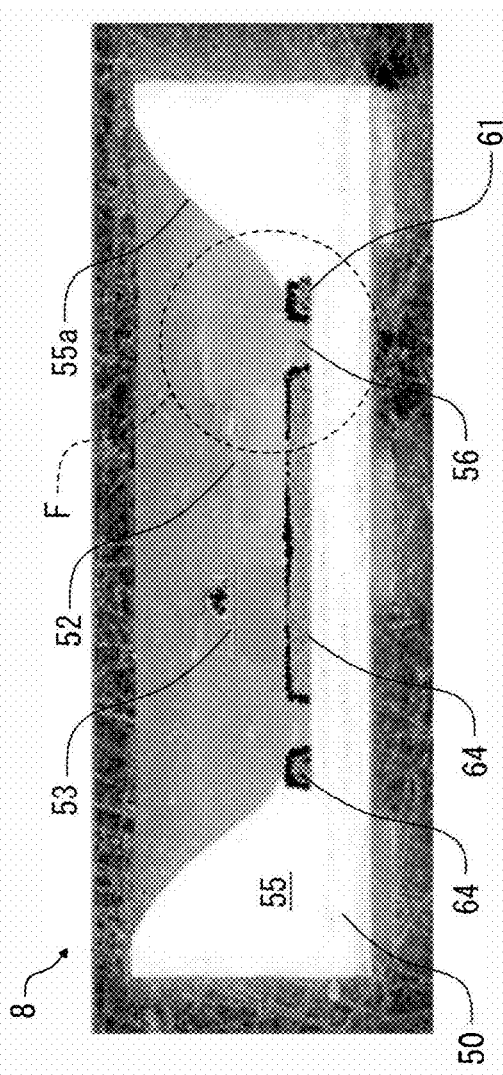
FIG. 14A is a cross-sectional photo along an E-E line shown in FIG. 13.
Figure 14B:
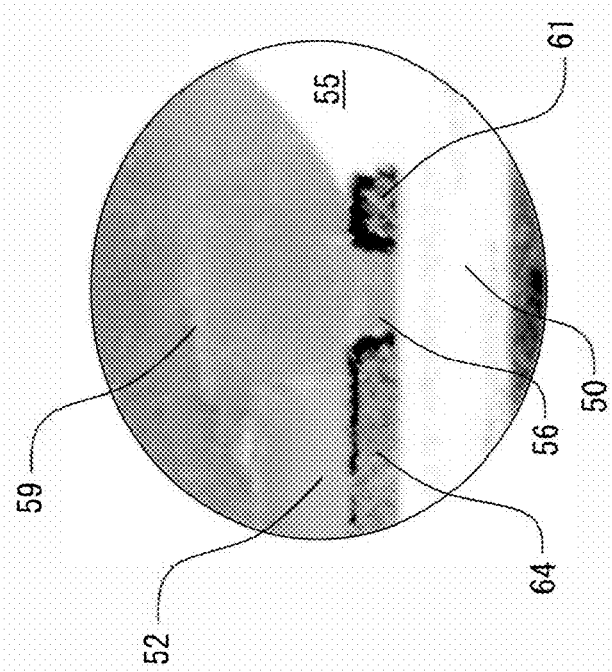
FIG. 14B is an enlarged photo of an area surrounded by a broken line F shown in FIG. 14A.

FIG. 13 is a photo showing a prototype of a light emitting device according to a seventh modification, FIG. 14A is a cross-sectional photo along an E-E line shown in FIG. 13, and FIG. 14B is an enlarged photo of an area surrounded by a broken line F shown in FIG. 14A.

A light emitting device 8 differs from the light emitting device 7 in not having the frame material 54 and in having a different cross-sectional shape of the white resin 55. The configuration and function of the light emitting device 8 other than not having the frame material 54 and having the different cross-section shape of the white resin 55 are the same as the configuration and function of the light emitting device 7, and therefore detailed explanation is omitted here.

In the light emitting device 8, the apex of the white resin 55 is formed so as to be flat.

Further, in the light emitting devices 1 to 8, the first transparent resin that is arranged between the light emitting element and the white resin is arranged so as to contact with the side surface of the light emitting element, but in the light emitting device according to the embodiment, the first transparent resin may be arranged in close proximate to the side surface without coming into contact therewith.

Further, in the light emitting devices 1 to 8, the first transparent resin is formed by the same synthetic resin material as the synthetic resin material forming the white resin, but in the light emitting device according to the embodiment, the first transparent resin may be formed by a synthetic resin material different from the synthetic resin material forming the white resin. When the first transparent resin is formed by a synthetic resin material different from the synthetic resin material forming the white resin, the first transparent resin is formed by dropping the synthetic resin before curing the first transparent resin between the white resin and the light emitting element after the white resin is formed.

Further, in the light emitting devices 1 to 8, the first transparent resin is arranged so as to contact with two sides or four sides of the light emitting element that is formed on the sapphire substrate, but in the light emitting device according to the embodiment, the first transparent resin may be arranged so as to contact with at least one side of the light emitting element that is formed on the sapphire substrate. Further, in the light emitting device according to the embodiment, the first transparent resin may contact with at least one side of the light emitting element formed on a transparent substrate other than the sapphire substrate.

Further, in the light emitting devices 7 and 8, the first transparent resin is arranged so as to contact with one side of the third light emitting element 53 that is formed on the silicon substrate, but in the light emitting device according to the embodiment, the first transparent resin may contact with one side of the light emitting element formed on an opaque substrate other than the silicon substrate.

Further, in the light emitting devices 7 and 8, the white resin 55 is locked by the first anode wire 61 and the second cathode wire 64, but in the light emitting device according to the embodiment, the white resin may be locked by a wire not connected to the light emitting element, which is also referred to as a dummy wire, or may be locked by an installed object having a difference in level, such as a resist.

Further, the planar shape of the light emitting device according to the embodiment and the arrangement relationship between the light emitting element, the white resin, and the first transparent resin are not limited to the aspects shown in the light emitting devices 1 to 8.

Figure 15D:
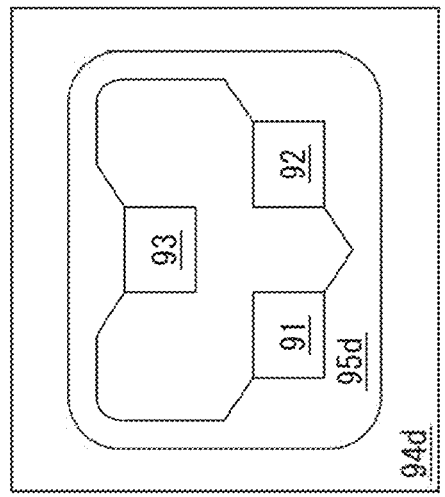
FIGS. 15A to 15E are each a diagram showing the planar shape of the light emitting device according to the embodiment and the arrangement relationship between the light emitting element, the white resin, and the first transparent resin.
Figure 15E:
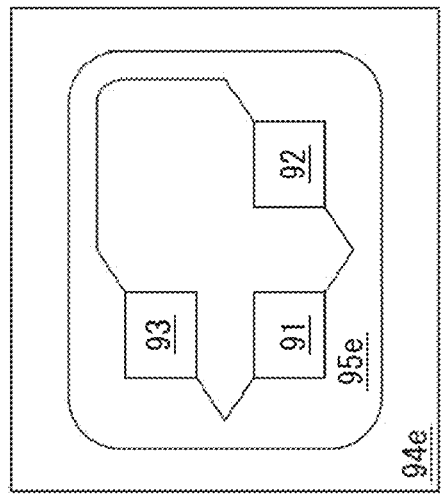
Figure 15A:
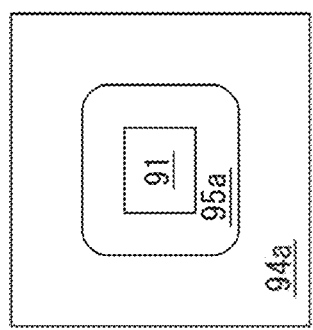
Figure 15B:
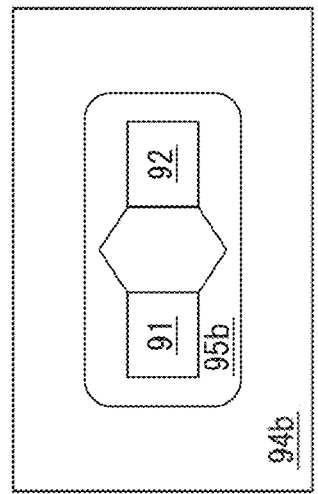
Figure 15C:
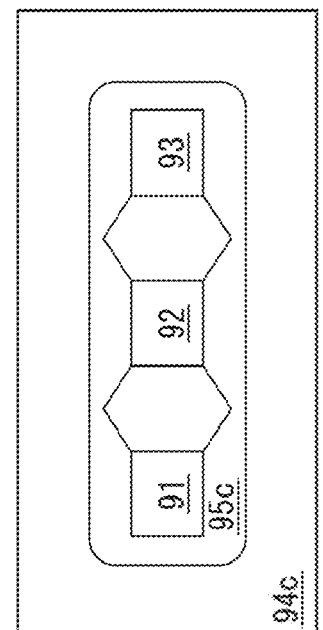

FIGS. 15A to 15E are each a diagram showing the planar shape of the light emitting device according to the embodiment and the arrangement relationship between the light emitting element, the white resin, and the first transparent resin. FIG. 15A shows a first aspect, FIG. 15B shows a second aspect, FIG. 15C shows a third aspect, FIG. 15D shows a fourth aspect, and FIG. 15E shows a fifth aspect.

A light emitting device 9a according to the first aspect has a rectangular planar shape and has a first light emitting element 91, a white resin 94a, and a first transparent resin 95a. The first light emitting element 91 has a rectangular planar shape and is arranged at the center of the substrate. The white resin 94a has a rectangular frame-like planar shape that is arranged along the outer edge of the substrate. The first transparent resin 95a extends from the inner wall of the white resin 94a so as to contact with four sides of the first light emitting element 91.

A light emitting device 9b according to the second aspect has a rectangular planar shape and has the first light emitting element 91, a second light emitting element 92, a white resin 94b, and a first transparent resin 95b. The first light emitting element 91 and the second light emitting element 92 each have a rectangular planar shape. The white resin 94b has a rectangular frame-like planar shape that is arranged along the outer edge of the substrate. The first transparent resin 95b extends from the inner wall of the white resin 94b so as to contact with three sides except for the side facing the second light emitting element 92 of the first light emitting element 91 and three sides except for the side facing the first light emitting element 91 of the second light emitting element 92.

A light emitting device 9c according to the third aspect has a rectangular planar shape and has the first light emitting element 91, the second light emitting element 92, a third light emitting element 93, a white resin 94c, and a first transparent resin 95c. The first light emitting element 91, the second light emitting element 92, and the third light emitting element 93 each have a rectangular planar shape and are arrayed on one straight line. The white resin 94c has a rectangular frame-like planar shape that is arranged along the outer edge of the substrate. The first transparent resin 95c extends from the inner wall of the white resin 94c so as to contact with three sides except for the side facing the second light emitting element 92 of the first light emitting element 91 and three sides except for the side facing the second light emitting element of the third light emitting element 93.

Further, the first transparent resin 95c extends from the inner wall of the white resin 94c so as to contact with two sides of the second light emitting element 92 except for two sides facing the first light emitting element 91 and the third light emitting element 93.

A light emitting device 9d according to the fourth aspect has a rectangular planar shape and has the first light emitting element 91, the second light emitting element 92, the third light emitting element 93, a white resin 94d, and a first transparent resin 95d. The first light emitting element 91, the second light emitting element 92, and the third light emitting element 93 each have a rectangular planar shape. The first light emitting element 91 and the second light emitting element 92 are arrayed along one side of the substrate. The third light emitting element 93 is arranged at the center of the side facing the side along which the first light emitting element 91 and the second light emitting element 92 are arrayed. The white resin 94d has a rectangular planar shape. The first transparent resin 95d extends from the inner wall of the white resin 94d so as to contact with two sides in close proximity to the outer edge of the substrate of the first light emitting element 91 and two sides in close proximity to the outer edge of the substrate of the second light emitting element 92. Further, the first transparent resin 95d extends from the inner wall of the white resin 94d so as to contact with one side in close proximity to the outer edge of the substrate of the third light emitting element 93.

A light emitting device 9e according to the fifth aspect has a rectangular planar shape and has the first light emitting element 91, the second light emitting element 92, the third light emitting element 93, a white resin 94e, and a transparent resin 95e. The first light emitting element 91, the second light emitting element 92, and the third light emitting element 93 each have a rectangular planar shape. The first light emitting element 91 and the second light emitting element 92 are arrayed along one side of the substrate. The third light emitting element 93 is arranged in close proximity to one end of the side facing the side along which the first light emitting element 91 and the second light emitting element 92 are arrayed. The white resin 94e has a rectangular frame-like planar shape. The first transparent resin 95e extends from the inner wall of the white resin 94e so as to contact with two sides in close proximity to the outer edge of the substrate of the first light emitting element 91, two side in close proximity to the outer edge of the substrate the second light emitting element 92, and two side in close proximity to the outer edge of the substrate of the third light emitting element 93.

Figure 16A:
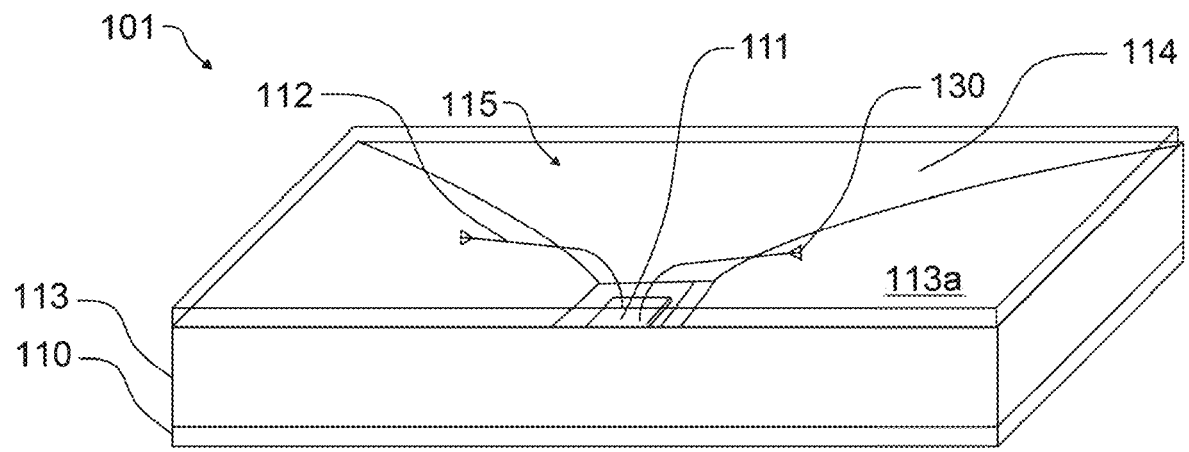
FIG. 16A is a perspective diagram of a light emitting device according to a second embodiment.
Figure 16B:
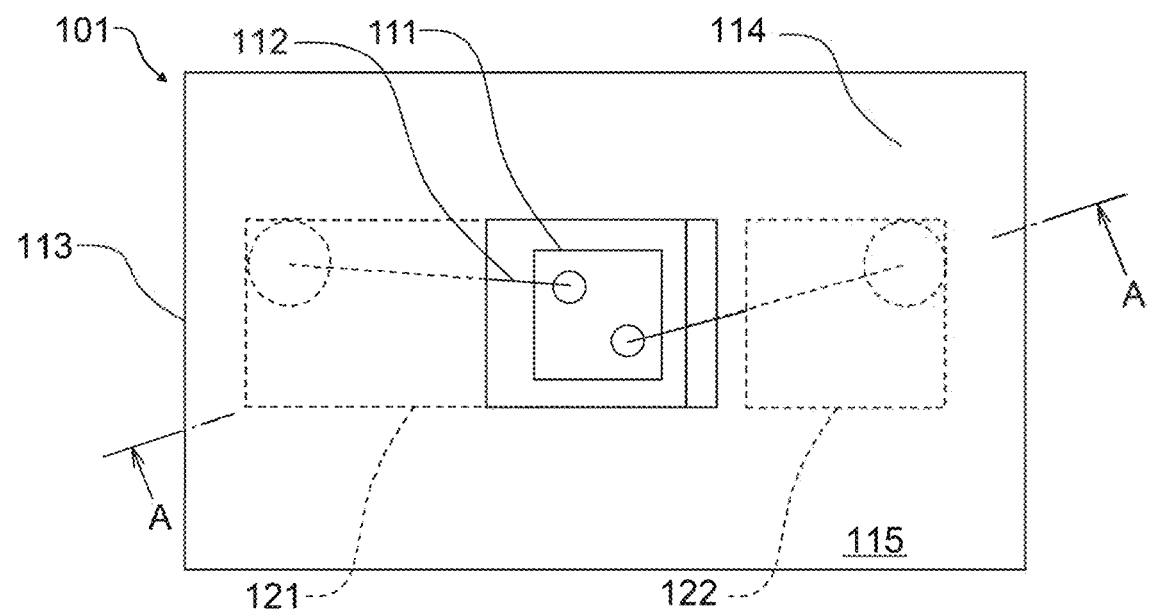
FIG. 16B is a plan diagram of the light emitting device shown in FIG. 16A.
Figure 17:
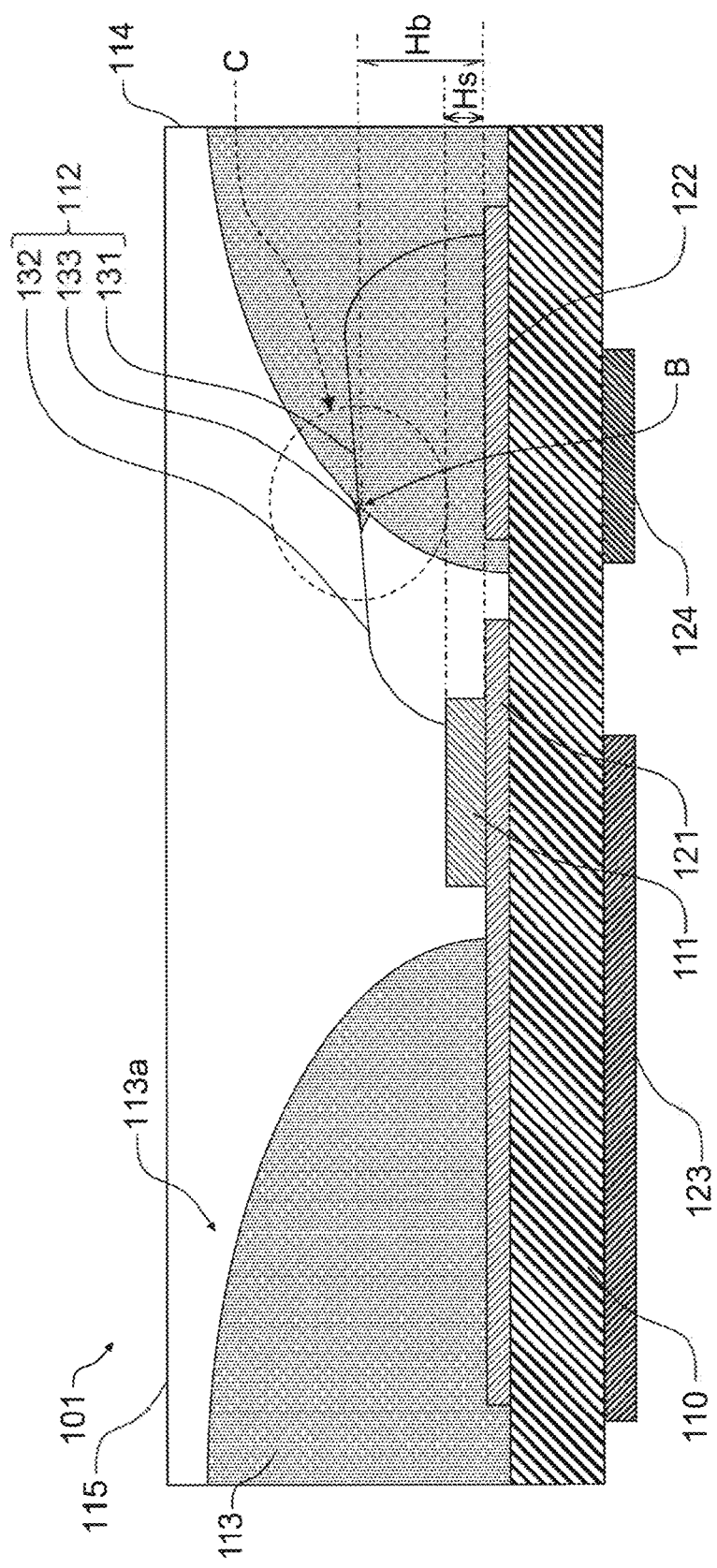
FIG. 17 is a cross-sectional diagram along an A-A line shown in FIG. 16B.
Figure 18:
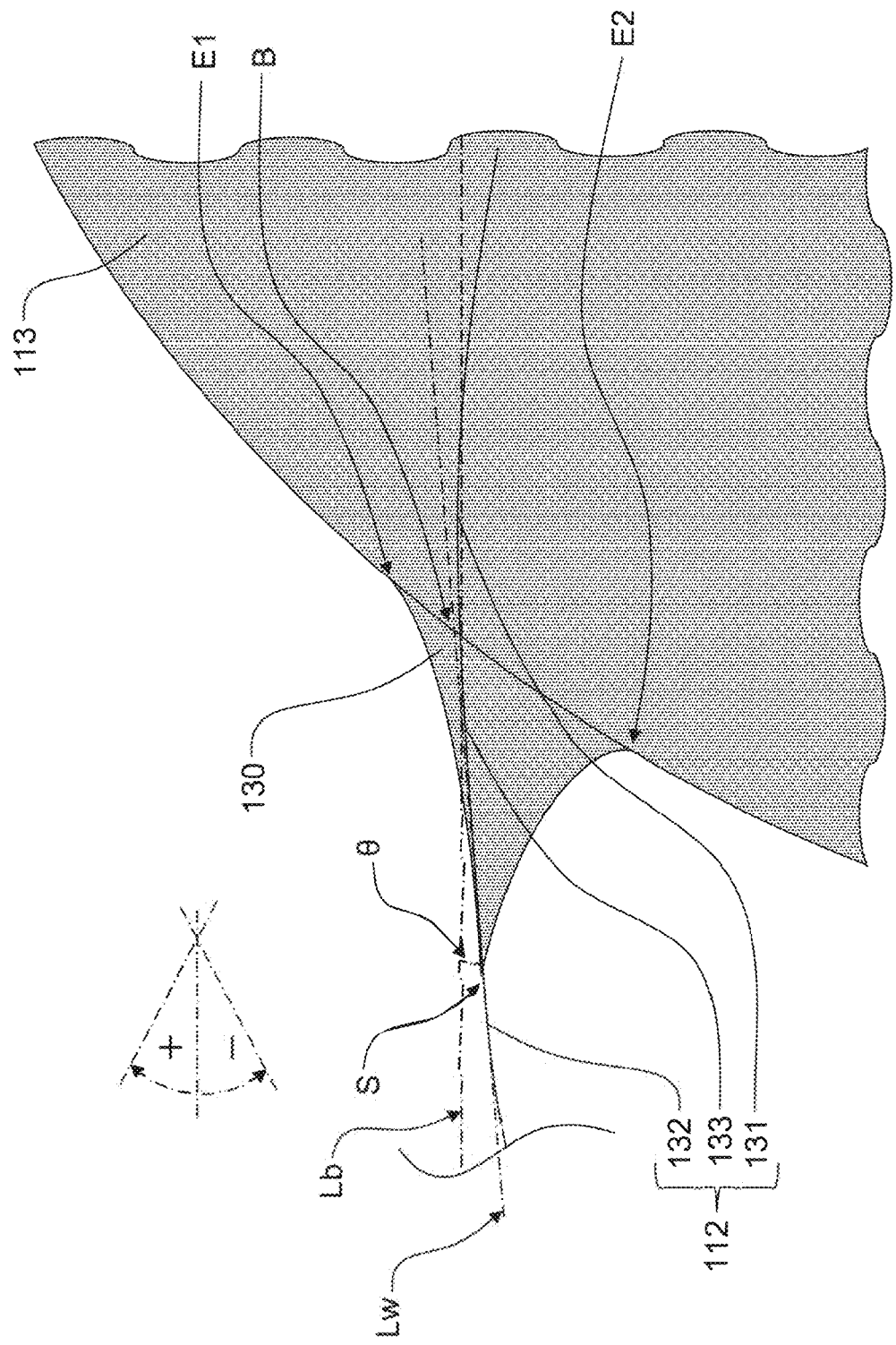
FIG. 18 is an enlarged cross-sectional diagram obtained by enlarging a portion indicated by an arrow C in FIG. 17.

Configuration and Function of Light Emitting Device According to Second Embodiment FIG. 16A is a perspective diagram of a light emitting device according to a second embodiment, FIG. 16B is a plan diagram of the light emitting device shown in FIG. 16A, and FIG. 17 is a cross-sectional diagram along an A-A line shown in FIG. 16B. FIG. 18 is an enlarged cross-sectional diagram obtained by enlarging a portion indicated by an arrow C in FIG. 17.

A light emitting device 101 has a substrate 110, a light emitting element 111, a pair of bonding wires 112, a white resin 113, and a seal resin 114 and power is supplied to the light emitting element 111 from an external power source and the light emitting device 101 emits light emitted from the light emitting element 111 from an emission surface 115.

The substrate 110 is a printed circuit board having a rectangular plane shape formed by an insulating resin, such as a glass epoxy resin. The length of one side of the substrate 110 is, for example, 3 mm or less. On the surface of the substrate 110, an anode wire 121 and a cathode wire 122 are arranged and on the backside of the substrate 110, an anode electrode 123 and a cathode electrode 124 are arranged. The anode wire 121 and the cathode wire 122 are each a wire pattern formed by an electrically conductive member, such as copper. The anode electrode 123 and the cathode electrode 124 each have a rectangular planar shape and is formed by an electrically conductive member, such as copper. The anode wire 121 and the anode electrode 123, and the cathode wire 122 and the cathode electrode 124 are connected via a through electrode, not shown schematically, arranged in a through hole also called a via.

The light emitting element 111 is a blue LED die that is mounted on the substrate 110, which emits blue light in accordance with a forward voltage being applied between the anode electrode 123 and the cathode electrode 124, and which has a rectangular planar shape. The main wavelength of the blue light that is emitted from the light emitting element 111 is within a range between 445 nm and 495 nm and in one embodiment, 450 nm. The light emitting element 111 is formed by laminating a PN joint layer formed by a gallium nitride layer on a sapphire substrate, which is a transparent substrate.

The pair of bonding wires 112 are each a linear member formed by an electrically conductive member, such as gold, and each electrically connect the light emitting element 111 and the anode wire 121, and the light emitting element 111 and the cathode wire 122, respectively. The connection portions of the pair of bonding wires 112 and the anode wire 121 and the cathode wire 122 are covered by the white resin 113. Further, the connection portions of the pair of bonding wires 112 and the light emitting element 111 are covered by the seal resin 114.

Each of the pair of bonding wires 112 protrudes from the white resin 113 toward the seal resin 114 at a boundary point B indicated by an arrow B in FIG. 17. A height Hb of the boundary point B from the backside of the light emitting element 111 is greater than a height Hs of the surface of the light emitting element 111 to which each of the pair of bonding wires 112 is connected from the backside of the light emitting element 111. By making the height Hb of the boundary point B from the backside of the light emitting element 111 greater than the height Hs of the surface of the light emitting element 111 from the backside of the light emitting element 111, the extending direction of the pair of bonding wires 112 at the boundary point B may be close to the horizontal direction.

The white resin 113 is also referred to as a dam resin and is formed containing white particles, such as titanium oxide, in a transparent resin, such as a silicone resin, and arranged so as to cover part of the anode wire 121 and the cathode wire 122. The hardness of the white resin 113 is lower than the hardness of the seal resin 114. The white resin 113 is arranged so that the outer edge of the white resin 113 contacts with the outer edge of the substrate 110 and the white resin 113 surrounds the light emitting element 111, and seals part of the bonding wires 112. The white resin 113 has a reflection surface 113a, which is an inclined surface, whose height becomes greater as becoming more distant from the light emitting element 111 toward the outer edge of the substrate 110. Part of light emitted from the light emitting element 111 is reflected from the reflection surface 113a and emitted from the emission surface 115.

The seal resin 114 is formed by a transparent resin, such as a silicone resin, contains phosphors and fillers, is arranged in an area surrounded by the white resin 113, and seals part of the light emitting element 111 and the bonding wires 112. The hardness of the seal resin 114 is higher than the hardness of the white resin 113.

The phosphor contained in the seal resin 114 converts the blue light emitted from the light emitting element 111 and emits yellow light whose wavelength is different from the wavelength of the blue light emitted from the light emitting element 111. The phosphor contained in the seal resin 114 is, for example, yttrium aluminum garnet. The main wavelength of the yellow light that is radiated from the phosphor contained in the seal resin 114 is within a range between 525 nm and 575 nm and in one example, 550 nm.

The filler contained in the seal resin 114 is a diffusion material that diffuses light emitted from the light emitting element 111 and is for example, silicon dioxide. The fillers are arranged so as to be distributed substantially uniformly in the seal resin 114.

The bonding wires 112 have a first portion 131, a second portion 132, and a third portion 133. The first portion 131 is the portion that is buried in the white resin 113 including one end of the bonding wires 112 connected to the anode wire 121 and the cathode wire 122, respectively, and its entirety is covered by the white resin 113. The second portion 132 is the portion that is buried in the seal resin 114 including the other end of the bonding wires 112 connected to the anode and the cathode of the light emitting element 111, respectively, and its entirety is covered by the seal resin 114.

The third portion 133 is arranged between the first portion 131 and the second portion 132 and is the portion that is covered by a conic solid-like conic solid resin 130 extending from the white resin 113 along the extending direction of the bonding wires 112. The third portion 133 is another example of the protruding portion extending and protruding from at least one side toward the opposite side. The conic solid resin 130 is a member that has a shape forming substantially a cone shape or part of the substantially cone shape having the surface of the white resin 113 as its base and is formed by the white resin 113 extending along the extending direction of the bonding wires 112.

The boundary point B at which each of the pair of bonding wires 112 protrudes from the white resin 113 toward the seal resin 114 is the intersection point at which each of the pair of bonding wires 112 and the surface of the white resin 113 intersect. The contour of the surface of the white resin 113 on which the conic solid resin 130 is formed is estimated from the contour of the white resin 113 on which the conic solid resin 130 is not formed. For example, when the conic solid resin 130 contains the white resin 113, the curvature of the contour of the surface of the white resin 113 on which the conic solid resin 130 is formed is estimated so as to be continuous with the curvature of the contour of the white resin 113, which sandwiches the conic solid resin 130 in between and on which the conic solid resin 130 is not formed.

In the cross section of the light emitting device 101, it is preferable for the bonding wires 112 in the third portion 133 to have a portion whose angle $\theta$ with the extending direction of the surface of the substrate 110, which is indicated by a straight line Lb in FIG. 18, being taken as a reference, which is an angle formed by the extending direction of the bonding wires 112 in the third portion 133 from the first portion 131 toward the second portion 132 and the extending direction of the surface of the substrate 110, is larger than or equal to $-45°$ and less than or equal to $+45°$. It is further preferable for the angle $\theta$ to be less than or equal to $0°$. The angle formed by the extending direction of the bonding wires 112 from the first portion 131 toward the second portion 132 and the extending direction of the surface of the substrate 110 is taken to be positive in the direction of becoming more distant from the substrate with respect to the straight line Lb and to be negative in the direction of becoming closer to the substrate with respect to the straight line Lb.

It is preferable for the height Hb of the boundary point B from the backside of the light emitting element 111 to be greater than or equal to the height Hs of the surface of the light emitting element 111 from the backside of the light emitting element 111. Further, it is further preferable for the height Hb of the boundary point B from the backside of the light emitting element 111 to be 1.3 times or more the height Hz of the surface of the light emitting element 111 from the backside of the light emitting element 111.

The smaller the angle θ, the more easily the conic solid resin 30 is formed.

The extending direction of the bonding wires 112 in the third portion 133 is the extending direction of a tangent line Lw of the bonding wires 112 between the boundary point B and a vertex S of the conic solid resin 130 in the cross section of the light emitting device 101, which is observed by the SEM. etc. On the other hand, the extending direction of the surface of the substrate 110 is the extending direction of the straight line Lb parallel to the surface of the substrate 110 in the cross section of the light emitting device 101.

Further, it is preferable for a diameter Ld of the base of the conic solid resin 130 to be 1.1 times or more and 20 times or less a diameter Wd of the cross section of the bonding wires 112 and further preferable to be less five times or less the diameter Wd.

The diameter Ld of the base of the conic solid resin 130 is the length of a straight line connecting one end E1 of the base of the conic solid resin 130 and another end E2 of the base of the conic solid resin 130 in the cross section of the light emitting device 101. Each of the ends E1 and E2 of the base of the conic solid resin 130 in the cross section of the light emitting device 101 is the point at which the conic solid resin 130 rises from the contour of the white resin 113 in the cross section of the light emitting device 101.

When the diameter Ld of the base of the conic solid resin 130 is less than 1.1 times the diameter Wd of the cross section of the bonding wires 112, it is no longer easy to observe the conic solid resin 130 by the SEM, etc. The greater the diameter Ld of the base of the conic solid resin 130, the more unlikely the stress generated by the difference in the coefficient of thermal expansion between the white resin 113 and the seal resin 141 is applied to the bonding wires 112. However, if the diameter of the resin material before hardening of the white resin 113 sticking to the bonding wires 112 is increased to 20 times or more Wd, the white resin 113 becomes likely to come off the bonding wires 112, and therefore it is no longer easy to form the conic solid resin 130. Further, if the diameter is increased to five time or more Wd, the surface shape of the white resin 113 changes considerably and this forms a factor to reduce the optical properties.

Further, it is preferable for the length of a straight line between the boundary point B and the vertex S of the conic solid resin 130, i.e., a length L3 of the third portion 133 to be 0.1 times or more and 10 times or less the diameter Ld of the base of the conic solid resin 130, and it is further preferable for the length L3 to be twice or less the diameter Ld.

When the length L3 of the third portion 133 is 0.1 times or less the diameter Ld of the base of the conic solid resin 130, it is no longer easy to observe the conic solid resin 130 by the SEM or the like. The longer the length L3 of the third portion 133, more unlikely the stress that is generated by the difference in the coefficient of thermal expansion between the white resin 113 and the seal resin 114 is applied to the bonding wires 112. However, if the length of the resin material before hardening of the white resin 113 sticking to the bonding wires 112 is increased to ten times or more Ld, the bonding wires 112 become more likely to come off the bonding wires 112, and therefore it is no longer easy to form the conic solid resin 130 and the white resin 113 flows into the light emitting element 111 from the bonding wires 112 and covers the light emission surface, and therefore this forms a factor to reduce the optical properties. Further, if L3 is increased to twice or more Ld, the surface shape of the white resin 113 changes considerably, and therefore this forms a factor to reduce the optical properties.

Manufacturing Method of Light Emitting Device According to Second Embodiment

Figure 19A:
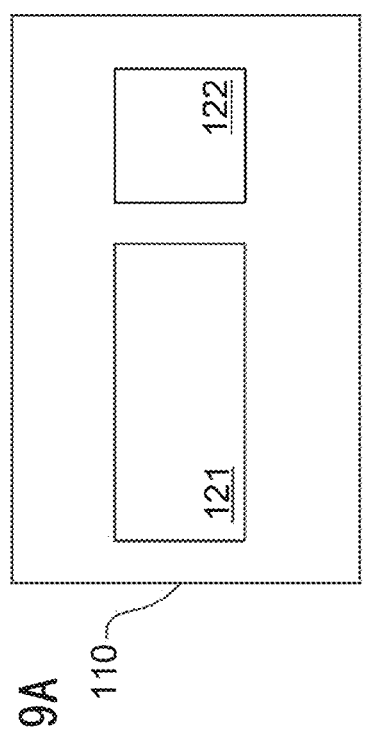
FIGS. 19A to 19E are each a diagram showing a manufacturing method of the light emitting device 101 and FIG. 19A shows a first process.
Figure 19B:
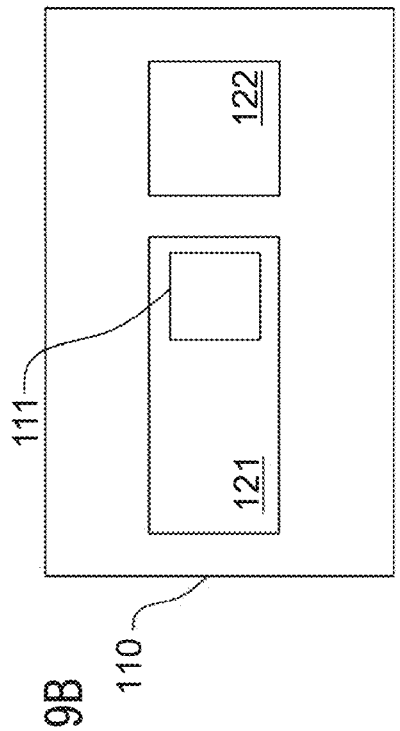
Figure 19C:
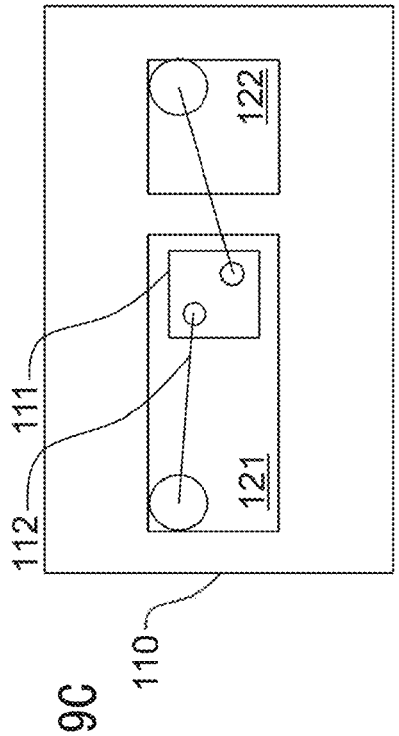
Figure 19D:
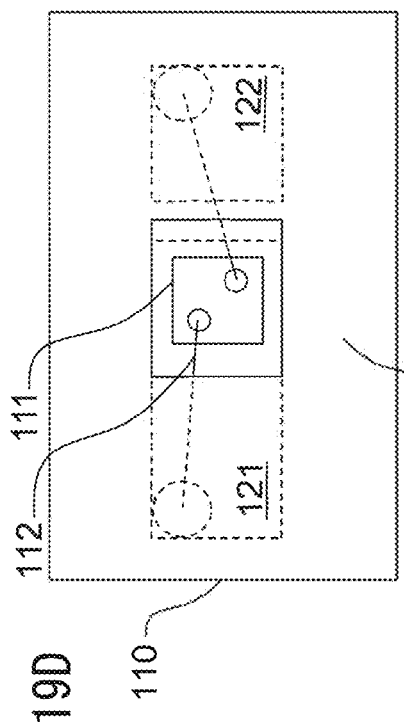
Figure 19E:
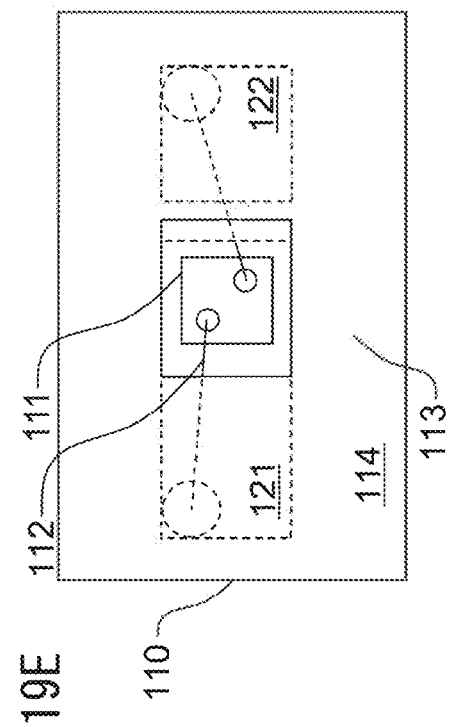

FIGS. 19A to 19E are each a diagram showing a manufacturing method of the light emitting device 101 and FIG. 19A shows a first process, FIG. 19B shows a second process, FIG. 19C shows a third process, FIG. 19D shows a fourth process, and FIG. 19E shows a fifth process. In FIG. 19A to FIG. 19E, only the single light emitting device 101 is shown, but the light emitting device 101 is manufactured by using a collective substrate coupling a plurality of the substrates 110.

First, in the first process, the collective substrate coupling a plurality of the substrates 110 on the surface of which the anode wire 121 and the cathode wire 122 are formed is prepared. Next, in the second process, the light emitting element 111 is joined onto the anode wire 121 of each of the plurality of the substrates 110 by a die bond material.

Next, in the third process, the anode of each of a plurality of the light emitting elements 111 joined onto the anode wire 121 in the second process and the anode wire 121 are connected by the bonding wires 112 in wire bonding processing. Further, the cathode of each of the plurality of the light emitting elements 111 and the cathode wire 122 are connected by the bonding wires 112 in wire bonding processing.

Next, in the fourth process, the white resin 113 is arranged on the surface of each of the plurality of the substrates 110. The resin material before curing the white resin 113 is arranged so as to have a predetermined separation distance to the light emitting element 111. After the resin material before curing the white resin 113 is arranged, by heating the substrate 110, the white resin 113 is formed. When the white resin 113 is formed, the first portion 131 that is buried in the white resin 113 and the third portion 133 that is covered by the conic solid resin 130 are formed on the periphery of the bonding wires 112.

Next, in the fifth process, the seal resin 114 is arranged on the surface of each of the plurality of the substrates 110. The resin material before curing the seal resin 114 is arranged so as to cover the light emitting element 111, the bonding wires 112, and the white resin 113. After the resin material before curing the seal resin 114 is arranged, the seal resin 114 is formed, by heating the substrate 110. When the seal resin 114 is formed, the second portion 132 that is buried in the seal resin 114 is formed on the periphery of the bonding wires 112.

Then, in the sixth process, the plurality of the substrates 110 is separated into each individual substrate 110 and the light emitting device 101 is manufactured by cutting the collective substrate coupling the plurality of the substrates 110.

Function Effect of Light Emitting Device According to Second Embodiment

In the light emitting device 101, the bonding wires 112 are arranged between the first portion 131 and the second portion 132 and have the third portion 133 that is covered b the conic solid-like conic solid resin 130 extending along the extending direction of the bonding wires 112 from the white resin 113. In the light emitting device 101, by the bonding wires 112 having the third portion 133 that is covered by the conic solid-like conic solid resin 130, the stress is reduced that is generated by the difference in the coefficient of thermal expansion between the white resin and the seal resin and applied to the bonding wires 112 in the vicinity of the interface between the white resin 113 and the seal resin 114. In the light emitting device 101, the stress is reduced that is generated by the difference in the coefficient of thermal expansion between the white resin and the seal resin and applied to the bonding wires 112 in the vicinity of the interface between the white resin 113 and the seal resin 114, and therefore the bonding wires 112 may not deteriorate over time and a connection failure occurs.

Further, in the light emitting device 101, by making the height Hb of the boundary point B greater than the height Hs of the surface of the light emitting element 111, the extending direction of the pair of bonding wires 112 at the boundary point B becomes close to the horizontal direction, and therefore it is made further easier to form the conic solid resin 130.

Figure 20:
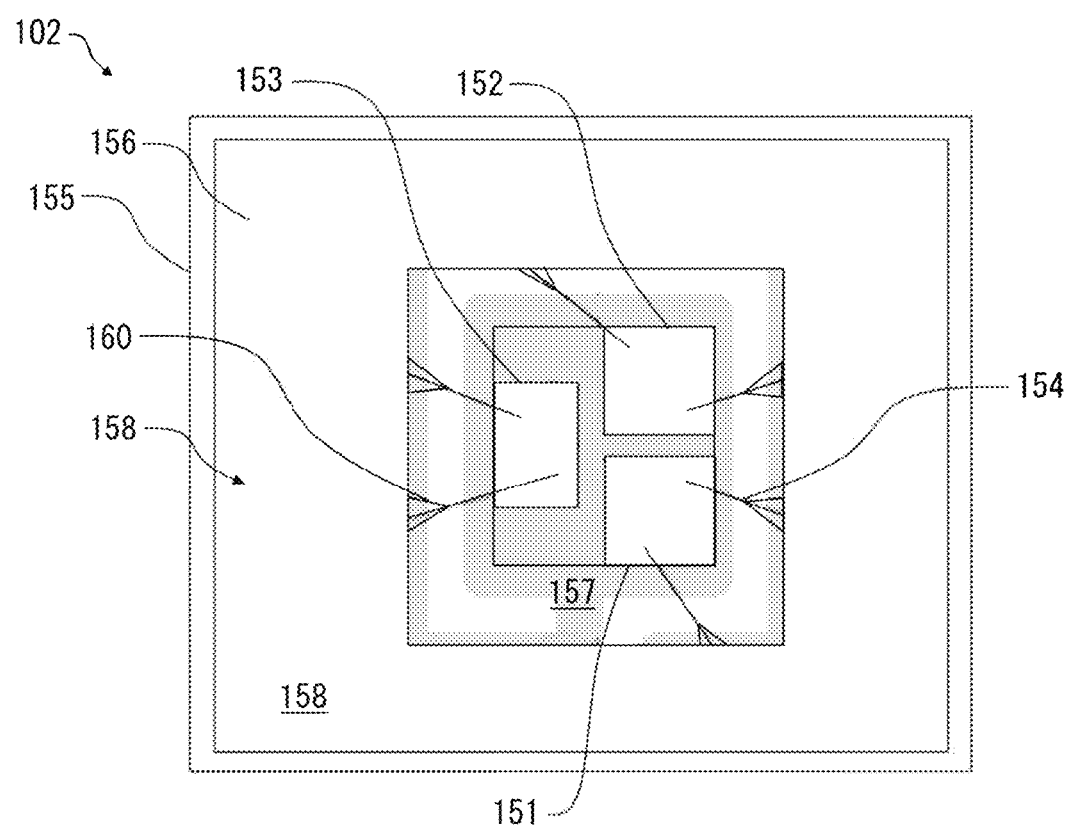
FIG. 20 is a plan diagram of a light emitting device according to a third embodiment.
Figure 21:
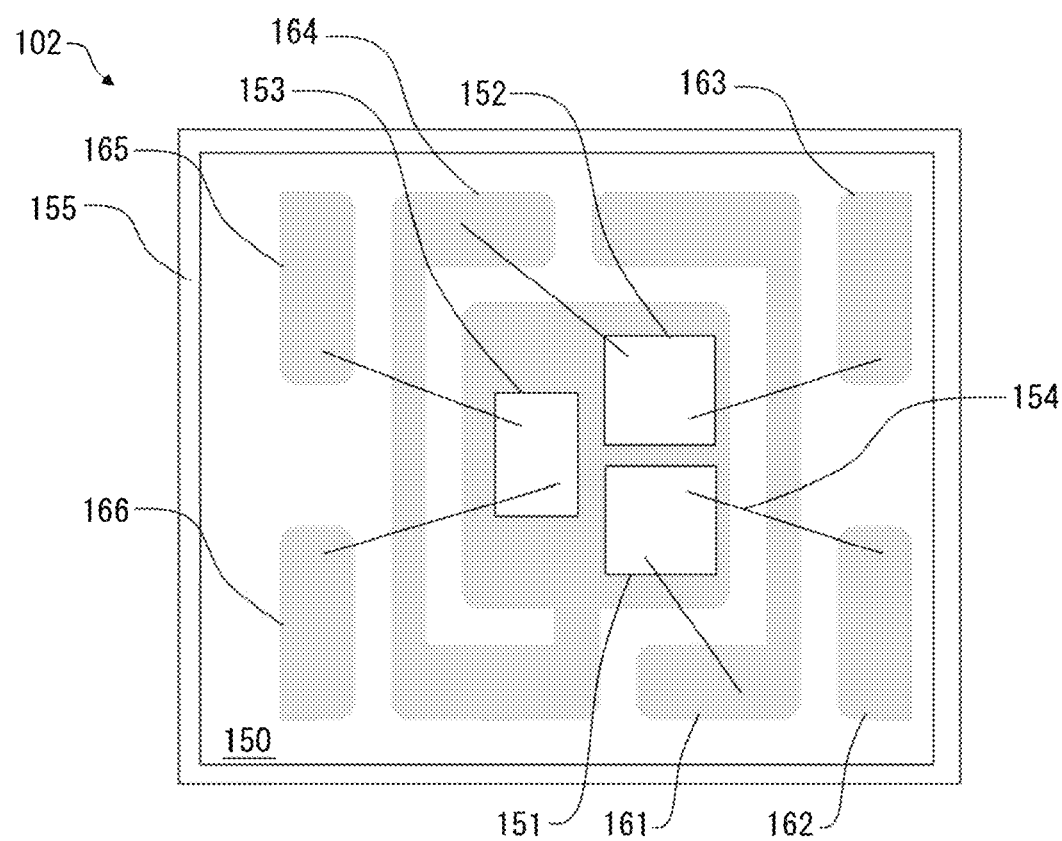
FIG. 21 is a plan diagram of the state of the light emitting device according to the third embodiment, from which the white resin and the seal resin are removed.

Configuration of Function of Light Emitting Device According to Third Embodiment FIG. 20 is a plan diagram of a light emitting device according to a third embodiment and FIG. 21 is a plan diagram of the state of the light emitting device according to the third embodiment, from which the white resin and the seal resin are removed.

A light emitting device 102 has a substrate 150, a first light emitting element 151, a second light emitting element 152, a third light emitting element 153, bonding wires 154, a frame material 155, a white resin 156, and a seal resin 157. The light emitting device 102 emits light emitted from the first light emitting element 151, the second light emitting element 152, and the third light emitting element 153 from an emission surface 158.

The substrate 150 has, like the substrate 110, a rectangular planar shape formed by an insulating resin, such as glass epoxy resin. On the surface of the substrate 150, a first anode wire 161 and a first cathode wire 162, a second anode wire 163 and a second cathode wire 164, and a third anode wire 165 and a third cathode wire 166 are arranged. Each of the first anode wire 161 to the third cathode wire 166 is connected to a backside electrode that is formed on the backside of the substrate 150.

The first anode wire 161 and the first cathode wire 162 are arranged between the outer edge of the substrate 150 and the first light emitting element 151. The first anode wire 161 is connected to the anode of the first light emitting element 151 and the first cathode wire 162 is connected to the cathode of the first light emitting element 151.

The second anode wire 163 is arranged between the outer edge of the substrate 150 and the second light emitting element 152. The second cathode wire 164 has a flat plate portion on which the first light emitting element 151 to the third light emitting element 153 are mounted and a wire portion that is arranged between the outer edge of the substrate 150 and the second light emitting element 152. The second anode wire 163 is connected to the anode of the second light emitting element 152 and the second cathode wire 164 is connected to the cathode of the second light emitting element 152.

The third anode wire 165 and the third cathode wire 166 are arranged between the outer edge of the substrate 150 and the third light emitting element 153. The third anode wire 165 is connected to the anode of the third light emitting element 153 and the third cathode wire 166 is connected to the cathode of the third light emitting element 153.

The first light emitting element 151 is a blue LED die having a rectangular planar shape, like the light emitting element 111. The first light emitting element 151 emits blue light in accordance with a forward voltage being applied via the backside electrode between the first anode wire 161 and the first cathode wire 162 connected via the bonding wire 154.

The second light emitting element 152 is a green LED die having a rectangular planar shape. The second light emitting element 152 emits green light in accordance with a forward voltage being applied via the backside electrode between the second anode wire 163 and the second cathode wire 164 connected via the bonding wire 154. The main wavelength of the green light that is emitted from the second light emitting element 152 is within a range between 500 nm and 570 nm and in one example, 550 nm. The second light emitting element 152 is formed by laminating a PN joint layer formed by a gallium nitride layer on a sapphire substrate, which is a transparent substrate.

The third light emitting element 153 is a red LED die having a rectangular planar shape. The third light emitting element 153 emits red light in accordance with a forward voltage being applied via the backside electrode between the third anode wire 165 and the third cathode wire 166 connected via the bonding wire 154. The main wavelength of the red light that is emitted from the third light emitting element 153 is within a range between 600 nm and 680 nm and in one example, 660 nm. The third light emitting element 153 is formed by arranging a PN joint layer formed by a gallium aluminum arsenide layer on a silicon substrate, which is a substrate that does not transmit light.

Each of the bonding wires 154 is, like the pair of bonding wires 112, a linear member formed by an electrically conductive member, such as gold. Each of the bonding wires 154 electrically connects the first light emitting element 151 to the first anode wire 161 and the first cathode wire 162, the second light emitting element 152 to the second anode wire 163 and the second cathode wire 164, and the third light emitting element 153 to the third anode wire 165 and the third cathode wire 166, respectively.

Each of the bonding wires 154 has, like the pair of bonding wires 112, a first potion that is buried in the white resin 156, a second portion that is buried in the seal resin 157, and a third portion that is arranged between the first portion and the second portion. The third portion of each of the bonding wires 154 is covered by a conic solid-like conic solid resin 160 extending along the extending direction of the bonding wire 154 from the white resin 156.

The frame material 155 is formed containing white particles, such as titanium oxide, in a transparent resin, such as a silicone resin, and is a frame-like member that is arranged along the outer edge of the substrate 150. The frame material 155 may be formed by a resin whose rigidity is high and whose reflectance is high, such as a polyimide resin and alumina.

The white resin 156 is, like the white resin 113, formed containing white particles, such as titanium oxide, in a transparent resin, such as a silicone resin. The white resin 156 is arranged so that the outer edge thereof contacts with the inner edge of the frame material 15 and the white resin 156 surrounds the first light emitting element 151, the second light emitting element 152, and the third light emitting element 153 and seals part of the bonding wires 154.

The seal rein 157 is, like the seal resin 114, formed by a transparent resin, such as a silicone resin, arranged in an area surrounded by the frame material 155, and seals part of the first light emitting element 151 to the third light emitting element 153 and the bonding wires 154.

Modification Example of Light Emitting Device According to Second Embodiment and Third Embodiment In the light emitting devices 101 and 102, the conic solid resins 130 and 160 are formed by the white resins 113 and 156, but in the light emitting device according to the embodiment, part of or the entire conic solid resin may be formed by a transparent resin included in the white resins 113 and 156. Part of or the entire conic solid resin is formed by the transparent resin included in the white resins 113 and 156, by the transparent resin not including the white resin included in the white resins 113 and 156 extending along the bonding wires 112 from the resin material before curing the white resins 113 and 156.

Further, in the light emitting device according to the embodiment, the conic solid resin may be formed by the white resins 113 and 156 and a synthetic resin other than the transparent resin included in the white resins 113 and 156. When the conic solid resin is formed by the white resins 113 and 156 and a synthetic resin other than the transparent resin included in the white resins, the conic solid resin is formed on the periphery of the bonding wire protruding from the white resin after the white resin is formed.

In the light emitting device 101, the seal resin 114 contains phosphors and fillers, but in the light emitting device according to the embodiment, it is not necessary for the seal resin to contain phosphors or fillers and the seal resin may contain only one of phosphors and fillers.

Further, the light emitting device 101 has the single light emitting element 111 and the light emitting device 102 has the three light emitting elements of the first light emitting element 151, the second light emitting element 152, and the third light emitting element 153, but the light emitting device according to the embodiment may have two or four or more light emitting elements. The light emitting device according to the embodiment may be a COB type light emitting device having a plurality of light emitting elements arranged in the form of an array.

Further, in the light emitting devices 101 and 102, the anode electrode and the cathode electrode are arranged on the backside of the substrate, but in the light emitting device according to the embodiment, the anode electrode and the cathode electrode may be arranged on the surface or on the side surface of the substrate.

Further, in the light emitting devices 101 and 102, the substrate has a rectangular planar shape, but in the light emitting device according to the embodiment, the substrate may have a planar shape other than a rectangular shape, such as a circular shape.

Further, in the light emitting device 101, the side surface of the substrate and the side surface of the white resin form the same surface, but in the light emitting device according to the embodiment, it is not necessary for the side surface of the substrate and the side surface of the white resin to form the same surface.

Further, in the light emitting device 102, the side surface of the substrate and the side surface of the frame material form the same surface, but in the light emitting device according to the embodiment, it is not necessary for the side surface of the substrate and the side surface of the frame material to form the same surface.

Thermal Stress Simulation of Light Emitting Device According to Embodiment

FIG. 22A is a perspective diagram of a model that is used for simulation indicating a relationship between shape and stress of the third portion of the bonding wire of the light emitting device according to the embodiment and FIG. 22B is a cross-sectional diagram along an F-F line shown in FIG. 22A. FIG. 22C is a diagram showing the height and the diameter of the base of the conic solid resin in the model that is used for simulation.

A model 103 has a substrate 170, a light emitting element 171, a bonding wire 172, a white resin 173, and a seal resin 174. The substrate 170 has a first electrode 177 and a second electrode 178 on the backside as well as having a first wire pattern 175 and a second wire pattern 175 on the surface. Further, the bonding wire 172 has a first portion that is buried in the white resin 173 and a second portion that is buried in the seal resin 174. Further, the bonding wire 172 has a third portion that is arranged between the first portion and the second portion and covered by a conic solid-like conic solid resin 180 extending along the extending direction of the bonding wire 172 from the white resin 173.

In Example 1, the height of the conic solid resin 180 is 100 μm and the diameter of the base of the conic solid resin 180 is 40 μm and the conic solid resin 180 is very thin. In Example 2, the height of the conic solid resin 180 is 100 μm and the diameter of the base of the conic solid resin 180 is 55 μm and the conic solid resin 180 is thin. In Example 3, the height of the conic solid resin 180 is 100 μm and the diameter of the base of the conic solid resin 180 is 70 μm and the conic solid resin 180 has a height and a diameter that are used as references.

In Example 4, the height of the conic solid resin 180 is 25 μm and the diameter of the base of the conic solid resin 180 is 70 μm and the conic solid resin 180 is very short. In Example 5, the height of the conic solid resin 180 is 50 μm and the diameter of the base of the conic solid resin 180 is 70 μm and the conic solid resin 180 is short. In Example 6, the height of the conic solid resin 180 is 150 μm and the diameter of the base of the conic solid resin 180 is 70 μm and the conic solid resin 180 is long.

In Comparative example 1, the height of the conic solid resin 180 is 0 μm and the diameter of the base of the conic solid resin 180 is 0 μm and the conic solid resin 180 is not formed. In Comparative example 2, the height of the conic solid resin 180 is 100 μm and the diameter of the base of the conic solid resin 180 is 100 μm and the conic solid resin 180 is thick. In Comparative example 3, the height of the conic solid resin 180 is 200 μm and the diameter of the base of the conic solid resin 180 is 70 μm and the conic solid resin 180 is very long.

In the simulation, in the cross-sectional diagram of the model shown in FIG. 22B, in the state where the model 103 is movably supported in the extending direction and the normal direction of the substrate 170, the heat uniformly distributed across the entire model 103 is increased from 25° C. to 125° C. The simulator used for the simulation is ANSYS Mechanical manufactured by ANSYS Inc.

The coefficient of linear expansion of the substrate 170 is 82 ppm/° C., the coefficient of linear expansion of the light emitting element 171 is 7.7 ppm/° C., the coefficient of linear expansion of the bonding wire 172 is 14 ppm/° C., the diameter of the cross section of the bonding wire 172 is 24.5 μm, the coefficient of linear expansion of the white resin 173 is 240 ppm/° C., and the coefficient of linear expansion of the seal resin 174 is 220 ppm/° C. Further, the coefficient of linear expansion of the first wire pattern 175 is 16.6 ppm/° C., the coefficient of linear expansion of the second wire pattern 176 is 16.6 ppm/° C., the coefficient of linear expansion of the first electrode 177 is 14 ppm/° C., and the coefficient of linear expansion of the second electrode 178 is 14 ppm/° C.

Figure 23A:
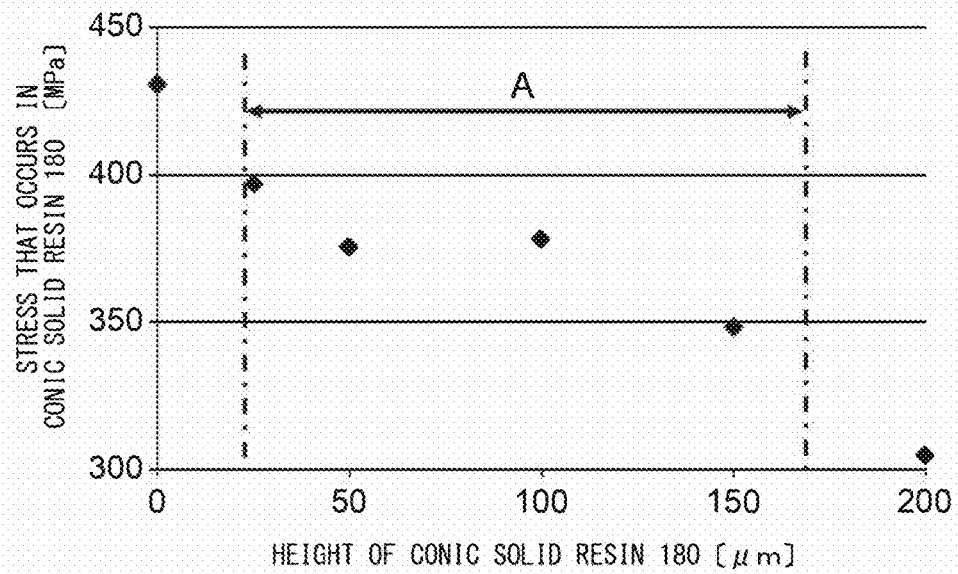
FIG. 23A is a diagram (part 1) showing simulation results and FIG. 23B is a diagram (part 2) showing simulation results.
Figure 23B:
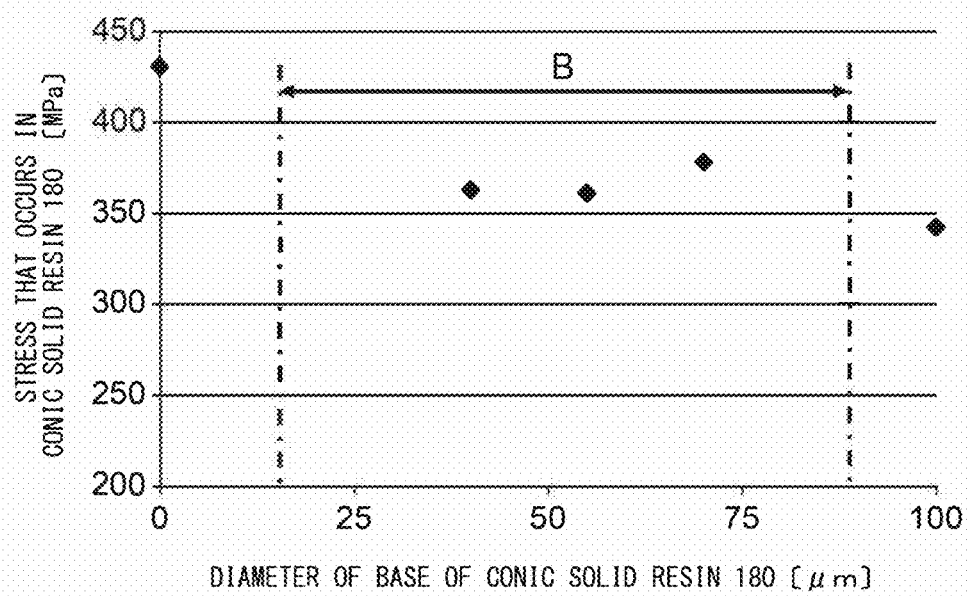

FIG. 23A is a diagram (part 1) showing simulation results and FIG. 23B is a diagram (part 2) showing simulation results. In FIG. 23A, the horizontal axis represents the height of the conic solid resin 180 and the vertical axis represents the stress that occurs in the bonding wire 172. Further, in FIG. 23B, the horizontal axis represents the diameter of the base of the conic solid resin 180 and the vertical axis represents the stress that occurs in the bonding wire 172.

As shown in FIG. 23A, the longer the length of the conic solid resin 180, the smaller the stress that occurs in the bonding wire 172 becomes. Further, as shown in FIG. 23B, the longer the diameter of the base of the conic solid resin 180, the smaller the stress that occurs in the bonding wire 172 becomes.

It is preferable for the stress that occurs in the conic solid resin 180 to be less than or equal to 400 [MPa]. When the stress that occurs in the conic solid resin 180 exceeds 400 [MPa], the stress that is applied to the bonding wire 172 becomes excessive, and therefore the bonding wire 172 may break. Further, when the height of the conic solid resin 180 becomes greater than 170 [μm], the conic solid resin 180 may damage. Furthermore, when the diameter of the base of the conic solid resin 180 becomes longer than 80 [μm], the conic solid resin 180 may damage.

As indicated by a bidirectional arrow A in FIG. 23A, it is preferable for the height of the conic solid resin 180 to be 20 [μm] or greater and 170 [μm] or less, in which range, the stress that occurs in the conic solid resin 180 is 400 [MPa] or less. Further, as indicated by a bidirectional arrow B in FIG. 23B, it is preferable for the diameter of the base of the conic solid resin 180 to be 15 [μm] or longer and 80 [μm] or less, in which range, the stress that occurs in the conic solid resin 180 is 400 [MPa] or less.

Comparative examples 1 to 3 are outside the range of the preferable height and diameter of the base and the determination results are "x". Examples 1 to 6 are within the range of the preferable height and diameter of the base and the determination results are "○".

Figure 24A:
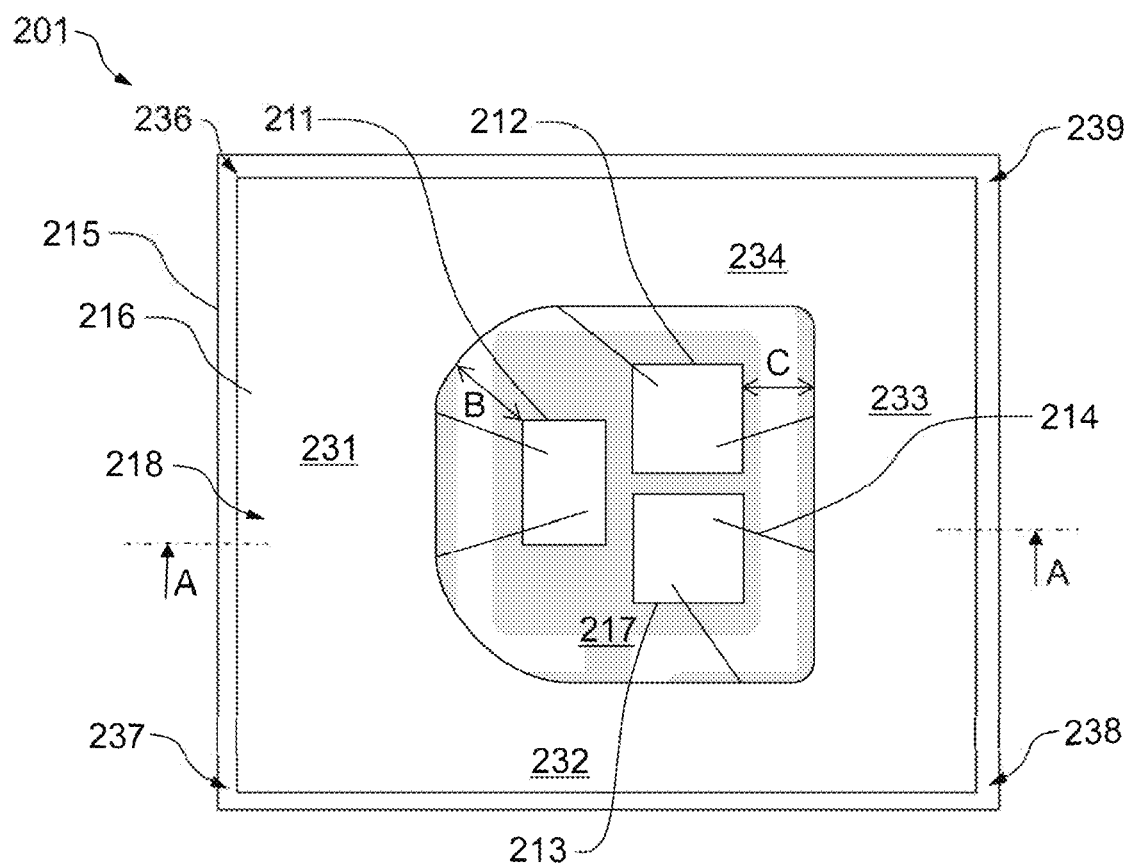
FIG. 24A is a plan diagram of the light emitting device according to the fourth embodiment and FIG. 24B is a cross-sectional diagram along an A-A line shown in FIG. 24A.
Figure 24B:
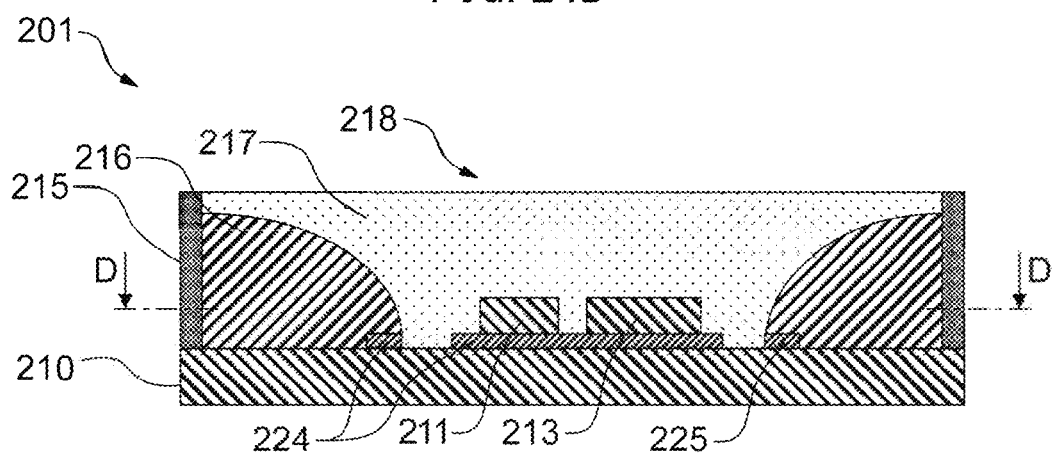

Configuration and Function of Light Emitting Device According to Fourth Embodiment FIG. 24A is a plan diagram of the light emitting device according to the fourth embodiment and FIG. 24B is a cross-sectional diagram along an A-A line shown in FIG. 24A.

A light emitting device 201 has a substrate 210, a first light emitting element 211, a second light emitting element 212, a third light emitting element 213, a bonding wire 214, a frame material 215, a white resin 216, and a seal resin 217. The light emitting device 201 emits light emitted from the first light emitting element 211, the second light emitting element 212, and the third light emitting element 213 from an emission surface 218.

Figure 25:
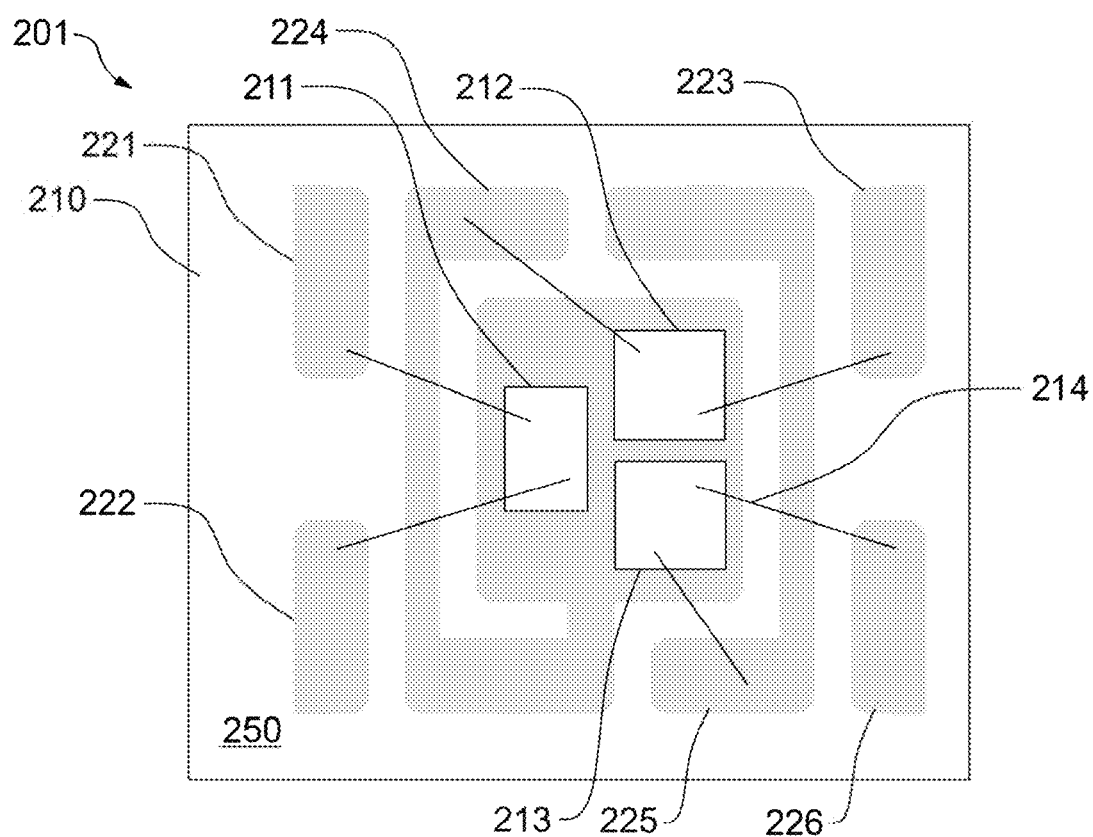
FIG. 25 is a plan diagram in the state where the frame material, the white resin, and the seal resin of the light emitting device are removed shown in FIG. 24A.

FIG. 25 is a plan diagram in the state where the frame material 215, the white resin 216, and the seal resin 217 of the light emitting device 201 are removed.

The substrate 210 has a rectangular planar shape formed by an insulating resin, such as a glass epoxy resin. On the surface of the substrate 210, a first anode wire 221 and a first cathode wire 222, a second anode wire 223 and a second cathode wire 224, and a third anode wire 225 and a third cathode wire 226 are arranged. Each of the first anode wire 221 to the third cathode wire 226 is connected to a backside electrode that is formed on the backside of the substrate 210.

The first anode wire 221 and the first cathode wire 222 are arranged between the outer edge of the substrate 210 and the first light emitting element 211. The first anode wire 221 is connected to the anode of the first light emitting element 211 and the first cathode wire 222 is connected to the cathode of the first light emitting element 211.

The second anode wire 223 is arranged between the outer edge of the substrate 210 and the second light emitting element 212. The second cathode wire 224 has a flat plate portion on which the first light emitting element 211 to the third light emitting element 213 are mounted and a wire portion that is arranged between the outer edge of the substrate 210 and the second light emitting element 212. The second anode wire 223 is connected to the anode of the second light emitting element 212 and the second cathode wire 224 is connected to the cathode of the second light emitting element 212.

The third anode wire 225 and the third cathode wire 226 are arranged between the outer edge of the substrate 210 and the third light emitting element 213. The third anode wire 225 is connected to the anode of the third light emitting element 213 and the third cathode wire 226 is connected to the cathode of the third light emitting element 213.

The first light emitting element 211 is a red LED die having a rectangular planar shape. The first light emitting element 211 emits red light in accordance with a forward voltage being applied via the backside electrode between the first anode wire 221 and the first cathode wire 222 connected via the bonding wire 214. The main wavelength of the red light that is emitted from the first light emitting element 211 is within a range between 600 nm and 680 nm and in one example, 660 nm. The first light emitting element 211 is formed by arranging a PN joint layer formed by a gallium aluminum arsenide layer on a silicon substrate, which is a substrate that does not transmit light.

The second light emitting element 212 is a green LED die having a rectangular planar shape. The second light emitting element 212 emits green light in accordance with a forward voltage being applied via the backside electrode between the second anode wire 223 and the second cathode wire 224 connected via the bonding wire 214. The main wavelength of the green light that is emitted from the second light emitting element 212 is within a range between 500 nm and 570 nm and in one example, 550 nm. The second light emitting element 212 is formed by laminating a PN joint layer formed by a gallium nitride layer on a sapphire substrate, which is a transparent substrate.

The third light emitting element 213 is a blue LED die having a rectangular planar shape. The third light emitting element 213 emits blue light in accordance with a forward voltage being applied via the backside electrode between the third anode wire 225 and the third cathode wire 226 connected via the bonding wire 214. The main wavelength of the blue light that is emitted from the third light emitting element 213 is within a range between 445 nm and 495 nm and in one example, 450 nm. The third light emitting element 213 is formed by laminating a PN joint layer formed by a gallium nitride layer on a sapphire substrate, which is a transparent substrate.

Figure 26A:
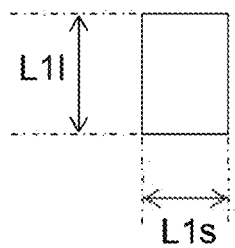
FIG. 26A is a plan diagram showing the dimensions of the first light emitting element shown in FIG. 24A.
Figure 26B:
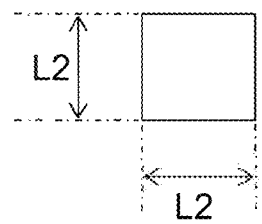
FIG. 26B is a plan diagram showing the dimensions of the second light emitting element shown in FIG. 24A.
Figure 26C:
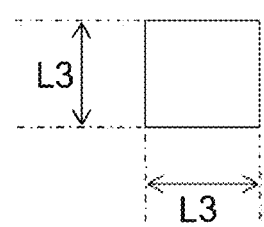
FIG. 26C is a plan diagram showing the dimensions of the third light emitting element shown in FIG. 24A.

FIG. 26A is a plan diagram showing the dimensions of the first light emitting element 211, FIG. 26B is a plan diagram showing the dimensions of the second light emitting element 212, and FIG. 26C is a plan diagram showing the dimensions of the third light emitting element 213.

Each of the first light emitting element 211 to the third light emitting element 213 has a rectangular planar shape. In the first light emitting element 211, a first length, which is the length of a pair of sides extending in the long-side direction, is L1l and a fourth length, which is the length of a pair of sides extending in the short-side direction, is L1s. In the second light emitting element 212, a second length, which is the length of four sides, is L2. In the third light emitting element 213, a third length, which is the length of four sides, is L3.

The second length L2, which is the length of the four sides of the second light emitting element 212, is shorter than the first length L1l, which is the length of the long side of the first light emitting element 211, and longer than the fourth length L1s, which is the length of the short side of the first light emitting element 211. The third length L3, which is the length of the four sides of the third light emitting element 213, is shorter than the first length L1l, which is the length of the long side of the first light emitting element 211, and longer than the fourth length L1s, which is the length of the short side of the first light emitting element 211.

The second length L2, which is the length of the four sides of the second light emitting element 212, is the same as the third length L3, which is the length of the four sides of the third light emitting element 213.

The first light emitting element 211 is arranged so that the first light emitting element 211 is in close proximity to a first side 231 and whose long side is parallel to the first side 231. The second light emitting element 212 and the third light emitting element 213 are arrayed so that the second light emitting element 212 and the third light emitting element 213 are in close proximity to a third side 233 and whose one side is parallel to the third side 233.

Each bonding wire 214 is a linear member formed by an electrically conductive member, such as gold. Each bonding wire 214 electrically connects the first light emitting element 211 to the first anode wire 221 and the first cathode wire 222, the second light emitting element 212 to the second anode wire 223 and the second cathode wire 224, and the third light emitting element 213 to the third anode wire 225 and the third cathode wire 226, respectively.

The frame material 215 is formed containing white particles, such as titanium oxide, in a transparent resin, such as a silicone resin, and is a frame-like member that is arranged along the outer edge of the substrate 210. The frame material 215 may be formed by a resin whose rigidity is high and whose reflectance is high, such as a polyimide resin and alumina.

The white resin 216 is also referred to as a dam resin and formed containing white particles, such as titanium oxide, in a transparent resin, such as a silicone resin. The white resin 216 is arranged so that the outer edge contacts with the inner edge of the frame material 215 and the white resin 216 surrounds the first light emitting element 211, the second light emitting element 212, and the third light emitting element 213 and seals part of the bonding wire 214.

The white resin 216 has the first side 231, a second side 232, the third side 233, and a fourth side 234. The first side 231 is arranged so as to extend in parallel to one side of the substrate 210 extending in parallel to the extending direction of the first anode wire 221 and the first cathode wire 222 as well as being in close proximity to the first anode wire 221 and the first cathode wire 222. A minimum separation distance Lm1 between the first light emitting element 211 and the white resin 216, which is indicated by a bidirectional arrow B in FIG. 24A, is 0.05 mm or more and 0.35 mm or less.

The third side 233 is arranged facing the first side 231 and arranged so as to extend in parallel to one side of the substrate 210 extending in parallel to the extending direction of the second anode wire 223 and the third cathode wire 226 as well as being in close proximity to the second anode wire 223 and the third cathode wire 226.

The second side 232 and the fourth side 234 extend in the direction perpendicular to the extending direction of the first side 231 and the third side 233 and connect the first side 231 and the third side 233. The second side 232 is arranged so as to be in close proximity to the first cathode wire 222, the second cathode wire 224, the third anode wire 225, and the third cathode wire 226. The fourth side 234 is arranged so as to be in close proximity to the first anode wire 221, the second anode wire 223, the second cathode wire 224, and the third anode wire 225. A minimum separation distance Lm2 between the second light emitting element 212 and the white resin 216 and between the third light emitting element 213 and the white resin 216, which is indicated by a bidirectional arrow C in FIG. 24A, is 0.05 mm or more and 0.35 mm or less.

The minimum distance between the light emitting elements adjacent to each other of the first light emitting element 211 to the third light emitting element 213 is 0.03 mm or more and 0.08 mm or less.

The total sum of the area of the top surface of each of the first light emitting element 211 to the third light emitting element 213 is 3% or more and 50% or less of the area of the top surface of the substrate 210 surrounded by the white resin 216.

The white resin 216 further has a first corner 236, a second corner 237, a third corner 238, and a fourth corner 239. The first corner 236 is a corner between the fourth side 234 and the first side 231 and the second corner 237 is a corner between the first side 231 and the second side 232. The third corner 238 is a corner between the second side 232 and the third side 233 and the fourth corner 239 is a corner between the third side 233 and the fourth side 234.

The first corner 236 and the second corner 237 extend more toward the inside of the substrate 210, i.e., toward the direction of the third corner 238 and the direction of the fourth corner 239, respectively, both are the opposite corners of the first corner 236 and the second corner 237, respectively, than the third corner 238 and the fourth corner 239 do. The first corner 236 and the second corner 237 extend toward the direction of the third corner 238 and the direction of the fourth corner 239, respectively, and therefore the extension distances of the first corner 236 and the second corner 237 are longer than those of the third corner 238 and the fourth corner 239. The first corner 236 and the second corner 237 are each a still another example of the protruding portion extending and protruding from at least one side toward the opposite side.

Figure 27:
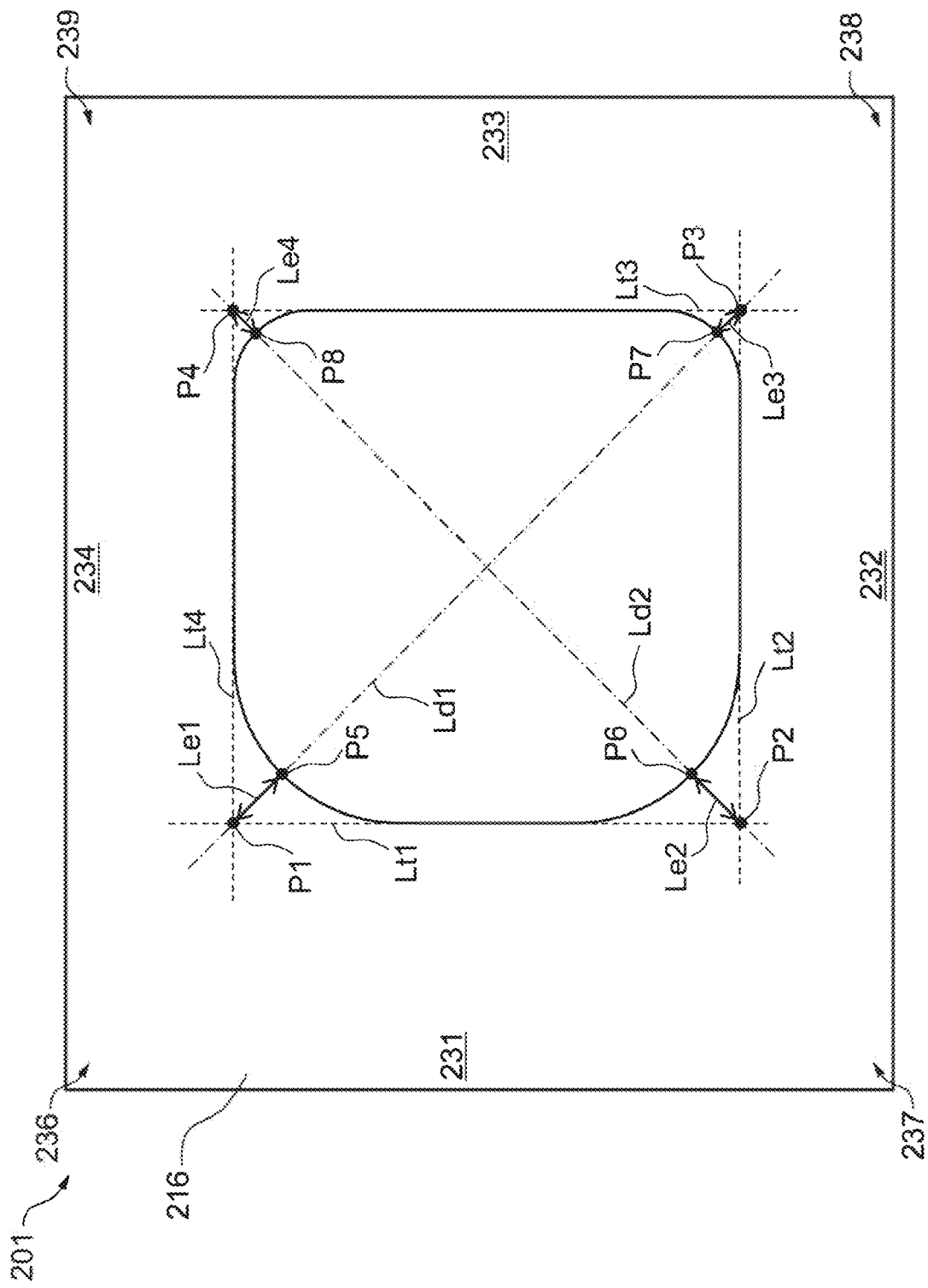
FIG. 27 is a diagram for explaining a method of predefining the extension distance of the inner wall of the corner of the white resin.

FIG. 27 is a diagram for explaining a method of predefining the extension distance of the inner wall of the corner of the white resin 216. FIG. 27 is one of cross-sectional diagrams of the white resin 216, which are parallel to the top surface of the substrate 210 and between the top surface of the substrate 210 and the top end of the white resin 216, and is a cross-sectional diagram showing only the white resin 216 among the cross sections along a D-D line shown in FIG. 24B, which passes between the undersurfaces and the top surfaces of the first light emitting element 211 to the third light emitting element 213.

The extension distance is, on one of cross sections of the white resin 216, which are parallel to the top surface of the substrate 210, a distance between each of four corners of the circumscribed rectangle, which is a rectangle circumscribed around the inner wall of the white resin 216, and the intersection point closest to each of the four corners of the circumscribed rectangle among the four intersection points at which a pair of diagonal lines of the circumscribed rectangle intersect the inner wall of the white resin 216. In the example shown in FIG. 27, in the plan view, the extension distance of the first corner of the white resin 216 is indicated by Le1, the extension distance of the second corner is indicated by Le2, the extension distance of the third corner is indicated by Le3, and the extension distance of the fourth corner is indicated by Le4.

In FIG. 27, the circumscribed rectangle, which is a rectangle circumscribed around the inner wall of the white resin, is formed by a first tangent line Lt1, a second tangent line Lt2, a third tangent line Lt3, and a fourth tangent line Lt4. The first tangent line Lt1 is a tangent line parallel to the extending direction of the first side 231 and which intersects the inner wall of the first side 231 along one straight line and the second tangent line Lt2 is a tangent line parallel to the extending direction of the second side 232 and which intersects the inner wall of the first side 231 along one straight line. The third tangent line Lt3 is a tangent line parallel to the extending direction of the third side 233 and which intersects the inner wall of the third side 233 along one straight line and the fourth tangent line Lt4 is a tangent line parallel to the extending direction of the fourth side 234 and which intersects the inner wall of the first side 234 along one straight line.

The four corners of the circumscribed rectangle, which is a rectangle circumscribed around the inner wall of the white resin, are a first intersection point P1, a second intersection point P2, a third intersection point P3, and a fourth intersection point P4. The first intersection point P1 is the intersection point of the fourth tangent line Lt4 and the first tangent line Lt1, the second intersection point P2 is the intersection point of the first tangent line Lt1 and the second tangent line Lt2, the third intersection point P3 is the intersection point of the second tangent line Lt2 and the third tangent line Lt3, and the fourth intersection point P4 is the intersection point of the third tangent line Lt3 and the fourth tangent line Lt4.

The pair of diagonal lines of the circumscribed rectangle, which is a rectangle circumscribed around the inner wall of the white resin, are a first diagonal line Ld1 and a second diagonal line Ld2. The first diagonal line Ld1 is the diagonal line between the first intersection point P1 and the third intersection point P3, which are the opposite corners, and the second diagonal line Ld2 is the diagonal line between the second intersection point P2 and the fourth intersection point P4, which are the opposite corners.

Four intersection points at which the first diagonal line Ld1 and the second diagonal line Ld2, which are the pair of diagonal lines of the circumscribed rectangle, which is a rectangle circumscribed around the inner wall of the white resin, intersect the inner wall of the white resin 216 are a fifth intersection point P5, a sixth intersection point P6, a seventh intersection point P7, and an eighth intersection point P8. The fifth intersection point P5 is the intersection point at which the first diagonal line Ld1 and the inner wall of the white resin 216 in close proximity to the first corner 236 intersect and the sixth intersection point P6 is the intersection point at which the second diagonal line Ld2 and the inner wall of the white resin 216 in close proximity to the second corner 237 intersect. The seventh intersection point P7 is the intersection point at which the first diagonal line Ld1 and the inner wall of the white resin 216 in close proximity to the third corner 238 intersect and the eighth intersection point P8 is the intersection point at which the second diagonal line Ld2 and the inner wall of the white resin 216 in close proximity to the fourth corner 239 intersect.

The extension distance Le1 of the inner wall of the first corner 236 is the distance between the first intersection point P1, which is the corner of the circumscribed rectangle closest to the first corner 236, and the fifth intersection point P5, which is the intersection point closest to the first intersection point P1 among the four intersection points at which the diagonal line of the circumscribed rectangle intersects the inner wall of the white resin 216. The extension distance Le2 of the inner wall of the second corner 237 is the distance between the second intersection point P1, which is the corner of the circumscribed rectangle closest to the second corner 237, and the sixth intersection point P6, which is the intersection point closest to the second intersection point P2 among the four intersection points at which the diagonal line of the circumscribed rectangle intersects the inner wall of the white resin 216. The extension distance Le3 of the inner wall of the third corner 238 is the distance between the third intersection point P3, which is the corner of the circumscribed rectangle closest to the third corner 238, and the seventh intersection point P7, which is the intersection point closest to the third intersection point P3 among the four intersection points at which the diagonal line of the circumscribed rectangle intersects the inner wall of the white resin 216. The extension distance Le4 of the inner wall of the fourth corner 239 is the distance between the fourth intersection point P4, which is the corner of the circumscribed rectangle closest to the fourth corner 239, and the eighth intersection point P8, which is the intersection point closest to the fourth intersection point P1 among the four intersection points at which the diagonal line of the circumscribed rectangle intersects the inner wall of the white resin 216.

The seal resin 217 is formed by a transparent resin, such as a silicone resin, and arranged in an area surrounded by the frame material 215 and seals part of the first light emitting element 211 to the third light emitting element 213 and the bonding wire 214.

Manufacturing Method of Light Emitting Device According to Fourth Embodiment

Figure 28:
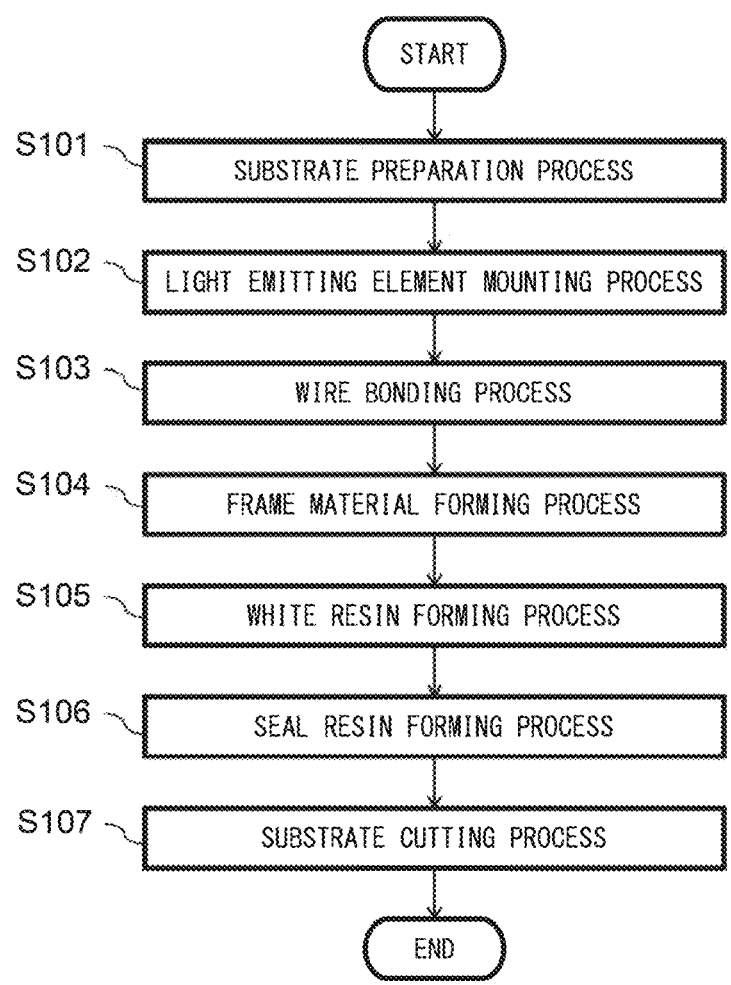
FIG. 28 is a flowchart showing an example of a manufacturing method of the light emitting device shown in FIG. 24A.
Figure 29:
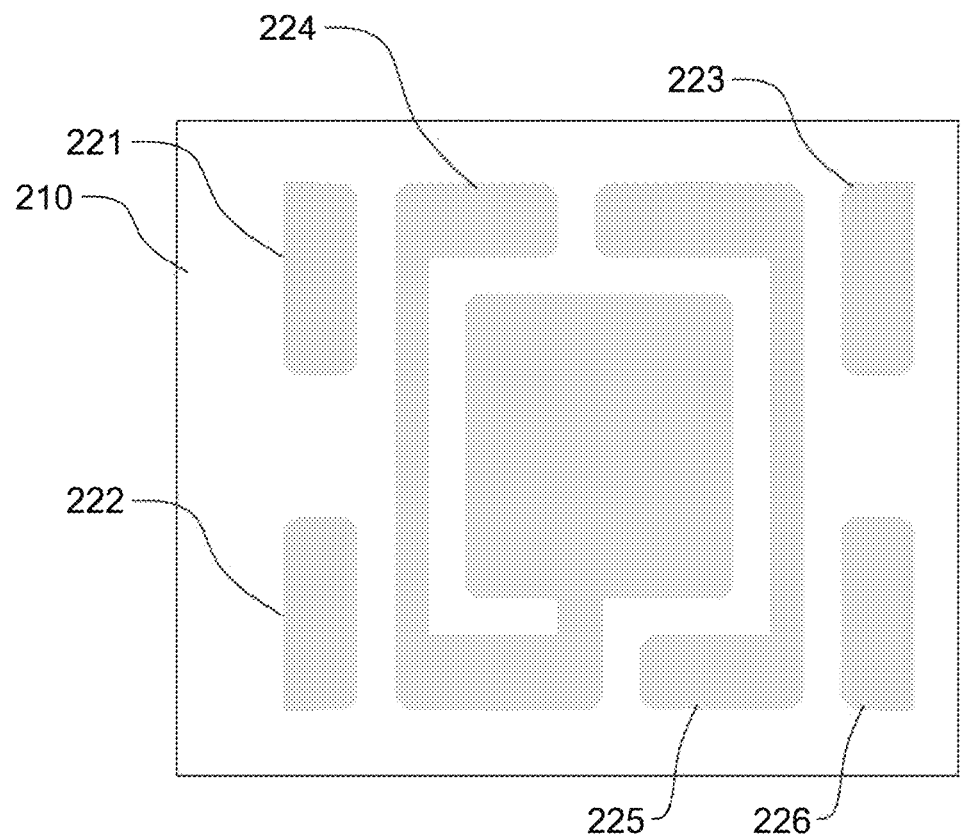
FIG. 29 is a diagram showing a substrate preparation process shown in FIG. 28.
Figure 30:
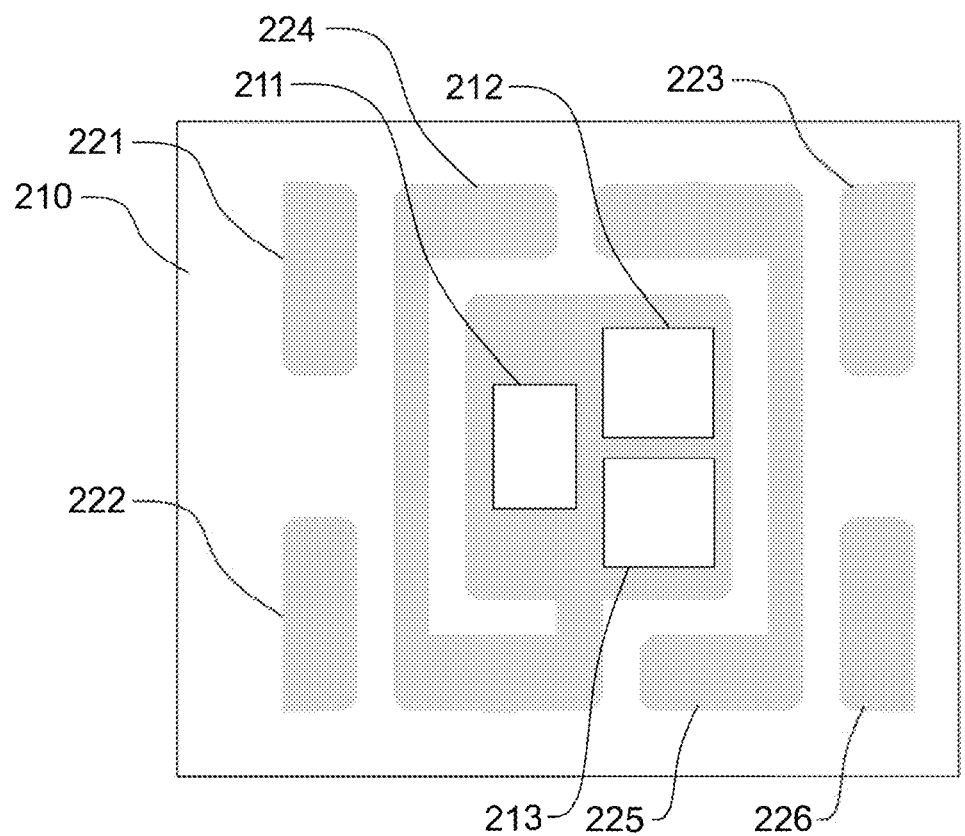
FIG. 30 is a diagram showing a light emitting element mounting process shown in FIG. 28.

FIG. 28 is a flowchart showing an example of a manufacturing method of the light emitting device 201. FIG. 29 is a diagram showing a substrate preparation process, FIG.

Figure 31:
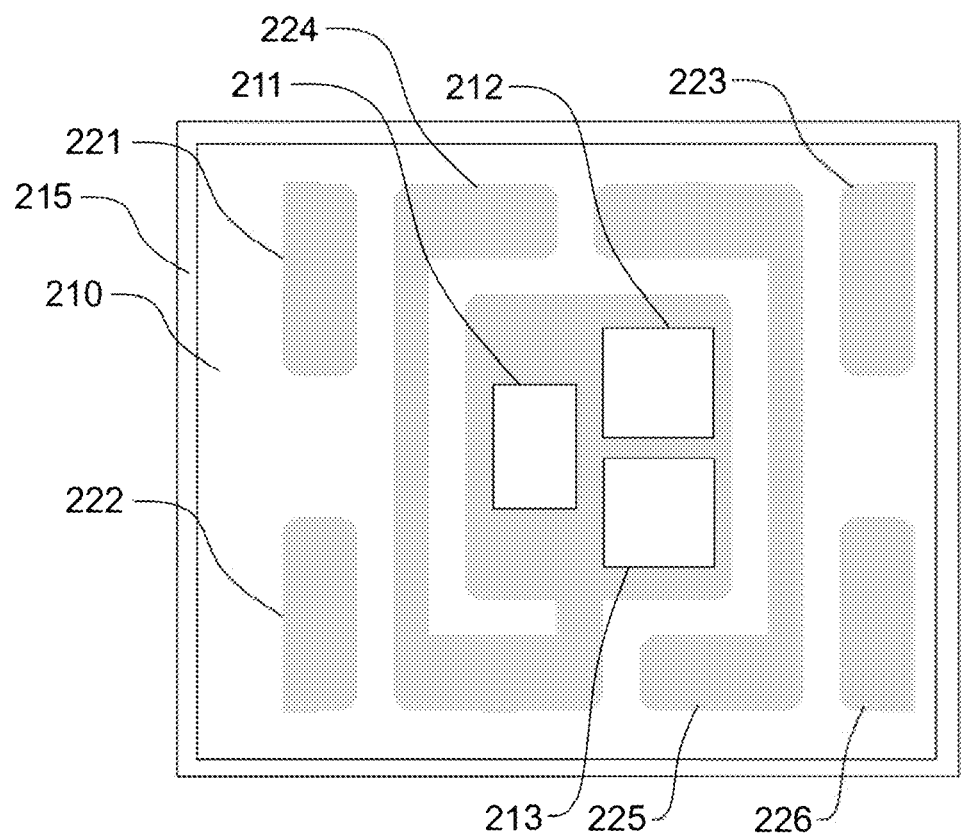
FIG. 31 is a diagram showing a frame material forming process shown in FIG. 28.
Figure 32:
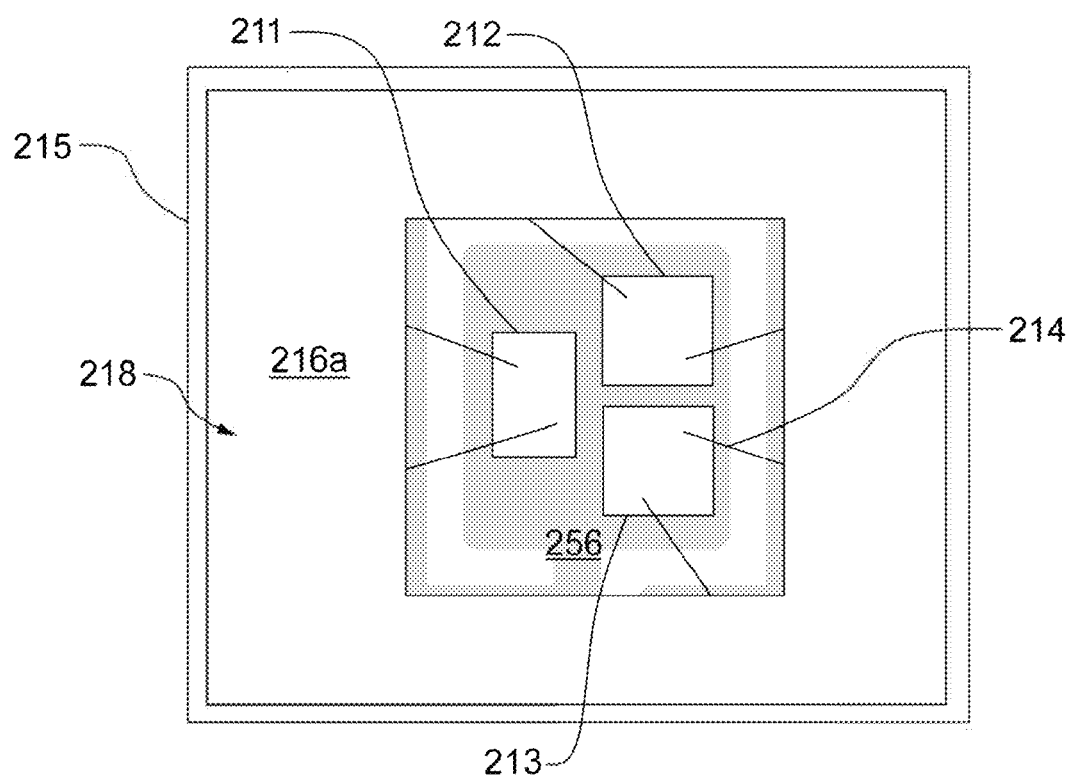
FIG. 32 is a diagram showing a white resin forming process (part 1) shown in FIG. 28.
Figure 33:
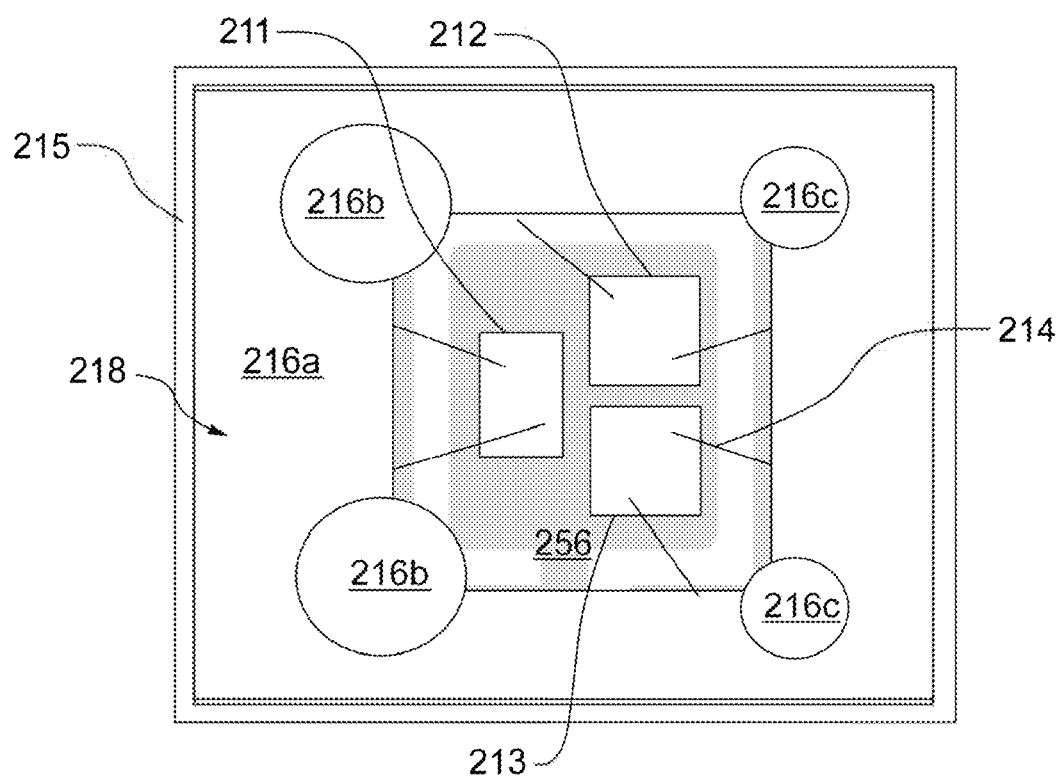
FIG. 33 is a diagram showing a white resin forming process (part 2) shown in FIG. 28.
Figure 34:
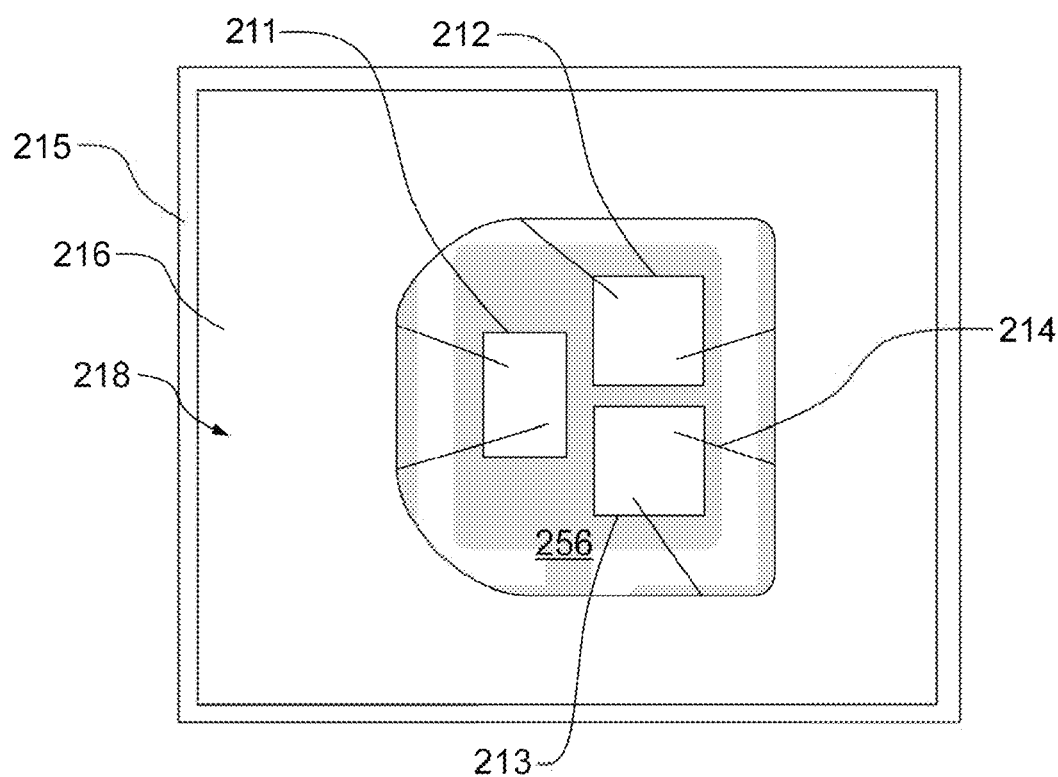
FIG. 34 is a diagram showing a white resin forming process (part 3) shown in FIG. 28.

30 is a diagram showing a light emitting element mounting process, and FIG. 31 is a diagram showing a frame material forming process. FIG. 32 is a diagram showing a white resin forming process (part 1), FIG. 33 is a diagram showing a white resin forming process (part 2), and FIG. 34 is a diagram showing a white resin forming process (part 3). In FIG. 6 to FIG. 11, only the single light emitting device 201 is shown, but the light emitting device 201 is manufactured by using a collective substrate coupling a plurality of the substrates 210.

First, in the substrate preparation process, a collective substrate is prepared, which couples a plurality of the substrates 210 on the surface of which each of the first anode wire 221 to the third cathode wire 226 is formed (S101). Next, in the light emitting element mounting process, each of the first light emitting element 211 to the third light emitting element 213 is bonded onto the second cathode wire 224 of each of the plurality of the substrates 210 by a die bond material (S102).

As the light emitting element in the light emitting device 201, a light emitting element of wire bonding type is taken as one example, but the light emitting element may be a light emitting element of flip-chip type. If the light emitting element is flip-chip type, in the light emitting element mounting process, the light emitting element is bonded by flip-chip bonding.

Next, as shown in FIG. 25, in the wire bonding process, the anode and cathode of each of the first light emitting element 211 to the third light emitting element 213 and the first anode wire 221 to the third cathode wire 226 are connected by the bonding wire 214 (S103). The anode of the first light emitting element 211 is connected to the first anode wire 221 by the bonding wire 214 and the cathode of the first light emitting element 211 is connected to the first cathode wire 222 by the bonding wire 214. The anode of the second light emitting element 212 is connected to the second anode wire 223 by the bonding wire 214 and the cathode of the second light emitting element 212 is connected to the second cathode wire 224 by the bonding wire 214. The anode of the third light emitting element 213 is connected to the third anode wire 225 by the bonding wire 214 and the cathode of the third light emitting element 213 is connected to the third cathode wire 226 by the bonding wire 214.

As the light emitting element in the light emitting device 201, the light emitting element of wire bonding type both anode and cathode of which the wire is connected to is taken as one example, but the light emitting element may be a light emitting element of wire bonding type only one of the anode and the cathode of which the wire is connected to, or the light emitting element may be a light emitting element of flip-chip type.

Next, in the frame material forming process, the frame material 215 is formed along the outer edge of the substrate 210. The resin material before curing the frame material 215 is shaped so that the side surface is erect and the surface is smoothed after being arranged along the outer edge of the substrate 210 (S104). The resin material before curing the frame material 215 is formed by heating the substrate 210 after the resin material before curing the frame material 215 is shaped.

It is not necessary for the frame material 215 to be formed. When the frame material 215 is not formed, the frame material forming processing is omitted.

Next, in the white resin forming process, the white resin 216 is arranged on the surface of each of the plurality of the substrates 210 (S105). First, as shown in FIG. 32, a resin material 216a before curing the white resin 216 is arranged so as to surround the first light emitting element 211, the second light emitting element 212, and the third light emitting element 213. Next, as shown in FIG. 33, at the portions corresponding to the first corner 236 and the second corner 237 of the resin material 216a before curing the white resin 216, which is arranged so as to surround the first light emitting element 211, the second light emitting element 212, and the third light emitting element 213, a resin material 216b before curing the white resin 216 is arranged, and at the portions corresponding to the third corner 238 and the fourth corner 239, a resin material 216c before curing the white resin 216 is arranged. The amount of the resin material 216c is smaller than that of the resin material 216b and there may be a process in which the resin material 216c is not arranged. Then, as shown in FIG. 34, by heating the substrate 210 after the resin material before curing the white resin 216 arranged, the white resin 216 is formed.

Next, in the seal resin forming process, the seal resin 217 is formed on the surface of each of the plurality of the substrates 210 (S106). The resin material before curing the seal resin 217 is arranged so as to cover the first light emitting element 211, the second light emitting element 212, the third light emitting element 213, the bonding wire 214, and the white resin 216. The seal resin 217 is formed by heating the substrate 210 after the resin material before curing the seal resin 217 is arranged.

Then, in the substrate cutting process, by cutting the collective substrate coupling the plurality of the substrates 210 (S107), the plurality of the substrates 210 is separated into each individual substrate 210 and the light emitting device 201 is manufactured.

Function Effect of Light Emitting Device According to Fourth Embodiment

In the light emitting device 201, the extension distances of the inner walls of the first corner 236 and the second corner 237 in close proximity to the first light emitting element 211 whose long side is long are longer than the extension distances of the inner walls of the third corner 238 and the fourth corner 239 distant from the first light emitting element 211. The minimum separation distance Lm1 between the first light emitting element 211 and the white resin 216 becomes substantially equal to the minimum separation distance between the second light emitting element 212 and the white resin 216 and between the third light emitting element 213 and the white resin 216, by increasing the extension distances of the inner walls of the first corner 236 and the second corner 237. The light emitting device 201 may emit uniform light, by the minimum separation distance Lm1 and the minimum separation distance Lm2 becoming substantially equal.

Further, in the light emitting device 201, the minimum separation distance between each of the first light emitting element 211 to the third light emitting element 213 and the white resin 216 is 0.05 mm or more and 0.35 mm or less, and therefore light emission efficiency may be increased.

Further, in the light emitting device 201, the minimum separation distance between each light emitting element of the first light emitting element 211 to the third light emitting element 213 is 0.03 mm or more. When the minimum separation distance between each light emitting element of the first light emitting element 211 to the third light emitting element 213 is 0.03 mm or more, the first light emitting element 211 to the third light emitting element 213 may bond onto the second cathode wire 224 with a stable position accuracy, and therefore the light emitting elements may be prevented from contacting with each other and from coming too close to one another, and therefore the lifetime will improve. Further, in the light emitting device 201, the minimum separation distance between each light emitting element of the first light emitting element 211 to the third light emitting element 213 is 0.08 mm or less. When the minimum separation distance between each light emitting element of the first light emitting element 211 to the third light emitting element 213 is 0.09 mm or less, the color mixability of synthetic light obtained by synthesizing light emitted from the first light emitting element 211 to the third light emitting element 213 increases, and therefore synthetic light with low color unevenness and high light distribution property may be emitted. It is more acceptable for the minimum separation distance between each light emitting element of the first light emitting element 211 to the third light emitting element 213 to be 0.08 mm or less.

Further, the sum total of the area of the top surface of each of the first light emitting element 211 to the third light emitting element 213 is 3% or more of the area of the top surface of the substrate surrounded by the white resin 216. Because the sum total of the area of the top surface of each of the first light emitting element 211 to the third light emitting element 213 is 3% or more of the area of the top surface of the substrate surrounded by the white resin 216, the color mixability of synthetic light obtained by synthesizing light emitted from the first light emitting element 211 to the third light emitting element 213, which is emitted from the emission surface 218, increases, and therefore synthetic light with low color unevenness and high light distribution property may be emitted. Further, the sum total of the area of the top surface of each of the first light emitting element 211 to the third light emitting element 213 is 50% or less of the area of the top surface of the substrate surrounded by the white resin 216. Because the sum total of the area of the top surface of each of the first light emitting element 211 to the third light emitting element 213 is 50% or less of the area of the top surface of the substrate surrounded by the white resin 216, the amount of light flux of light that is emitted from the emission surface 218 increases, and therefore the light emission efficiency improves.

Modification Example of Light Emitting Device According to Fourth Embodiment

The light emitting device 201 has the first light emitting element 211 that emits red light, the second light emitting element 212 that emits green light, and the third light emitting element 213 that emits blue light, but the light emitting device according to the embodiment may have light emitting elements that emit the same color. For example, the light emitting device according to the embodiment may have a plurality of light emitting elements that emit blue color. When the light emitting device according to the embodiment has a plurality of light emitting elements that emit blue light, the transparent resin may contain phosphors, such as yttrium aluminum garnet, which absorb blue light and emit yellow light.

Further, the light emitting device 201 has the first light emitting element 211 having the rectangular planar shape and the second light emitting element 212 and the third light emitting element 213 having the square planar shape and the same area, but the light emitting device according to the embodiment may have a plurality of light emitting elements whose areas are different from one another. Further, the light emitting device according to the embodiment may have a plurality of light emitting elements whose areas are the same.

Figure 35B:
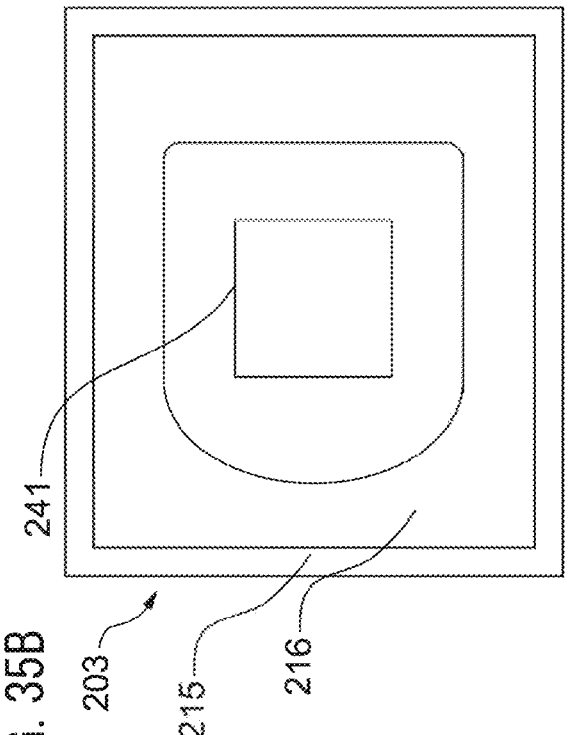
FIG. 35B is a plan diagram of a light emitting device according to a ninth modification.
Figure 35D:
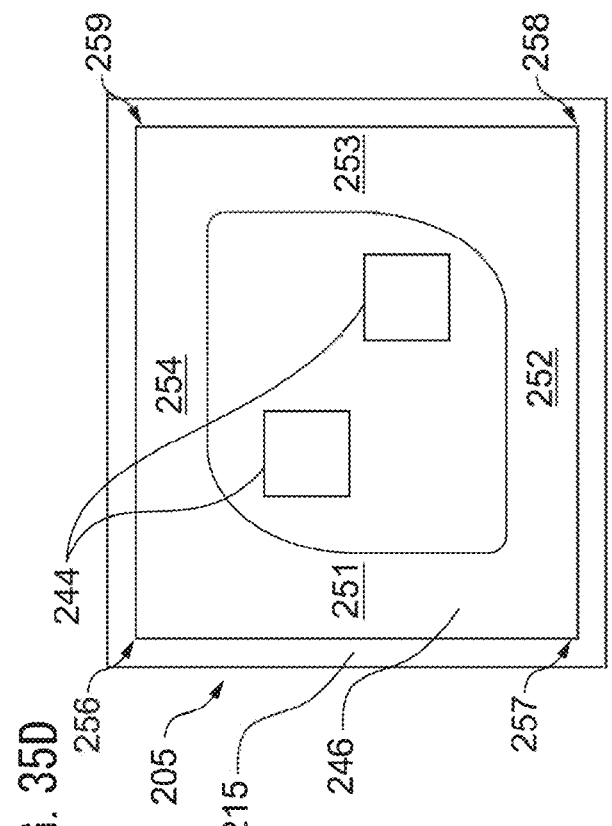
FIG. 35D is a plan diagram of a light emitting device according to an eleventh modification.
Figure 35A:
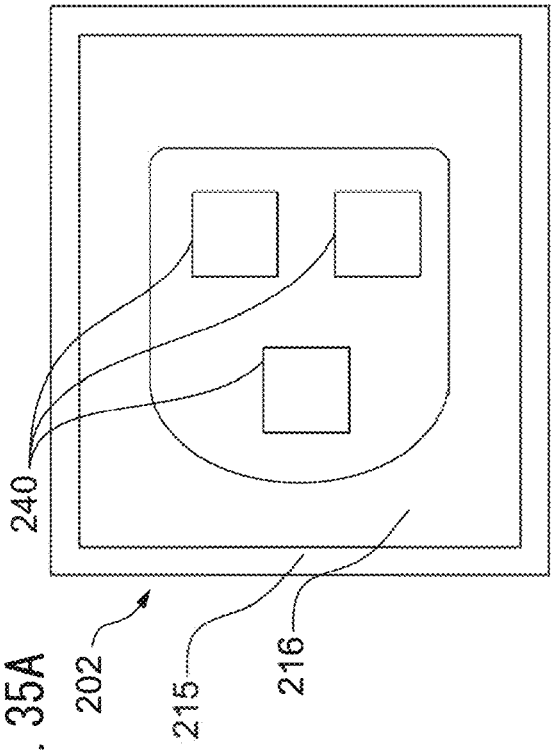
FIG. 35A is a plan diagram of a light emitting device according to an eighth modification.

FIG. 35A is a plan diagram of a light emitting device according to an eighth modification.

A light emitting device 202 differs from the light emitting device 201 in having three light emitting elements 240 in place of the first light emitting element 211 to the third light emitting element 213. The configuration and function of the light emitting device 202 except for having the light emitting elements 240 in place of the first light emitting element 211 to the third light emitting element 213 are the same as the configuration and function of the light emitting device 201, and therefore detailed explanation is omitted here.

Each of the three light emitting elements 240 is, for example, a blue LED die that emits blue light and arranged so that the minimum separation distance from the white resin 216 is substantially the same.

Further, the light emitting device 201 has the first light emitting element 211 to the third light emitting element 213, but the light emitting device according to the embodiment may have one, two, four, or more light emitting elements.

Figure 35C:
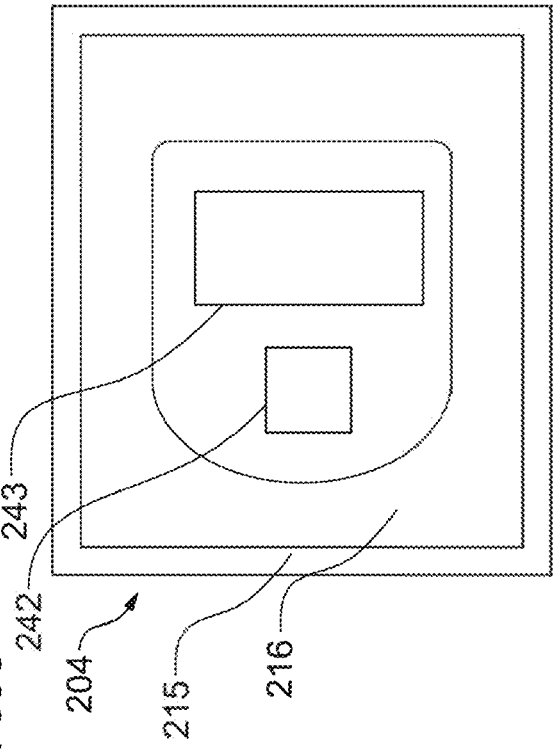
FIG. 35C is a plan diagram of a light emitting device according to a tenth modification.

FIG. 35B is a plan diagram of a light emitting device according to a ninth modification and FIG. 35C is a plan diagram of a light emitting device according to a tenth modification.

A light emitting device 203 differs from the light emitting device 201 in having a single light emitting element 241 in place of the first light emitting element 211 to the third light emitting element 213. The configuration and function of the light emitting device 203 except for having the light emitting element 241 in place of the first light emitting element 211 to the third light emitting element 213 are the same as the configuration and function of the light emitting device 201, and therefore detailed explanation is omitted here.

The light emitting element 241 is, for example, a blue LED die that emits blue light and arranged at the center of the substrate 210. In the light emitting element 241, light emitted from the light emitting element 241 arranged at the center of the substrate 210 is reflected from the white resin 216 whose extension distance of the inner wall of the corner is different and emitted from the light emitting device 203, and therefore the distribution of emitted light lacks uniformity. For example, the light emitting device 203 can be used as a side surface light emitting device in which light is incident on the light incidence surface of a light guiding panel as well as being arranged so that the first side 231 is located above. The light emitting device 203 may be used as a side surface light emitting device whose light emission efficiency is high by increasing the amount of light that is reflected from the first side 231 and incident on the incidence surface of the light guiding panel.

A light emitting device 204 differs from the light emitting device 201 in having a first light emitting element 242 and a second light emitting element 243 in place of the first light emitting element 211 to the third light emitting element 213. The configuration and function of the light emitting device 204 except for having the first light emitting element 242 and the second light emitting element 243 in place of the first light emitting element 211 to the third light emitting element 213 are same as the configuration and function of the light emitting device 201, and therefore detailed explanation is omitted here.

The first light emitting element 242 is, for example, a blue LED die that emits blue light and arranged in close proximity to the first side 231 of the white resin 216. The second light emitting element 243 is, for example, a red LED die that emits red light and arranged in close proximity to the second side 232 of the white resin 216. Each of the first light emitting element 242 and the second light emitting element 243 is arranged so that the minimum separation distance from the first light emitting element 242 to the white resin 216 and the minimum separation distance from the second light emitting element 243 to the white resin 216 are substantially equal.

Further, in the light emitting devices 201 to 204, the extension distances of the inner walls of the first corner 236 and the second corner 237 of the white resin 216 are longer than the extension distances of the inner walls of the third corner 238 and the fourth corner 239. However, in the light emitting device according to the embodiment, it is only required for the extension distance of the inner wall of the first corner between the fourth side and the first side of the white resin to be different from the extension distance of the inner wall of at least one corner other than the first corner. For example, the extension distance of the inner wall of the first corner between the fourth side and the first side may be longer than the extension distance of the inner wall of the corner other than the first corner, or may be shorter than the extension distance of the inner wall of the corner other than the first corner. Further, the extension distance of the inner wall of the first corner between the fourth side and the first side may be equal to the extension distance of the inner wall of the third corner between the second side and the third side and the extension distance of the inner wall of the second corner between the first side and the second side may be equal to the extension distance of the inner wall of the fourth corner between the third side and the fourth side.

FIG. 35D is a plan diagram of a light emitting device according to an eleventh modification.

A light emitting device 205 differs from the light emitting device 201 in having two light emitting elements 244 in place of the first light emitting element 211 to the third light emitting element 213. Further, the light emitting device 205 differs from the light emitting device 201 in the shape of a white resin. The configuration and function of the light emitting device 205 except for having the two light emitting elements 244 in place of the first light emitting element 211 to the third light emitting element 213 and the shape of a white resin being different are the same as the configuration and function of the light emitting device 201, and therefore detailed explanation is omitted here.

The light emitting element 244 is, for example, a blue LED die that emits blue light and arranged on the diagonal line of the substrate 210.

A white resin 246 has a first side 251, a second side 252, a third side 253, and a fourth side 254. Further, the white resin 246 has a first corner 256, a second corner 257, a third corner 258, and a fourth corner 259. The first corner 256 is the corner between the fourth side 254 and the first side 251 and the second corner 257 is the corner between the first side 251 and the second side 252. The third corner 258 is the corner between the second side 252 and the third side 253 and the fourth corner 259 is the corner between the third side 253 and the fourth side 254.

The extension distance of the inner wall of the first corner 256 is substantially equal to the extension distance of the inner wall of the third corner 258 and the extension distance of the inner wall of the second corner 256 is substantially equal to the extension distance of the inner wall of the fourth corner 259. The extension distances of the inner walls of the first corner 256 and the third corner 258 are longer than the extension distances of the inner walls of the second corner 257 and the fourth corner 259.

Optical Simulation of Light Emitting Device According to Embodiment

FIG. 36 is a diagram showing simulation results when the minimum separation distance between a light emitting element and a white resin is varied in a light emitting device having a single light emitting element and a white resin having a rectangular planar shape. In FIG. 36, the horizontal axis represents the minimum separation distance between the light emitting element and the white resin and the vertical axis represents the ratio of the luminous intensity of light directly above the center of the light emitting element to the maximum luminous intensity of light that is emitted from the light emitting element, and this ratio is also referred to as an axial luminous intensity ratio. The simulator used for the simulation is Light Tools manufactured by CYBERNET SYSTEMS CO., LTD.

In FIG. 36, a curve L11 indicates the axial luminous intensity ratio when the height of the white resin is 0.20 mm, a curve L12 indicates the axial luminous intensity ratio when the height of the white resin is 0.25 mm, and a curve L13 indicates the axial luminous intensity ratio when the height of the white resin is 0.30 mm, When the height of the white resin is 0.20 mm, the axial luminous intensity ratio becomes the maximum when the minimum separation distance between the light emitting element and the white resin is 0.1 mm.

When the height of the white resin is 0.25 mm, the axial luminous intensity ratio becomes the maximum when the minimum separation distance between the light emitting element and the white resin is 0.1 mm.

When the height of the white resin is 0.30 mm, the axial luminous intensity ratio becomes the maximum in a range in which the minimum separation distance between the light emitting element and the white resin is 0.1 mm or more and 0.2 mm or less.

As indicated by a bidirectional arrow A in FIG. 36, it is preferable for the minimum separation distance between the light emitting element and the white resin to be 0.05 mm or more and 0.35 mm or less. Further, as indicated by a bidirectional arrow B in FIG. 36, it is further preferable for the minimum separation distance between the light emitting element and the white resin to be 0.25 mm or less.

The light emitting device according to the present disclosure may be aspects as shown below.

(1) A light emitting device having:
  a substrate;
  a light emitting element mounted on the substrate;
  a white resin arranged on the substrate so as to surround the light emitting element and having an inclined surface whose height becomes greater as the inclined surface becomes more distance from the light emitting element;
  a first transparent resin arranged between the light emitting element and the white resin; and
  a second transparent resin arranged in an area surrounded by the white resin and sealing the light emitting element, wherein
  the white resin is formed by a synthetic resin material containing white particles.

(2) The light emitting device described in (1), wherein the first transparent resin is formed by the same synthetic resin material as the synthetic resin material forming the white resin.

(3) The light emitting device described in (1) or (2), wherein the light transmittance of the synthetic resin forming the second transparent resin is higher than the light transmittance of the first transparent resin.

(4) The light emitting device described in any one of (1) to (3), wherein
the refractive index of the second transparent resin is lower than the refractive index of the first transparent resin.

(5) The light emitting device described in any one of (1) to (4), wherein
the adhesiveness between the first transparent resin and the substrate is higher than the adhesiveness between the second transparent resin and the substrate.

(6) The light emitting device described in any one of (1) to (5), wherein
the second transparent resin contains phosphors radiating light whose wavelength is different from the wavelength of light emitted from the light emitting element by converting light emitted from the light emitting element.

(7) The light emitting device described in any one of (1) to (6), wherein
the second transparent resin contains diffusion materials diffusing light emitted from the light emitting element.

(8) The light emitting device described in any one of (1) to (7), wherein
the light emitting element has a rectangular planar shape, and
the first transparent resin contacts with at least one side of the light emitting element.

(9) The light emitting device described in (8), wherein
the substrate further has an installed object thereon, which has a difference in level and
the white resin is locked by the installed object having a difference in level.

(10) The light emitting device described in (8) or (9), wherein
the first transparent resin contacts with all the four sides of the light emitting element.

(11) The light emitting device described in any one of (8) to (10), wherein
the light emitting element comprises a transparent substrate.

(12) The light emitting device described in (8) or (9), wherein
the light emitting element includes a light emitting element comprising a transparent substrate and a light emitting element comprising an opaque substrate and
the first transparent resin contacts with at least one side of the light emitting element comprising a transparent substrate.

(13) The light emitting device described in (12), wherein
the first transparent resin contacts with one side of the light emitting element comprising an opaque substrate.

Further, the light emitting device according to the present disclosure may be aspects as shown below.

(1) A light emitting device having:
a substrate;
a light emitting element mounted on the substrate;
an electrode supplying power to the light emitting element;
a wire pattern electrically connecting the light emitting element and the electrode;
a bonding wire electrically connecting the wire pattern and the light emitting element;
a white resin arranged on the substrate so as to surround the light emitting element; and a seal resin arranged in an area surrounded by the white resin and sealing the light emitting element,
wherein the bonding wire has:
a first portion that is buried in the white resin;
a second portion that is buried in the seal resin; and
a third portion that is arranged between the first portion and the second portion and covered by a conic solid-like conic solid resin extending from the white resin along the extending direction of the bonding wire.

(2) The light emitting device described in (1), wherein
the conic solid resin is formed by at least a white resin.

(3) The light emitting device described in (1) or (2), wherein
the conic solid resin is formed by at least a transparent resin included in the white resin.

(4) The light emitting device described in any one of (1) to (3), wherein
the hardness of the conic solid resin is lower than the hardness of the seal resin.

(5) The light emitting device described in any one of (1) to (4), wherein
the diameter of the base of the conic solid resin is 1.1 times or more and 20 times or less the diameter of the cross section of the bonding wire.

(6) The light emitting device described in (5), wherein
the diameter of the base of the conic solid resin is five times or less the diameter of the cross section of the bonding wire.

(7) The light emitting device described in any one of (1) to (6), wherein
the length of the third portion is 0.1 times or more and ten times or less the diameter of the base of the conic solid resin.

(8) The light emitting device described in (7), wherein
the length of the third portion is twice or less the diameter of the base of the conic solid resin.

(9) The light emitting device described in any one of (1) to (8), wherein
an angle formed by a tangential direction of the bonding wire and an extending direction of the surface of the substrate is −45° or more and 45° or less.

(10) The light emitting device described in (9), wherein
the angle formed by the tangential direction of the bonding wire and the extending direction of the surface of the substrate is 0° or less.

(11) The light emitting device described in any one of (1) to (10), wherein
the height of a boundary point from the backside of the light emitting element, at which the bonding wire protrudes from the white resin toward the seal resin, is greater than the height of the surface of the light emitting element from the backside of the light emitting element, at which the bonding wire is connected to the light emitting element.

Further, the light emitting device according to the present disclosure may be aspects as shown below.

(1) A light emitting device having:
a rectangular substrate;
one or a plurality of light emitting elements mounted on the substrate;
a white resin having a first side extending in parallel to one side of the substrate, a third side arranged so as to face the first side, and a second side and a fourth side both connecting the first side and the third side, respectively, and arranged so as to surround the light emitting element; and a seal resin arranged in an area surrounded by the white resin and sealing the light emitting element, wherein an extension distance of an inner wall of a first corner between the fourth side and the first side is different from an extension distance of the inner wall of at least one corner other than the first corner.

(2) The light emitting device described in (1), wherein the extension distance is, in a plan view, a distance between each of four corners of a circumscribed rectangle, which is a rectangle circumscribed around the inner wall of the white resin, and an intersection point closest to each of the four corners of the circumscribed rectangle among the four intersection points at which a pair of diagonal lines of the circumscribed rectangle intersect the inner wall of the white resin.

(3) The light emitting device described in (1) or (2), wherein the extension distance of the inner wall of the first corner and the extension distance of the inner wall of a second corner between the first side and the second side are longer than the extension distance of the inner wall of a third corner between the third side and the second side and the extension distance of the inner wall of a fourth corner between the third side and the fourth side.

(4) The light emitting device described in (3), wherein the plurality of the light emitting elements includes a first light emitting element whose length of the long side is a first length and whose shape is a rectangle, a second light emitting element whose length of the side is shorter than the first length and whose shape is a rectangle, and a third light emitting element having a third length shorter than the first length, the first light emitting element is arranged so that the first light emitting element is in close proximity to the first side and whose long side is parallel to the first side, and the second light emitting element and the third light emitting element are arrayed so that the second light emitting element and the third light emitting element are in close proximity to the third side and whose one side is parallel to the third side.

(5) The light emitting device described in (4), wherein the first light emitting element is a red LED die emitting red light, the second light emitting element is a green LED die emitting green light, and the third light emitting element is a blue LED die emitting blue light.

(6) The light emitting device described in (4) or (5), wherein a minimum separation distance between each of the first light emitting element, the second light emitting element, and the third light emitting element is 0.03 mm or more and 0.08 mm or less.

(7) The light emitting device described in any one of (4) to (6), wherein the total sum of the area of the top surface of each light emitting element of the first light emitting element, the second light emitting element, and the third light emitting element is 3% or more and 50% or less of the area of the top surface of the substrate surrounded by the white resin.

(8) The light emitting device described in (1) or (2), wherein the extension distance of the inner wall of the first corner and the extension distance of the inner wall of the third corner between the second side and the third side are longer than the extension distance of the inner wall of the second corner between the first side and the second side and the extension distance of the inner wall of the fourth corner between the third side and the fourth side.

(9) The light emitting device described in any one of (1) or (8), wherein the minimum separation distance between light emitting element and the white resin is 0.05 mm or more and 0.35 mm or less.

(10) The light emitting device described in (8), wherein the minimum separation distance is 0.25 mm or less.

What is claimed is:

1. A light emitting device comprising:
a substrate having a rectangular planar shape;
one or a plurality of light emitting elements mounted on the substrate;
a dam resin having a frame-like planar shape, arranged on the substrate so as to surround the one or the plurality of light emitting elements, and having an inclined surface whose height increases as its distance from the one or the plurality of light emitting elements increases;
a seal resin arranged in an area surrounded by the dam resin and which seals the one or the plurality of light emitting elements;
electrodes supplying electric power to the one or the plurality of light emitting elements;
wire patterns electrically connecting the one or the plurality of light emitting elements and the electrodes; and
bonding wires electrically connecting the wiring patterns and the one or the plurality of light emitting elements, wherein
the dam resin has a first side arranged so as to extend in parallel to one side of the substrate, a third side arranged facing the first side, a second side and a fourth side connecting with the first side and the third side, a first corner between the fourth side and the first side, a second corner between the first side and the second side, a third corner between the second side and the third side and, a fourth corner between the third side and the fourth side,
an extension distance of an inner wall of the first corner is different from an extension distance of the inner wall of at least one corner other than the first corner,
the extension distance is, in a plan view, a distance between each of four corners of a circumscribed rectangle, which is a rectangle circumscribed around the inner wall of the dam resin, and an intersection point closest to each of the four corners of the circumscribed rectangle among the four intersection points at which a pair of diagonal lines of the circumscribed rectangle intersect the inner wall of the dam resin,
an outer edge of the dam resin contacts with an outer edge of the substrate, an apex of the dam resin is formed so as to be flat, and the dam resin seals parts of the bonding wires, and
the extension distance of the inner wall of the first corner and the extension distance of the inner wall of the second corner are longer than the extension distance of the inner wall of the third corner and the extension distance of the inner wall of the fourth corner.

2. The light emitting device according to claim 1, wherein a minimum separation distance between the one or the plurality of light emitting elements and the dam resin is 0.05 mm or more and 0.35 mm or less.

3. The light emitting device according to claim 2, wherein the minimum separation distance is 0.25 mm or less.

4. The light emitting device according to claim 1, wherein
the plurality of the light emitting elements includes a first light emitting element whose length of a long side is a first length and whose shape is a rectangle, a second light emitting element whose length of the side is shorter than the first length and whose shape is a rectangle, and a third light emitting element having a third length shorter than the first length,
the first light emitting element is arranged so that the first light emitting element is in close proximity to the first side and whose long side is parallel to the first side, and
the second light emitting element and the third light emitting element are arrayed so that the second light emitting element and the third light emitting element are in close proximity to the third side and whose one side is parallel to the third side.

5. The light emitting device according to claim 4, wherein the first light emitting element is formed by arranging a PN joint layer on a non-translucent substrate.

6. The light emitting device according to claim 5, wherein
the first light emitting element is a red LED die emitting red light,
the second light emitting element is a green LED die emitting green light, and
the third light emitting element is a blue LED die emitting blue light.

7. A light emitting device comprising:
a substrate having a rectangular planar shape;
one or a plurality of light emitting elements mounted on the substrate;
a dam resin having a frame-like planar shape, arranged on the substrate so as to surround the one or the plurality of light emitting elements, and having an inclined surface whose height increases as its distance from the one or the plurality of light emitting elements increases;
a seal resin arranged in an area surrounded by the dam resin and which seals the one or the plurality of light emitting elements;
electrodes supplying electric power to the one or the plurality of light emitting elements;
wire patterns electrically connecting the one or the plurality of light emitting elements and the electrodes; and
bonding wires electrically connecting the wiring patterns and the one or the plurality of light emitting elements, wherein
the dam resin has a first side arranged so as to extend in parallel to one side of the substrate, a third side arranged facing the first side, a second side and a fourth side connecting with the first side and the third side, a first corner between the fourth side and the first side, a second corner between the first side and the second side, a third corner between the second side and the third side and, a fourth corner between the third side and the fourth side,
an extension distance of an inner wall of the first corner is different from an extension distance of the inner wall of at least one corner other than the first corner,
the extension distance is, in a plan view, a distance between each of four corners of a circumscribed rectangle, which is a rectangle circumscribed around the inner wall of the dam resin, and an intersection point closest to each of the four corners of the circumscribed rectangle among the four intersection points at which a pair of diagonal lines of the circumscribed rectangle intersect the inner wall of the dam resin,
an outer edge of the dam resin contacts with an outer edge of the substrate, an apex of the dam resin is formed so as to be flat, and the dam resin seals parts of the bonding wires, and
the extension distance of the inner wall of the first corner and the extension distance of the inner wall of the third corner are longer than the extension distance of the inner wall of the second corner and the extension distance of the inner wall of the fourth corner.

* * * * *